(12) United States Patent
Okano

(10) Patent No.: US 9,252,277 B2
(45) Date of Patent: Feb. 2, 2016

(54) SEMICONDUCTOR DEVICE

(71) Applicant: Kabushiki Kaisha Toshiba, Minato-ku (JP)

(72) Inventor: Kimitoshi Okano, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/664,985

(22) Filed: Mar. 23, 2015

(65) Prior Publication Data

US 2015/0194528 A1 Jul. 9, 2015

Related U.S. Application Data

(62) Division of application No. 13/599,613, filed on Aug. 30, 2012, now Pat. No. 9,024,364.

(30) Foreign Application Priority Data

Mar. 12, 2012 (JP) .................... 2012-054541

(51) Int. Cl.
*H01L 29/78* (2006.01)
*H01L 29/423* (2006.01)
(Continued)

(52) U.S. Cl.
CPC ...... *H01L 29/7851* (2013.01); *H01L 29/42364* (2013.01); *H01L 29/42392* (2013.01);
(Continued)

(58) Field of Classification Search
CPC ............. H01L 29/7851; H01L 29/42392; H01L 29/7843; H01L 29/785; H01L 29/78696; H01L 27/088; H01L 29/51; H01L 29/42364

USPC ................... 257/401, 255, 288, 368
See application file for complete search history.

(56) References Cited

U.S. PATENT DOCUMENTS 7,473,964 B2 1/2009 Izumida
7,868,395 B2 1/2011 Watanabe et al.
(Continued)

FOREIGN PATENT DOCUMENTS

JP 2007-242737 9/2007
JP 2010-34470 2/2010
(Continued)

OTHER PUBLICATIONS

K. Okano, et al., "Process Integration Technology and Device Characteristics of CMOS FinFET on Bulk Silicon Substrate with sub-10 nm Fin Width and 20 nm Gate Length", IEDM, 2005, pp. 739-742.
(Continued)

*Primary Examiner* — William F Kraig
*Assistant Examiner* — Pavel Ivanov
(74) *Attorney, Agent, or Firm* — Oblon, McClelland, Maier & Neustadt, L.L.P.

(57) ABSTRACT

A semiconductor device in one embodiment includes a semiconductor substrate, a fin disposed on a surface of the semiconductor substrate, an insulator including a gate insulator disposed on a side surface of the fin, and a gate electrode disposed on the insulator that is disposed on side surfaces of the fin and an upper surface of the fin. The device further includes a plurality of epitaxial stripe shaped layers disposed horizontally on the side surface of the fin at different heights, and an interlayer dielectric disposed on the semiconductor substrate to cover the fin and applying a stress to the fin and the epitaxial layers. Any two adjacent epitaxial layers along the fin height direction determine a gap and the gaps between adjacent layers increase or decrease with increasing distance from the substrate.

5 Claims, 57 Drawing Sheets

(51) Int. Cl.
*H01L 29/786* (2006.01)
*H01L 29/51* (2006.01)
*H01L 27/088* (2006.01)

(52) U.S. Cl.
CPC .............. *H01L29/51* (2013.01); *H01L 29/785* (2013.01); *H01L 29/7843* (2013.01); *H01L 29/78696* (2013.01); *H01L 27/088* (2013.01)

(56) References Cited

U.S. PATENT DOCUMENTS

| | | | |
|---|---|---|---|
| 7,915,693 | B2 | 3/2011 | Okano |
| 7,923,788 | B2 | 4/2011 | Ohguro et al. |
| 7,989,856 | B2 | 8/2011 | Goto et al. |
| 8,237,226 | B2 | 8/2012 | Okano |
| 2007/0210355 | A1 | 9/2007 | Izumida |
| 2009/0242990 | A1* | 10/2009 | Saitoh ............. H01L 21/823821 257/351 |
| 2010/0123173 | A1 | 5/2010 | Tanaka |
| 2010/0187503 | A1* | 7/2010 | Moriyama ............. B82Y 10/00 257/24 |
| 2010/0207209 | A1 | 8/2010 | Inokuma |
| 2010/0304555 | A1* | 12/2010 | Kaneko ................. H01L 21/845 438/585 |
| 2011/0227162 | A1 | 9/2011 | Lin et al. |
| 2012/0037994 | A1* | 2/2012 | Saitoh ............. H01L 21/823821 257/351 |
| 2013/0075797 | A1 | 3/2013 | Okano |
| 2013/0092984 | A1* | 4/2013 | Liu ................... H01L 29/66795 257/288 |
| 2014/0001520 | A1* | 1/2014 | Glass ................ H01L 29/66439 257/288 |

FOREIGN PATENT DOCUMENTS

| | | |
|---|---|---|
| JP | 2010-118621 | 5/2010 |
| JP | 2010-192588 | 9/2010 |
| JP | 2011-199287 | 10/2011 |

OTHER PUBLICATIONS

Kaneko, et al., "Sidewall Transfer Process and Selective Gate Sidewall Spacer Formation Technology for Sub-15nm FinFET with Elevated Source/Drain Extension", IEDM, 2005, pp. 863-866.

Jack Kavalieros, et al., "Tri-Gate Transistor Architecture with High-k Gate Dielectrics, Metal Gates and Strain Engineering", 2006 Symposium on VLSI Technology Digest of Technical Papers, 2006, pp. 62-63.

S. Monfray, et al., "50nm-Gate All Around (GAA)—Silicon on Nothing (SON)—Devices: A Simple Way to Co-integration of GAA Transistors within bulk MOSFET process", 2002 Symposium on VLSI Technology Digest of Technical Papers, 2002, pp. 108-109.

A. Oishi, et al., "High Performance CMOSFET Technology for 45nm Generation and Scalability of Stress-Induced Mobility Enhancement Technique", IEDM, 2005, pp. 239-242.

A. Hubert, et al., "A stacked SONOS technology, up to 4 levels and 6nm crystalline nanowires, with gate-all-around or independent gates (M-Flash), suitable for full 3D integration", IEDM, 2009, pp. 637-640.

N. Serra, et al., "Experimental and physics-based modeling assessment of strain induced mobility enhancement in FinFETs", IEDM, 2009, pp. 71-74.

K. Tachi, et al., "Experimental study on carrier transport limiting phenomena in 10 nm width nanowire CMOS transistors", IEDM, 2010, pp. 784-787.

Jack T. Kavalieros, "Novel Device Architectures and Material Innovations", Symposium on VLSI Technology Short Course, 2008, p. 43.

* cited by examiner

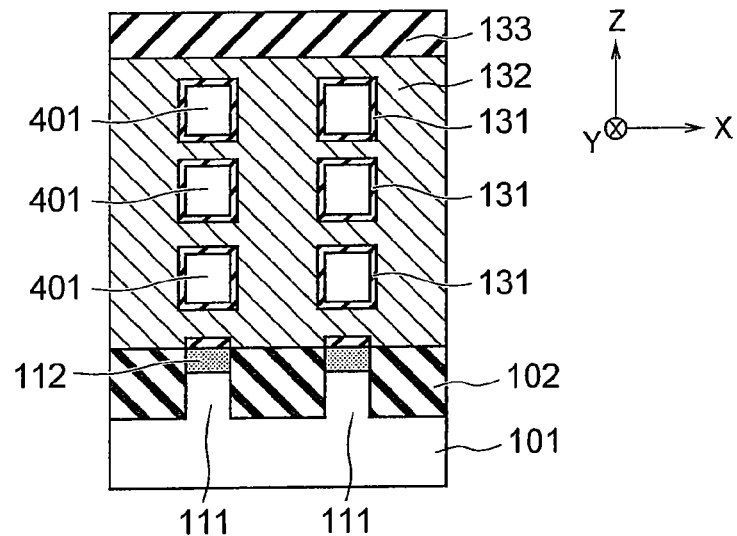
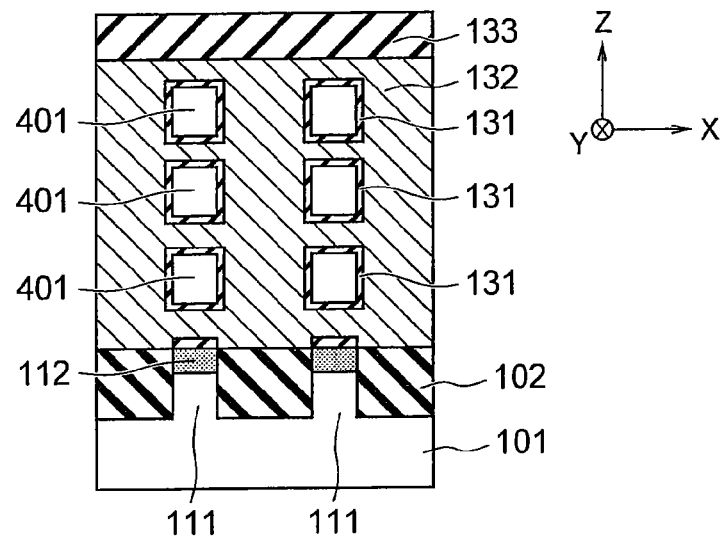

SEMICONDUCTOR DEVICE

CROSS REFERENCE TO RELATED APPLICATION

This application is a division of and claims the benefit of priority under 35 U.S.C. §120 from U.S. Ser. No. 13/599,613 filed Aug. 30, 2012, and claims the benefit of priority under 35 U.S.C. §119 from Japanese Patent Application No. 2012-54541 filed Mar. 12, 2012, the entire contents of each of which are incorporated herein by reference.

FIELD

Embodiments described herein relate to a semiconductor device.

BACKGROUND

In a logic large scale integrated circuit (LSI) after a 65 nm generation, channel mobility of a planar MOSFET is improved by a stress application technique such as a stress liner. However, the stress becomes difficult to apply to the channel with high integration of the LSI. For example, when a gate pitch between planar MOSFETs is small, the narrow gate space between them is closed by the stress liner, so that the stress becomes difficult to apply to the channel. The closure is avoided by thinning the stress liner. However, the stress by the stress liner decreases by the thinning, so that a sufficient stress cannot be applied to the channel.

On the other hand, a fin FET attracts attention as a transistor which is stronger against a short channel effect than the planar MOSFET, and is therefore advantageous for miniaturization. However, it is known that channel mobility of the fin FET is degraded by miniaturizing the fin width. Therefore, introduction of a mobility improvement technique is required for the fin FET. It is reported that the stress application technique which is effective to the planar MOSFET is also effective to the fin FET. However, the application of the stress to the channel of the fin FET becomes difficult with high integration of the LSI, similarly to the planar MOSFET. Therefore, the stress application technique is required which can improve the channel mobility of the fin FET even if the LSI is highly integrated.

BRIEF DESCRIPTION OF THE DRAWINGS

FIGS. 46A to 54B are sectional views showing a method of manufacturing the semiconductor device of the fourth embodiment;

DETAILED DESCRIPTION

Embodiments will now be explained with reference to the accompanying drawings.

In one embodiment, a semiconductor device includes a semiconductor substrate, and a fin disposed on a surface of the semiconductor substrate. The device further includes a gate insulator disposed on a side surface of the fin, and a gate electrode disposed on the side surface and an upper surface of the fin via the gate insulator. The device further includes a plurality of epitaxial layers disposed on the side surface of the fin in order along a fin height direction of the fin, and an interlayer dielectric disposed on the semiconductor substrate to cover the fin and applying a stress to the fin and the epitaxial layers. A spacing of a gap between the epitaxial layers adjacent in the fin height direction, and a spacing of a gap between the lowermost epitaxial layer and a bottom surface of the interlayer dielectric change in accordance with heights at which the gaps are located.

(First Embodiment)

Figure 1A:
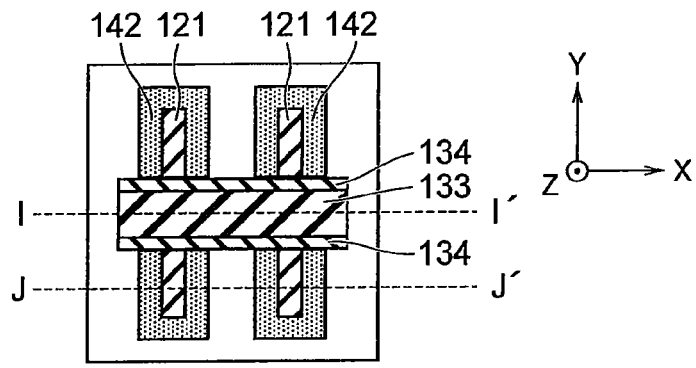
FIGS. 1A to 1C are a plan view and sectional views showing a structure of a semiconductor device of a first embodiment.
Figure 1B:
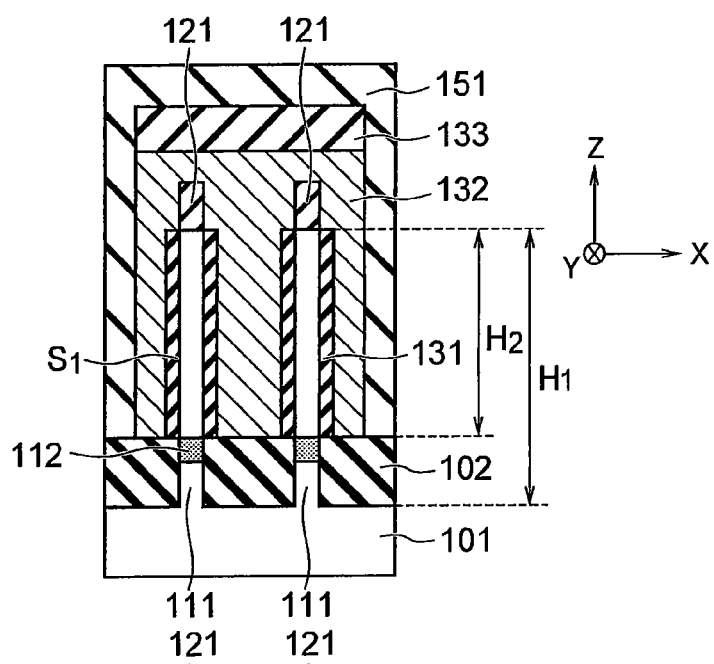
Figure 1C:
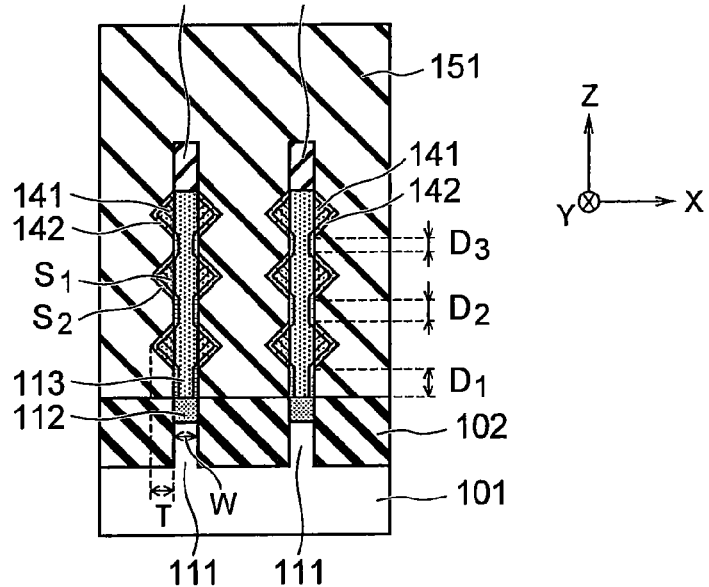

FIGS. 1A to 1C are a plan view and sectional views showing a structure of a semiconductor device of a first embodiment. FIG. 1A is a plan view showing a planar structure of the semiconductor device. FIGS. 1B and 1C are sectional views taken along an I-I' line and a J-J' line shown in FIG. 1A, respectively.

The semiconductor device of FIGS. 1A to 1C includes, as components of a fin FET, a semiconductor substrate 101, fins 111, hard mask layers 121, gate insulators 131, a gate electrode 132, a cap layer 133, sidewall insulators 134, epitaxial layers 141, silicide layers 142, and an interlayer dielectric 151.

The semiconductor substrate 101 is, for example, a silicon substrate. FIGS. 1A to 1C show X and Y directions which are parallel to a main surface of the semiconductor substrate 101 and are perpendicular to each other, and a Z direction which is perpendicular to the main surface of the semiconductor substrate 101. FIGS. 1A to 1C further show isolation insulators 102 formed on a surface of the semiconductor substrate 101 so as to embed a part of the fins 111 in the isolation insulators 102. The isolation insulators 102 are, for example, silicon oxide layers.

The fins 111 are formed on the surface of the semiconductor substrate 101. FIGS. 1A to 1C show two fins 111 forming the fin FET. The fins 111 extend in the Y direction, and are adjacent to each other in the X direction. Therefore, the X and Y directions correspond to a fin adjacency direction and a fin extension direction of the fins 111, respectively. The Z direction corresponds to a fin height direction of the fins 111. The fins 111 of the present embodiment are formed by etching surface portions of the semiconductor substrate 101.

Reference character $S_1$ shown in FIGS. 1A to 1C denotes side surfaces of the fins 111. The side surfaces $S_1$ are (110) planes. Reference character "$H_1$" denotes the height of the fins 111, and reference character "$H_2$" denotes the height of portions of the fins 111 exposed from the isolation insulators 102. The height "$H_2$" is, for example, 50 nm or more. Reference character "W" denotes the X-directional width of the fin 111.

FIGS. 1A to 1C further show punch through stopper diffusion layers 112 formed in the fins 111, and source and drain (S/D) diffusion layers 113 formed in the fins 111 and the epitaxial layers 141. As shown in FIGS. 1B and 1C, the punch through stopper diffusion layers 112 are formed in bottom regions of the fins 111 to be sandwiched between the isolation insulators 102. As shown in FIG. 1C, the S/D diffusion layers 113 are formed above the punch through stopper diffusion layers 112 in the fins 111, and in the epitaxial layers 141. The punch through stopper diffusion layers 112 and the S/D diffusion layers 113 of the present embodiment are a p-type diffusion layers and n-type diffusion layers, respectively.

The hard mask layers 121 are formed on upper surfaces of the fins 111. The hard mask layers 121 are, for example, silicon nitride layers.

As shown in FIG. 1B, the gate insulators 131 are formed on side surfaces of the fins 111. In addition, the gate electrode 132 is formed on the side surfaces and upper surfaces of the fins 111 via the gate insulators 131 and the hard mask layers 121. More specifically, the gate electrode 132 is formed on the side surfaces of the fins 111 via the gate insulators 131, and on the upper surfaces of the fins 111 via the hard mask layers 121. The gate insulators 131 are, for example, silicon oxide layers. The gate electrode 132 is, for example, a polysilicon layer.

The cap layer 133 is formed on an upper surface of the gate electrode 132. The sidewall insulators 134 are formed on Y-directional side surfaces of the gate electrode 132 and the cap layer 133 as shown in FIG. 1A. The cap layer 133 is, for example, a silicon nitride layer. The sidewall insulators 134 are, for example, silicon nitride layers.

FIG. 1B shows a section in which the fins 111 are cut along an I-I' line across the gate insulators 131 and the gate electrode 132, whereas FIG. 1C shows a section in which the fins 111 are cut along a J-J' line across the S/D regions in the fins 111.

The epitaxial layers 141 have triangular sectional shapes, and are formed on the side surfaces $S_1$ of the fins 111 as shown in FIG. 1C. In the present embodiment, three epitaxial layers 141 are formed on each side surface $S_1$ of each fin 111 in order along the Z direction. Therefore, according to the present embodiment, large surface areas of the epitaxial layers 141 can be secured while a short of the adjacent fins 111 can be avoided, as compared with the case where only one large epitaxial layer 141 is formed on each side surface $S_1$ of each fin 111. The epitaxial layers 141 are, for example, silicon layers. The punch through stopper diffusion layers 112 are formed at the height lower than that of the lowermost epitaxial layers 141 in the fins 111.

Reference character $S_2$ shown in FIG. 1C denotes facet surfaces of the epitaxial layers 141. The facet surfaces $S_2$ are (111) planes. Reference character T denotes the thickness of the epitaxial layers 141, that is, the distance between the side surfaces $S_1$ of the fins 111 and vertices of the epitaxial layers 141. The thickness "T" in the present embodiment is 15 to 25 nm (e.g., 20 nm).

In the present embodiment, three epitaxial layers 141 are formed on each side surface $S_1$ of the fins 111. However, the number of the epitaxial layers 141 on each side surface $S_1$ of the fins 111 may be two, or may be four or more.

The thicknesses "T" of the epitaxial layers 141 of each side surface S1 of the fins 111 may be made substantially uniform as in the present embodiment, or may be made un-uniform.

The silicide layers 142 are formed in the epitaxial layers 141 in the vicinity of the facet surfaces $S_2$. The thickness of the silicide layers 142 in the present embodiment is 5 to 15 nm (e.g., 10 nm). Each epitaxial layer 141 may be entirely silicided, or may be only partially silicided. Alternatively, each epitaxial layer 141 may not be silicided.

The interlayer dielectric 151 is formed on the semiconductor substrate 101 to cover the fins 111 as shown in FIGS. 1A to 1C. The interlayer dielectric 151 is, for example, a silicon oxide layer. The interlayer dielectric 151 has an action of applying a stress to the epitaxial layers 141. The details of the stress will be described later.

Reference character $D_1$ shown in FIG. 1C denotes the spacing of gaps between the lowermost epitaxial layers 141 and a bottom surface of the interlayer dielectric 151. Reference characters "$D_2$" and "$D_3$" denote the spacings of gaps between the epitaxial layers 141 adjacent to each other in the Z direction.

In the present embodiment, the spacings "$D_1$" to "$D_3$" are set to change in accordance with the heights at which the gaps are located. More specifically, the spacings "$D_1$" to "$D_3$" are set to decrease as the heights of the gaps increase. In other words, the spacings "$D_1$" to "$D_3$" are set to satisfy $D_1 \geq D_2 \geq D_3$ (however, $D_1=D_2=D_3$ is excluded). As an example of this relationship, FIG. 1C shows the epitaxial layers 141 which are formed to satisfy $D_1>D_2>D_3$.

(1) Details of Interlayer Dielectric 151

Details of the interlayer dielectric 151 will be described with reference to FIGS. 2A to 3.

Figure 2A:
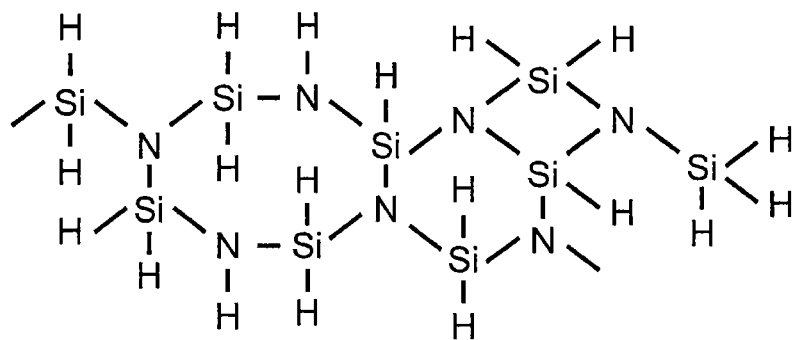
FIGS. 2A and 2B are diagrams showing structural formulas of polysilazane (PSZ) and silicon oxide, respectively.
Figure 2B:
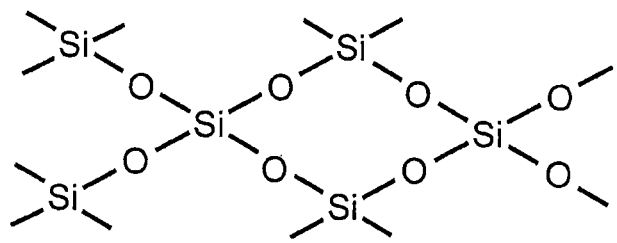

FIGS. 2A and 2B are diagrams showing structural formulas of polysilazane (PSZ) and silicon oxide, respectively.

The interlayer dielectric 151 in the present embodiment is a silicon oxide layer formed from polysilazane. FIG. 2A shows the structural formula of polysilazane, and FIG. 2B shows the structural formula of silicon oxide.

Polysilazane is inorganic polymer including a —(SiH$_2$NH)— structure as a basic unit, and is soluble in an organic solvent. An official name of polysilazane is perhydropolysilazane (PHPS). When an organic solvent solution containing polysilazane is coated and burned in the air, polysilazane reacts with water and oxygen, and dense high-purity silica (amorphous SiO$_2$) is obtained. The burning temperature is, for example, 400 to 650° C. (for example, approximately 450° C.). It is known that the silicon oxide layer obtained by burning the coated layer of polysilazane increases in density compared with the coated layer, and shrinkage of the coated layer is generated at the time of burning.

The silicon oxide layer formed from polysilazane has a feature of having an excellent embedding property. Therefore, the interlayer dielectric 151 in the present embodiment is formed from polysilazane, so that the interlayer dielectric 151 can be embedded in the gaps described above even though the distance between the fins 111 and the spacings between the epitaxial layers 141 are small.

When the interlayer dielectric 151 is formed, the fin FET is previously formed on the semiconductor substrate 101, and the organic solvent solution containing polysilazane is then coated on the semiconductor substrate 101 and burned to form the silicon oxide layer. At this time, a portion of the silicon oxide layer embedded in a large space as "$D_1$" has a larger volume in the space than a portion of the silicon oxide layer embedded in a small space as "$D_3$", so that the former portion has a larger stress due to the coated layer shrinkage than that of the latter portion.

The spacings "$D_1$" to "$D_3$" are set to satisfy $D_1 > D_2 > D_3$ in the present embodiment. Therefore, regarding the respective epitaxial layers 141, the coated layer shrinkage stress of the interlayer dielectric 151 above an epitaxial layer 141 differs from the coated layer shrinkage stress of the interlayer dielectric 151 under the epitaxial layer 141. Therefore, an imbalance is generated to the stress applied to the respective epitaxial layers 141 by the interlayer dielectric 151 in a vertical direction. In other words, the stress which is applied to the respective epitaxial layers 141 from their upper portions and the stress applied to the respective epitaxial layers 141 from their lower portions have different magnitudes.

As a result, a downward force is applied to the respective epitaxial layers 141, and the force is applied to the fins 111 in the present embodiment. Therefore, a compressive stress in the Z direction is applied to the fins 111 in the present embodiment. The compressive stress has an effect of improving electron mobility of the side surface channels of the fins 111 when the plane orientation of the side surface channels of the fins 111 is (110).

Figure 3:
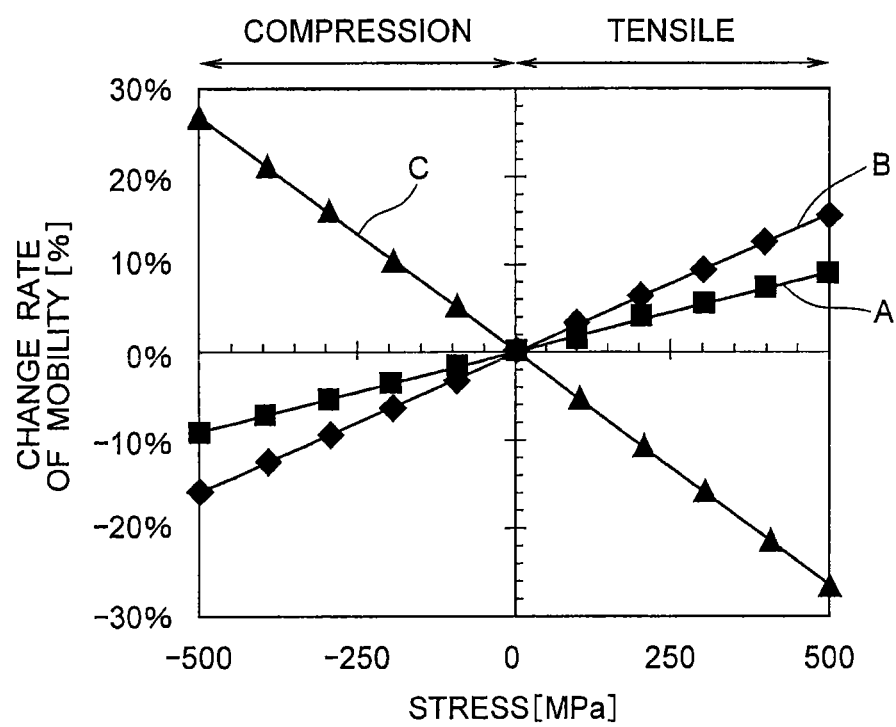
FIG. 3 is a graph showing a relationship between a stress applied to fins and a change rate of electron mobility.

FIG. 3 is a graph showing a relationship between the stress applied to the fins 111 and the change rate of the electron mobility.

In FIG. 3, the side surfaces $S_1$ of the fins 111 are (110) planes, and the fin FET is an nFFT. The lines A, B and C show change rates of the electron mobility in the (110) side surface channels when stresses in the X, Y and Z directions are applied to the fins 111, respectively. In FIG. 3, the X, Y and Z directions are <−110>, <110> and <100> directions, respectively.

As shown in FIG. 3, when the compressive stress in the Z direction is applied to the fins 111, the electron mobility is improved. Therefore, in the present embodiment, the compressive stress in the Z direction is applied to the nFET in which the side surface channel surfaces are (110) planes and the Y direction (a direction in which a current flows between the S/D diffusion layers 113) is a <110> direction. This makes it possible to improve the electron mobility in the side surface channels, thereby improving the performance of the FET.

According to FIG. 3, the improvement rate of the electron mobility by applying the compressive stress in the Z direction is more favorable than that by applying the tensile stresses in the X or Y direction.

The fin FET in the present embodiment may be a pFET. In this case, the spacings "$D_1$" to "$D_3$" are set to satisfy $D_1 < D_2 < D_3$ so that the tensile stress in the Z direction is applied to the fins 111. This makes it possible to improve the hole mobility in the side surface channels when the plane orientation of the side surface channels of the fins 111 are (110) and the Y direction is a <110> direction.

The plane orientation of the side surfaces $S_1$ in the present embodiment may be a plane other than a (110) plane. In this case, the relationship of the stress and the mobility change in the side surface channels of the fins 111 may be inversed from the characteristics of FIG. 3. In such a case, a tensile stress and a compressive stress in the Z direction may be applied to an nFET and a pFET, respectively.

The spacings "$D_1$" to "$D_3$" are set to satisfy $D_1 > D_2 > D_3$ in the present embodiment. However, if only $D_1 = D_2 = D_3$ is not satisfied, the spacings "$D_1$" to "$D_3$" may be set to satisfy $D_1 \geq D_2 \geq D_3$. Examples of this case include the setting to satisfy $D_1 = D_2 > D_3$, and the setting to satisfy $D_1 > D_2 = D_3$. The setting to satisfy $D_1 > D_2 > D_3$ has the advantage of being able to apply a stress to all the epitaxial layers 141, as compared with the setting to satisfy $D_1 \geq D_2 \geq D_3$.

The interlayer dielectric 151 in the present embodiment may be formed from material other than polysilazane, and may be an insulator other than a silicon oxide layer. In addition, the interlayer dielectric 151 may include two or more insulators. However, the interlayer dielectric 151 is desirably formed from the material which has a favorable embedding property and causes the coated layer shrinkage.

(2) Method of Manufacturing Semiconductor Device of First Embodiment

A method of manufacturing the semiconductor device of the first embodiment will be described with reference to FIGS. 4A to 30B.

Figure 4A:
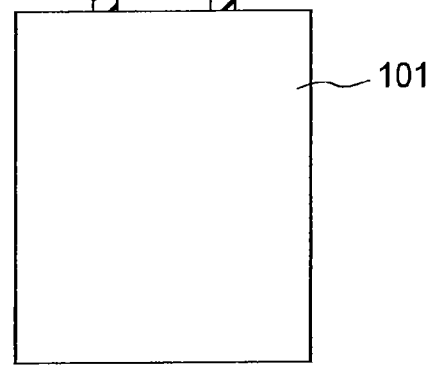
FIGS. 4A to 30B are sectional views showing a method of manufacturing the semiconductor device of the first embodiment.

FIGS. 4A to 30B are sectional views showing the method of manufacturing the semiconductor device of the first embodiment. FIGS. 4A, 5A, . . . and 30A are sectional views taken along the I-I' line, and FIGS. 4B, 5B, . . . and 30B are sectional vies taken along the J-J' line.

Figure 4B:
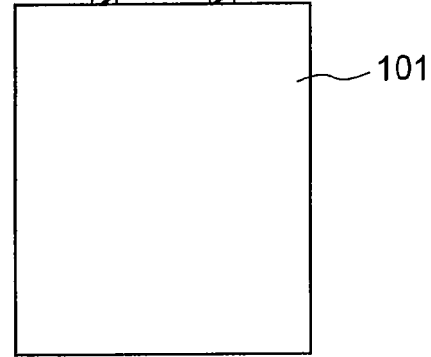
Figure 5A:
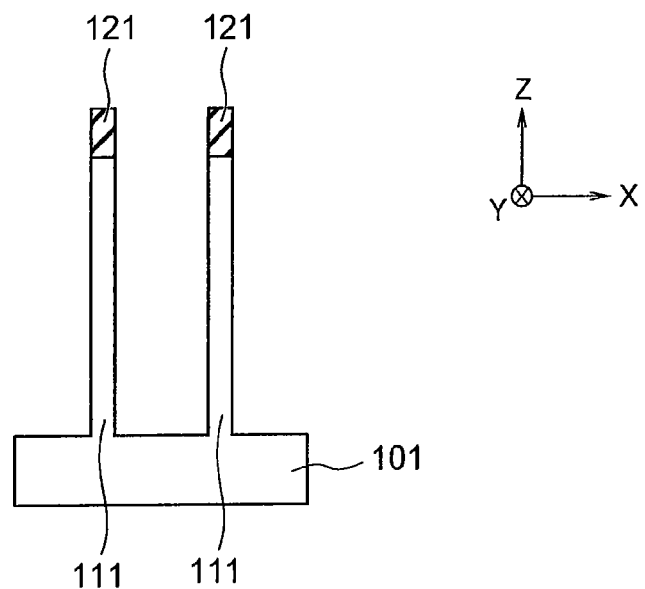

First, a hard mask layer 121 is deposited on the semiconductor substrate 101, and is processed into mask patterns for forming the fins 111 by lithography and reactive ion etching (RIE) (FIGS. 4A and 4B).

Figure 5B:
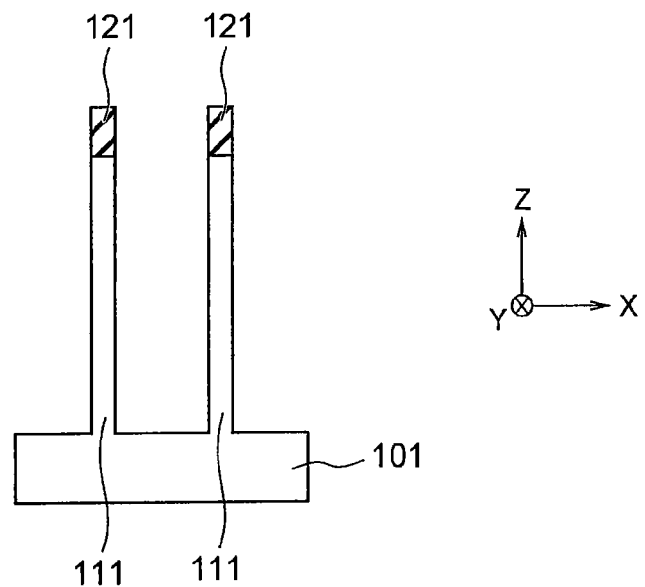

As shown in FIGS. 5A and 5B, surface portions of the semiconductor substrate 101 is then etched by RIE using the hard mask layers 121 as a mask. As a result, the fins 111 are formed on the surface of the semiconductor substrate 101. The fins 111 are formed so that the side surfaces $S_1$ become (110) planes.

Figure 6A:
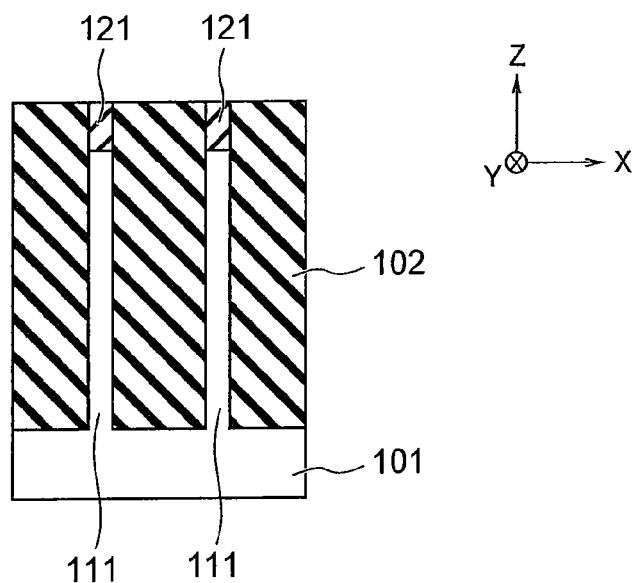
Figure 6B:
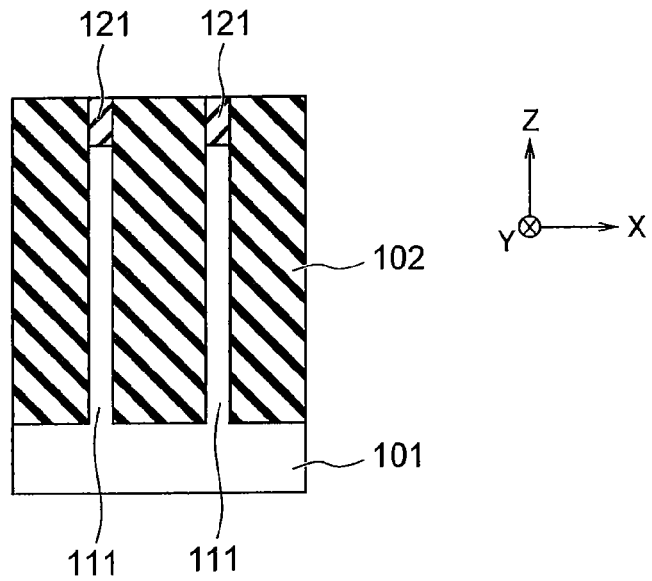

An insulating layer 102 to be material of the isolation insulators 102 is then deposited on the entire surface of the semiconductor substrate 101 and is embedded between the fins 111, and a surface of the insulating layer 102 is planarized by chemical mechanical polishing (CMP) (FIGS. 6A and 6B).

Figure 7A:
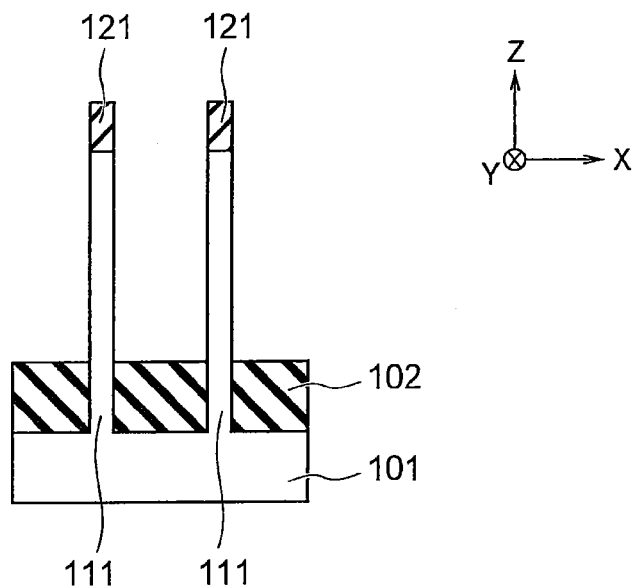
Figure 7B:
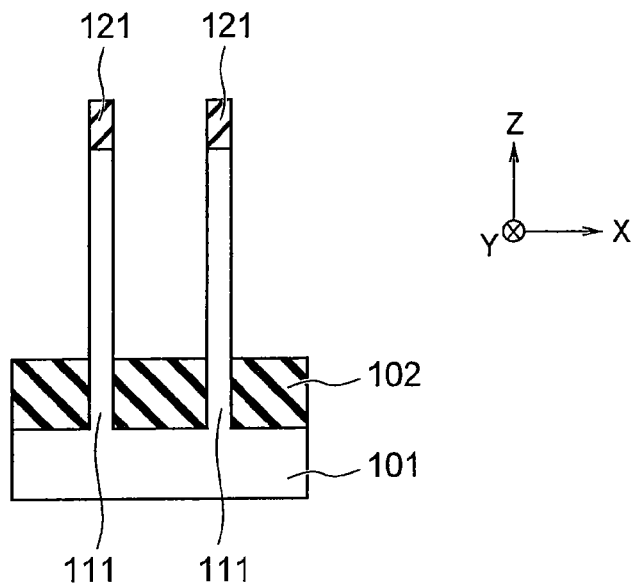

As shown in FIGS. 7A and 7B, the surface of the insulating layer 102 is then recessed by wet etching or RIE. As a result, the isolation insulators 102 as shallow trench isolation (STI) insulators are formed.

Figure 8A:
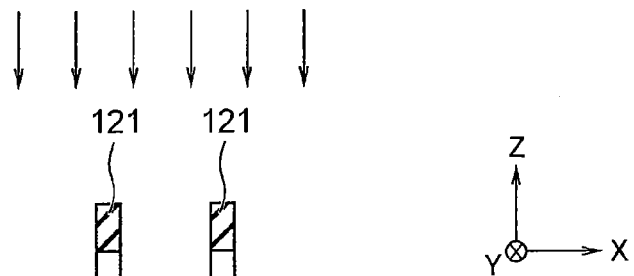
Figure 8B:
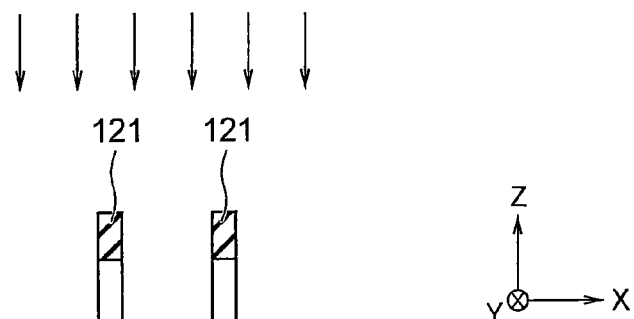

As shown in FIGS. 8A and 8B, impurity ions are then implanted into the fins 111 perpendicularly to the main surface of the semiconductor substrate 101 with low acceleration energy. As a result, the punch through stopper diffusion layers 112 are formed between the isolation insulators 102 in the fins 111. The ion species to be used in this step is, for example, B (boron) or In (indium).

Figure 9A:
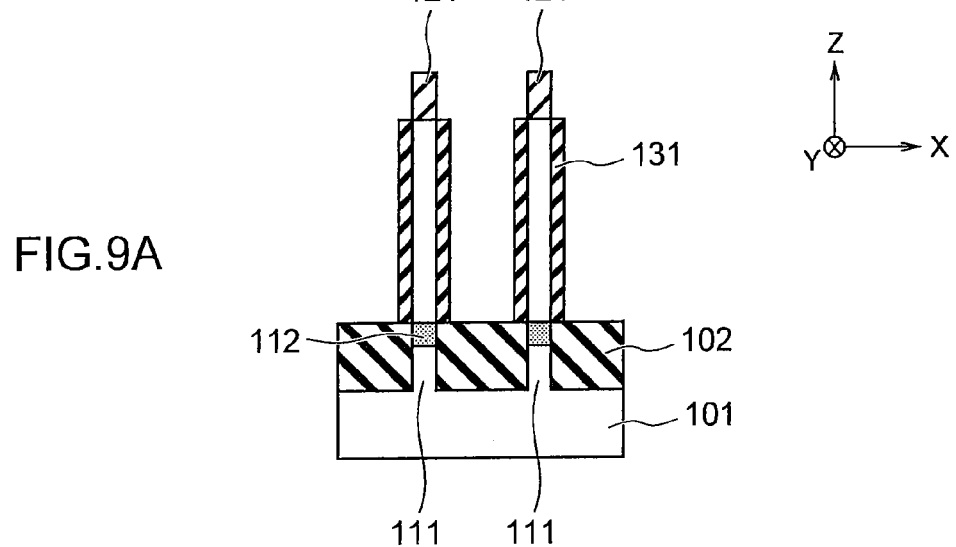
Figure 9B:
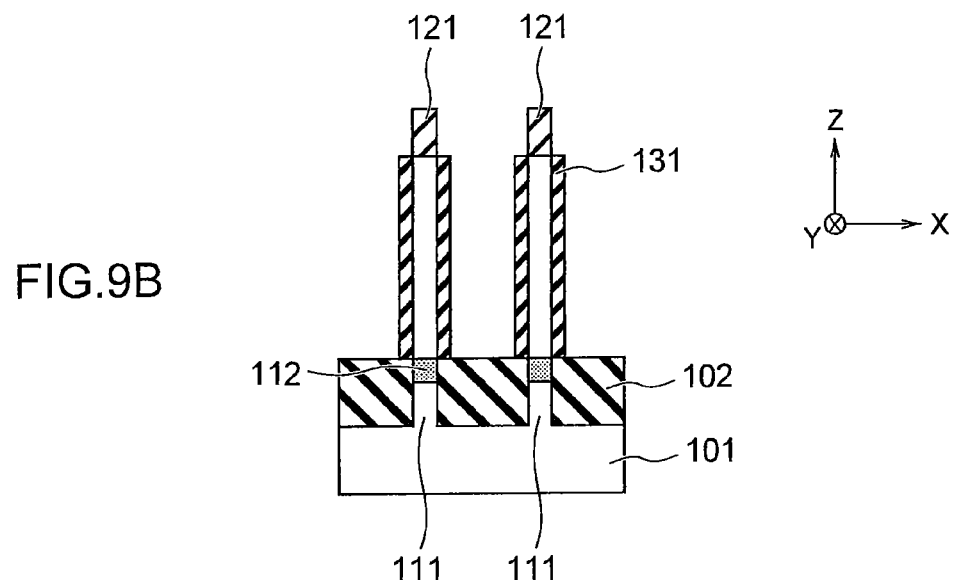
Figure 10A:
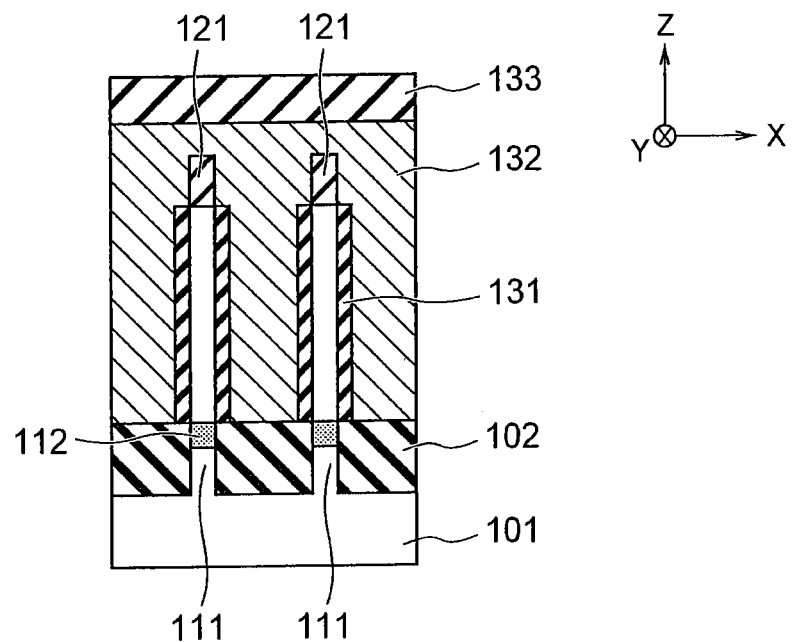
Figure 10B:
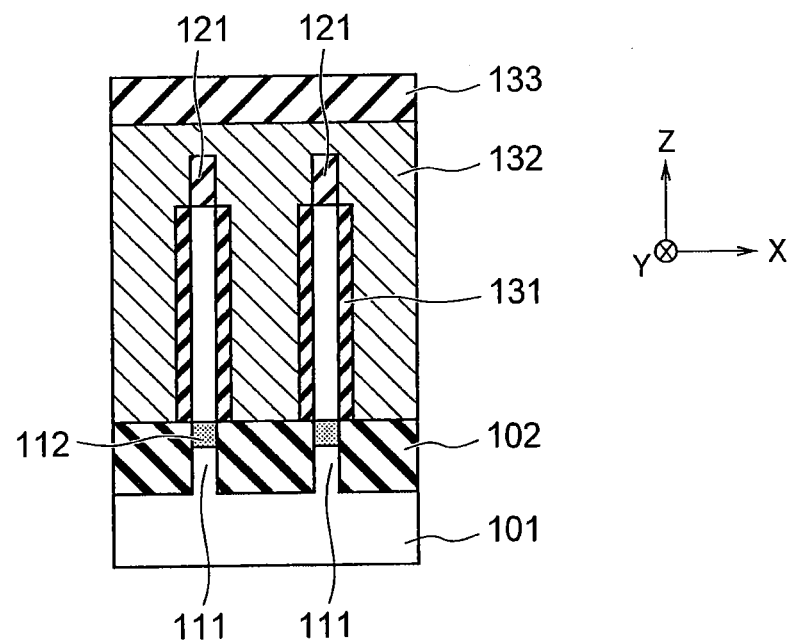

As shown in FIGS. 9A and 9B, insulators 131 to be the gate insulators 131 are then formed on the side surfaces of the fins 111 by thermal oxidation. As shown in FIGS. 10A and 10B, an electrode material 132 to be the gate electrode 132 and the cap layer 133 are then sequentially deposited on the entire surface of the semiconductor substrate 101.

Figure 11A:
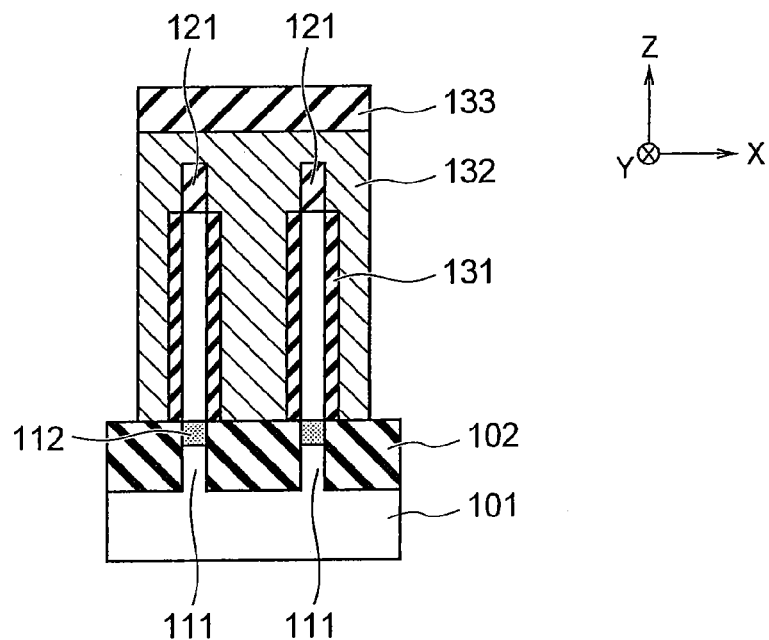
Figure 11B:
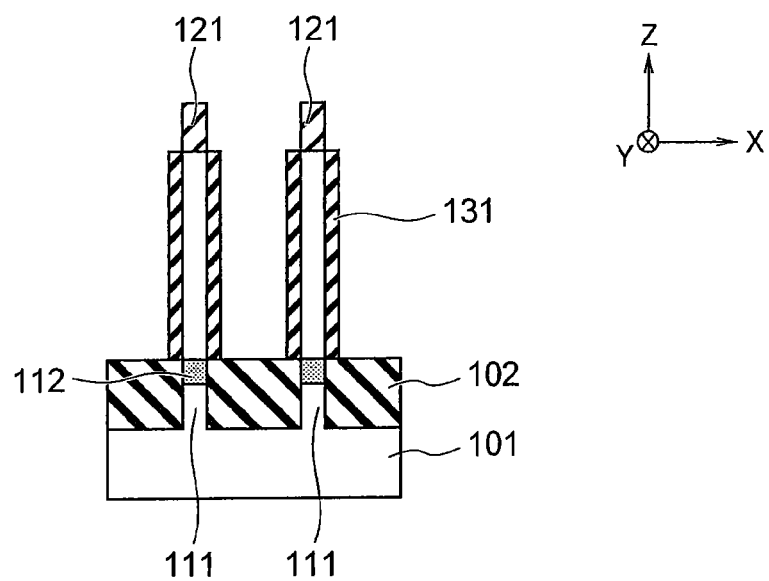
Figure 12A:
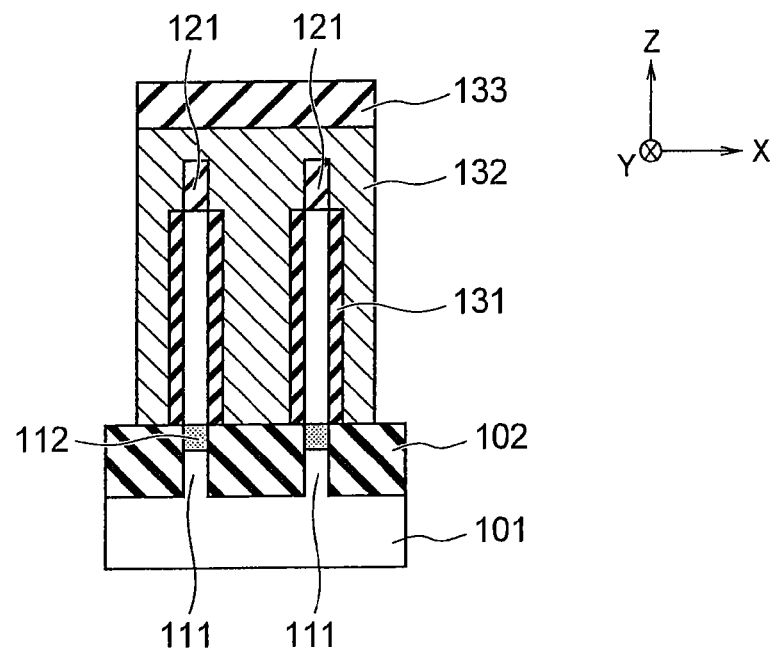
Figure 12B:
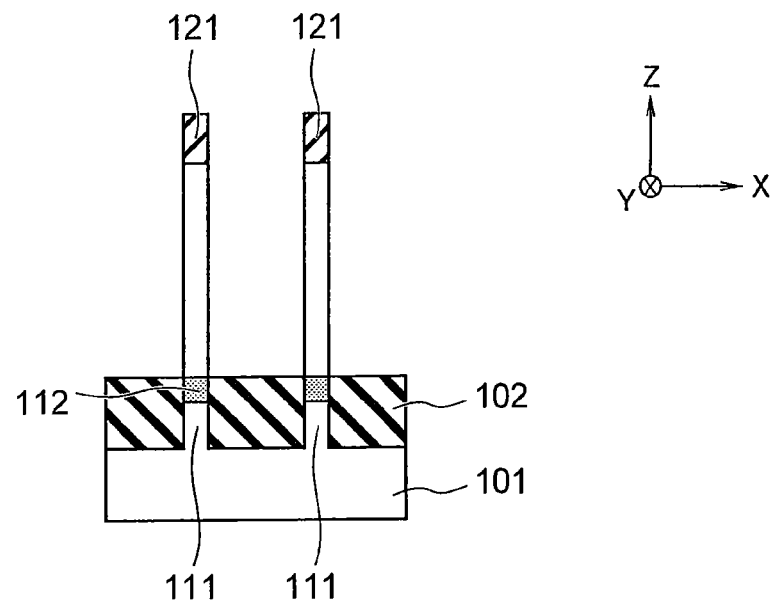

As shown in FIGS. 11A and 11B, after the cap layer 133 is processed to form a hard mask for the gate electrode 132, the electrode material 132 is etched by RIE to form the gate electrode 132. It should be noted that the electrode material 132 is removed in FIG. 11B. As shown in FIGS. 12A and 12B, the insulators 131 on the fin side surfaces of the S/D regions are then removed by wet etching. It should be noted that in FIG. 12B, the insulators 131 are removed. In this manner, the gate electrode 132 is formed on the side surfaces and the upper surfaces of the fins 111 via the gate insulators 131 and the hard mask layers 121.

Figure 13A:
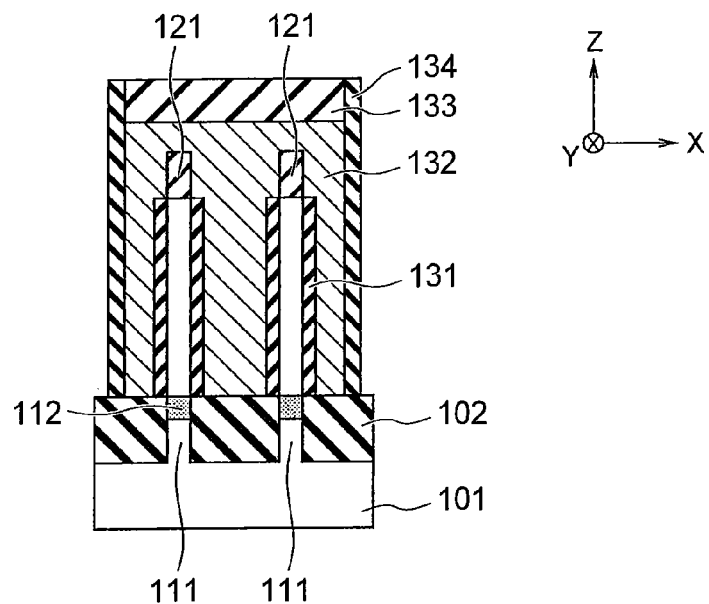
Figure 13B:
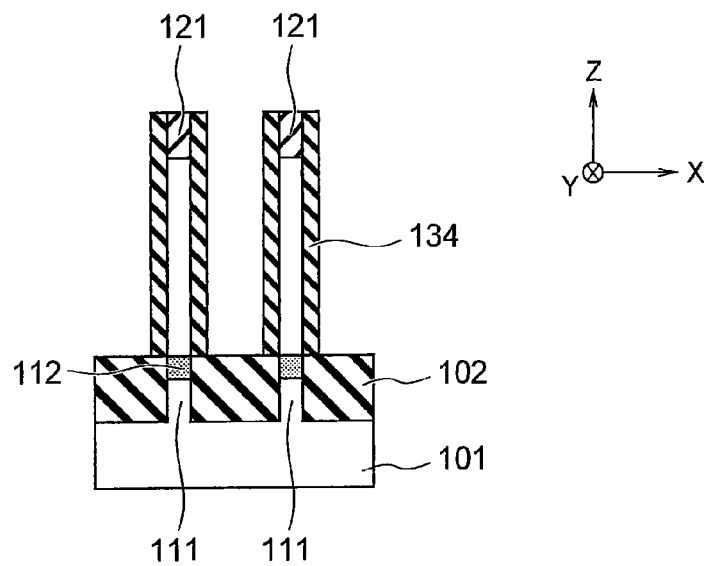
Figure 14A:
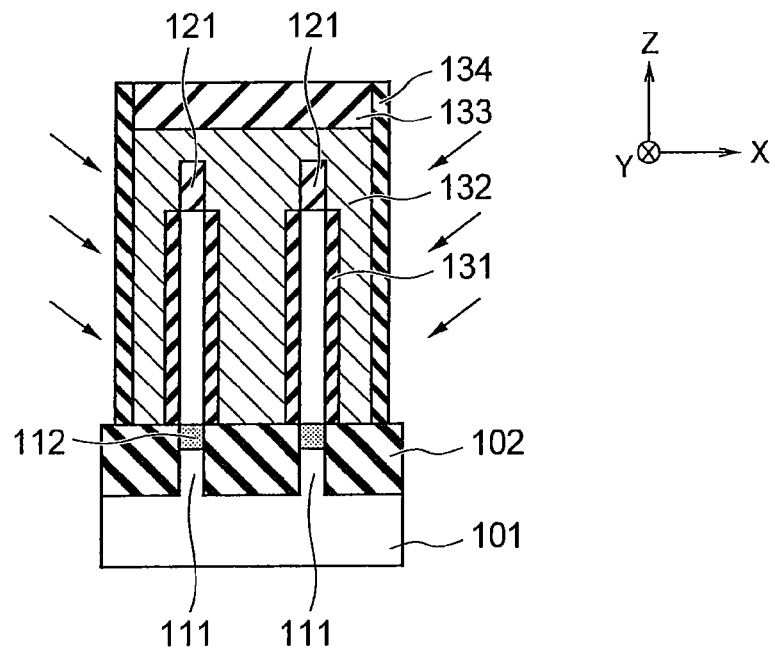
Figure 14B:
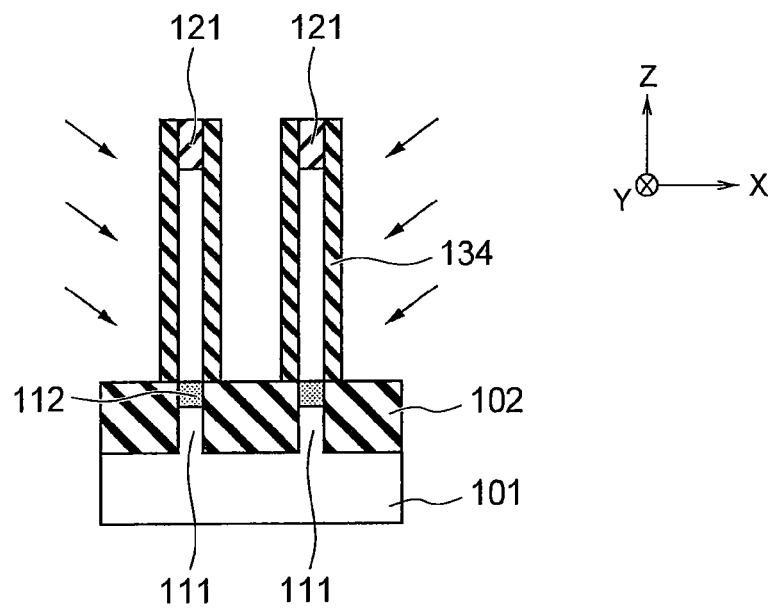
Figure 15A:
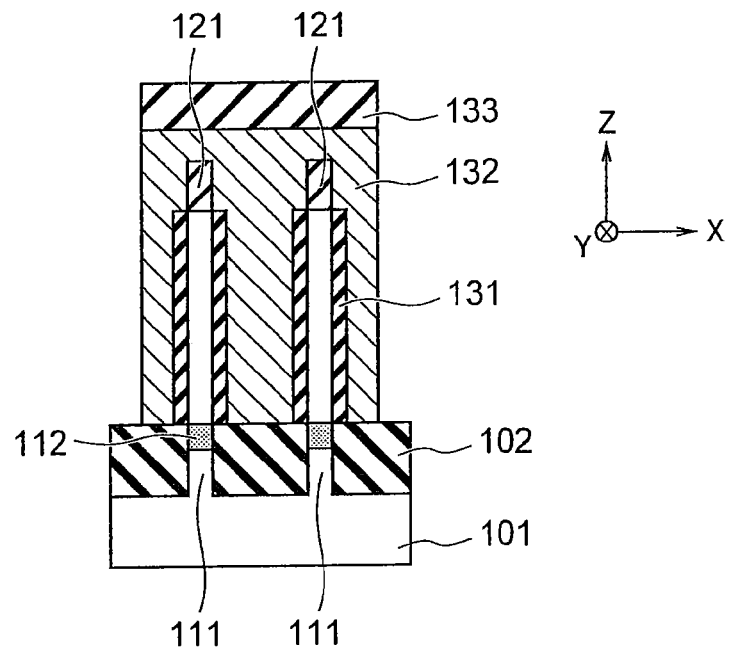
Figure 15B:
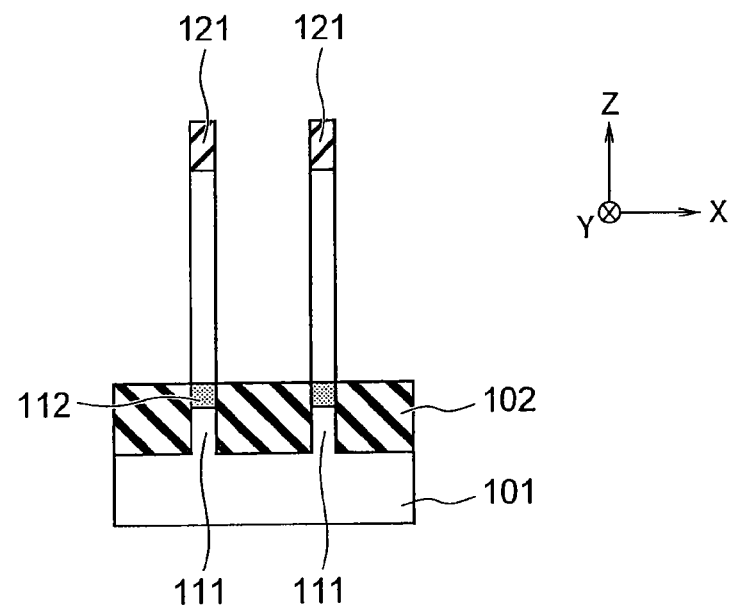

As shown in FIGS. 13A and 13B, the sidewall insulators 134 are then formed on the X directional side surfaces of the fins 111, and the X and Y directional side surfaces of the gate electrode 132 and the cap layer 133. The former sidewall insulators 134 are shown in FIG. 13B, and the latter sidewall insulators 134 are shown in FIGS. 13A and 1A. The sidewall insulators 134 shown in FIGS. 13A and 13B are removed by wet etching after oblique ion irradiation shown in FIGS. 14A and 14B (FIGS. 15A and 15B). The ion species to be used in the oblique ion irradiation is, for example, Xe (xenon).

Figure 16A:
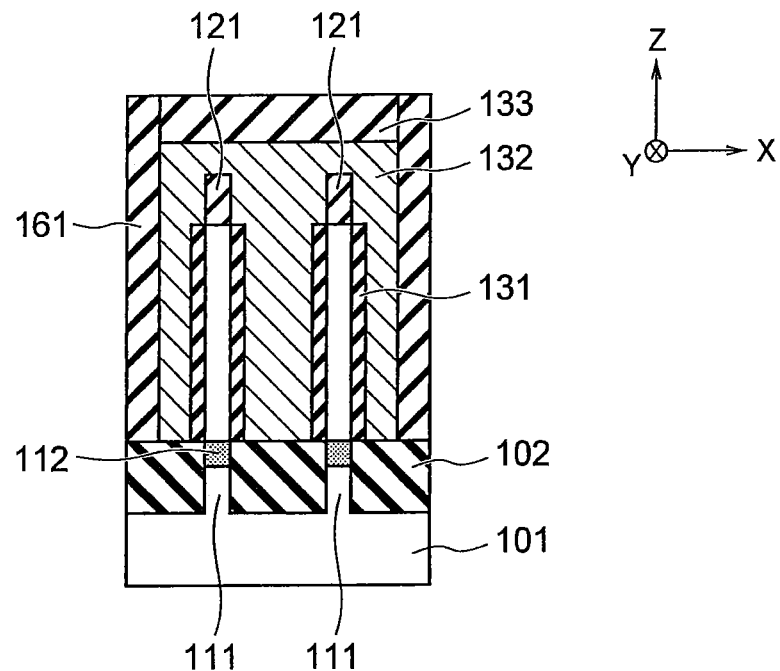
Figure 16B:
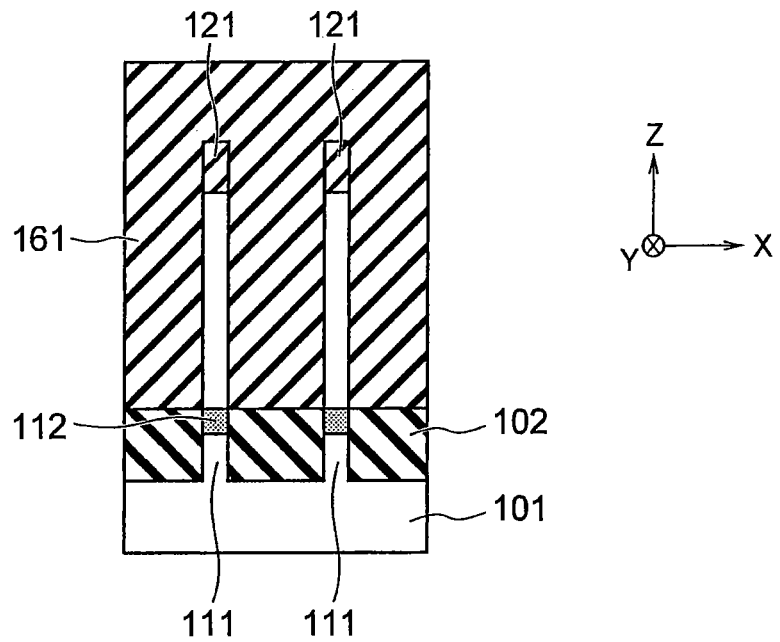

An insulator 161 to be used for forming the epitaxial layers 141 is then deposited on the entire surface of the semiconductor substrate 101 (FIGS. 16A and 16B). As a result, the fins 111 are covered with the insulator 161. The insulator 161 is, for example, a silicon oxide layer.

Figure 17A:
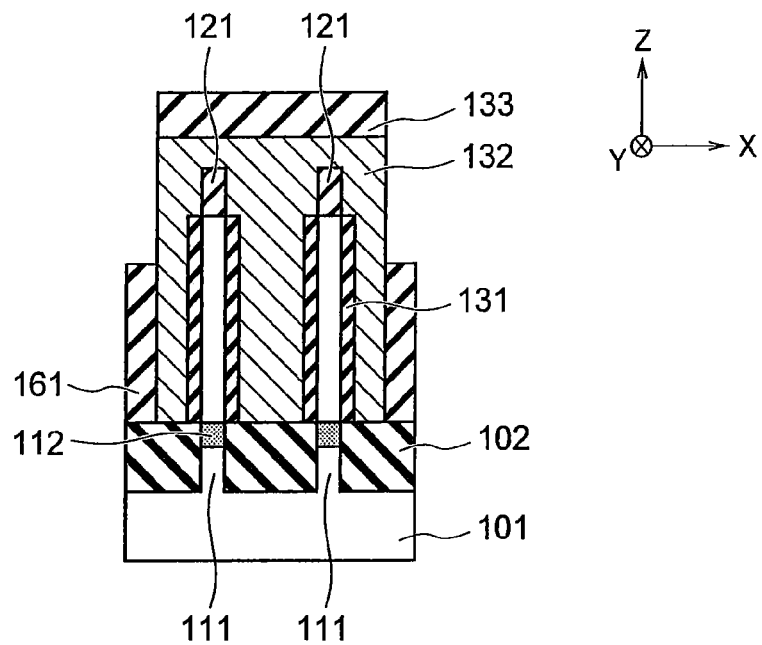
Figure 17B:
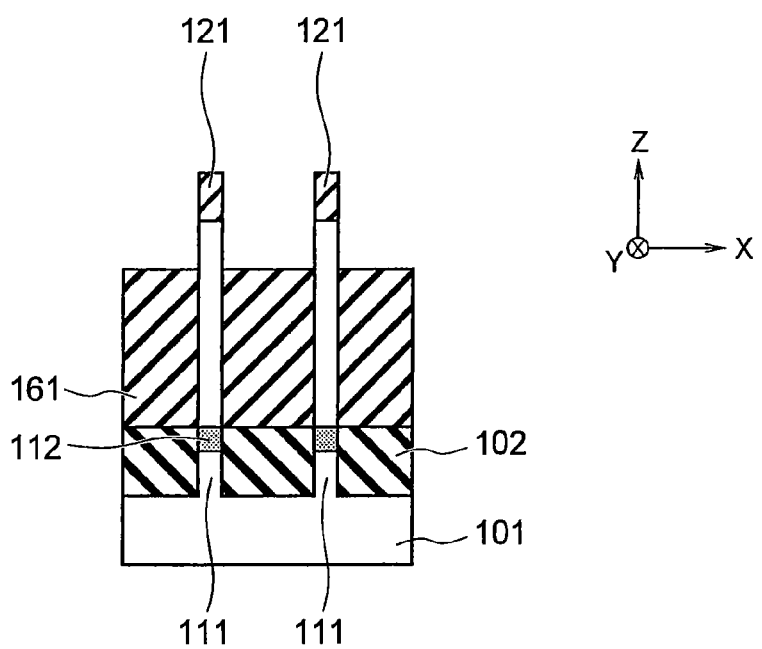
Figure 18A:
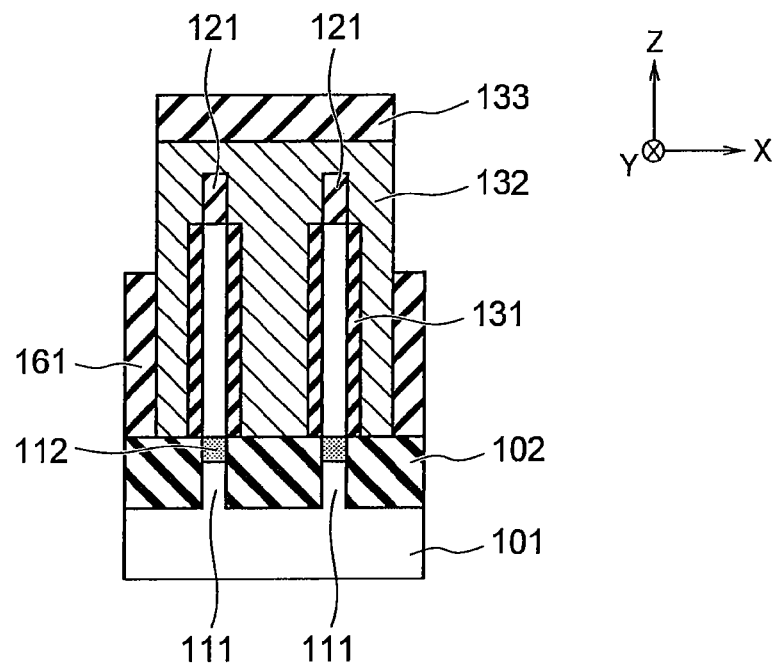
Figure 18B:
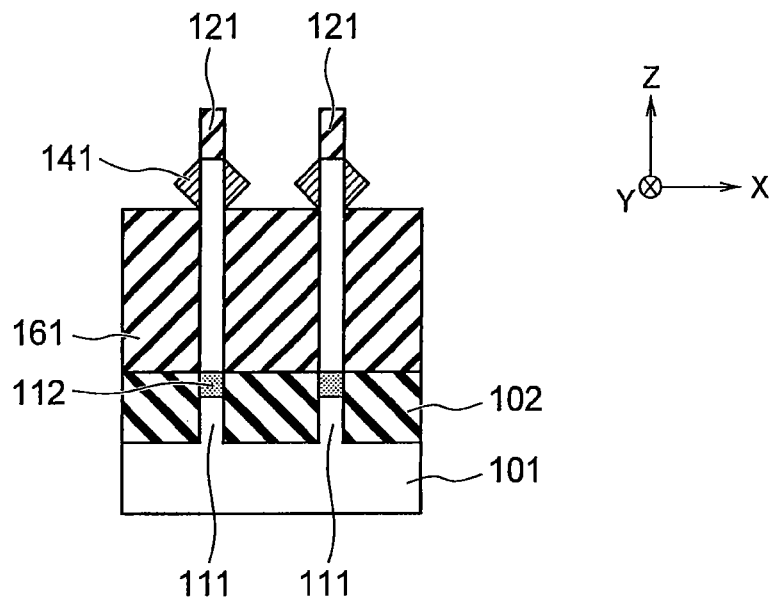

As shown in FIGS. 17A and 17B, an upper surface of the insulator 161 is then recessed by wet etching or RIE so that a height of the upper surface of the insulator 161 becomes low. As a result, upper portions of the fins 111 are exposed. As shown in FIGS. 18A and 18B, one epitaxial layer 141 is formed on each side surface $S_1$ of the exposed fins 111. When the gate electrode 132 is a polysilicon layer, the epitaxial layers 141 are also formed on the X-directional side surfaces of the gate electrode 132 by SEG. In this case, if a space between the adjacent gate electrodes 132 is sufficiently secured, a short of the gate electrodes 132 can be prevented.

Figure 19A:
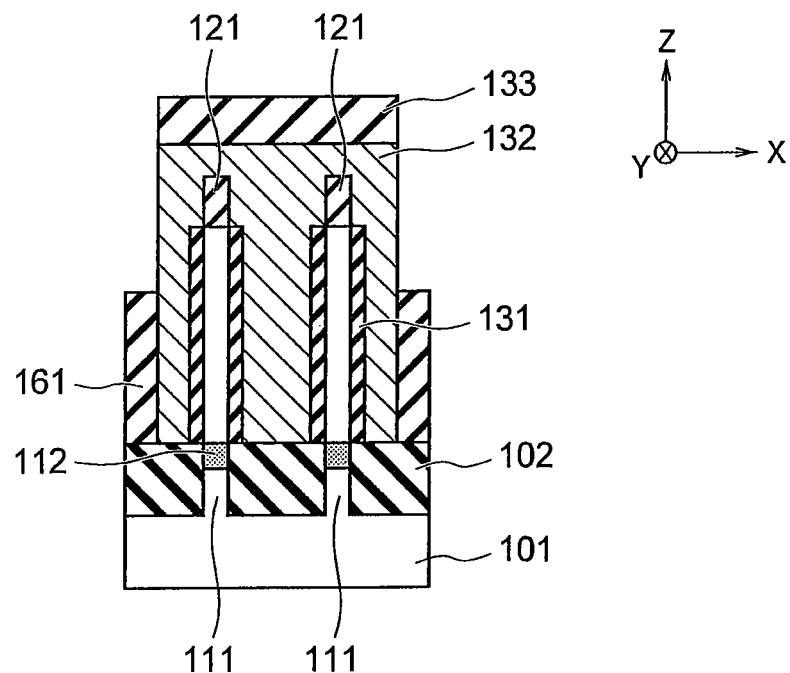
Figure 19B:
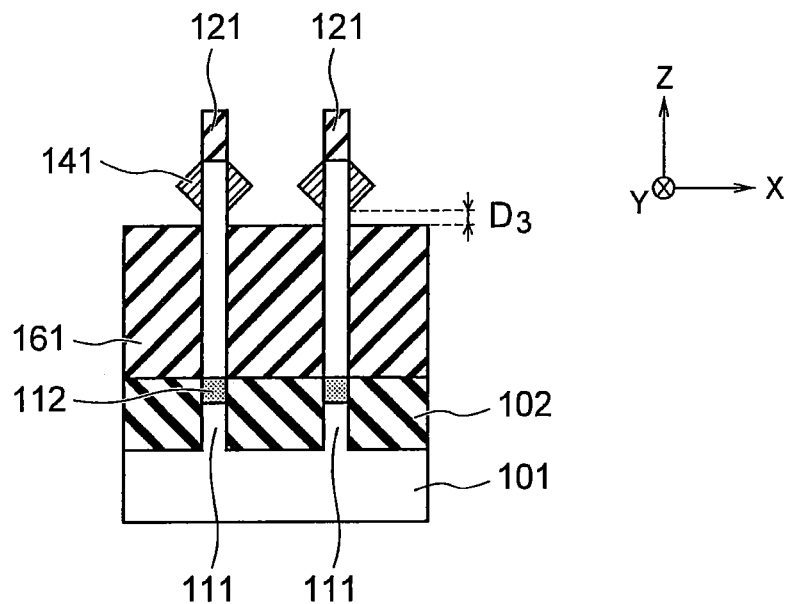
Figure 20A:
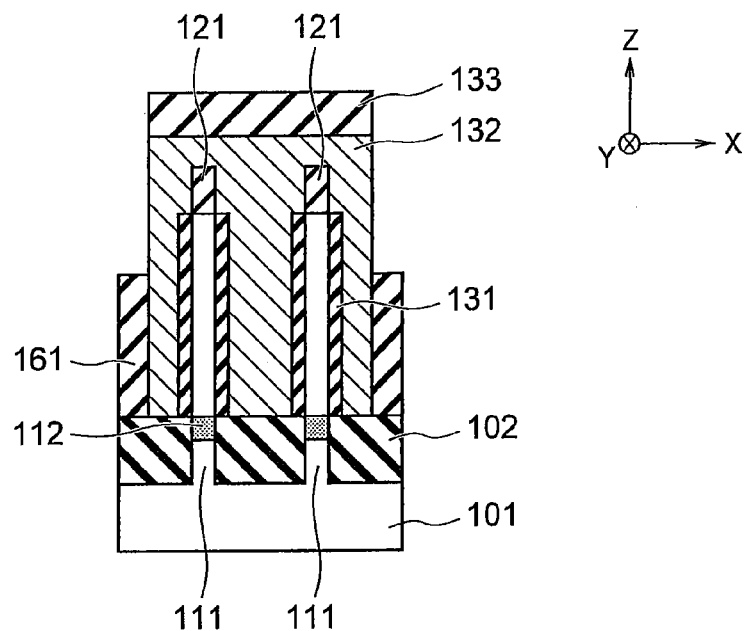
Figure 20B:
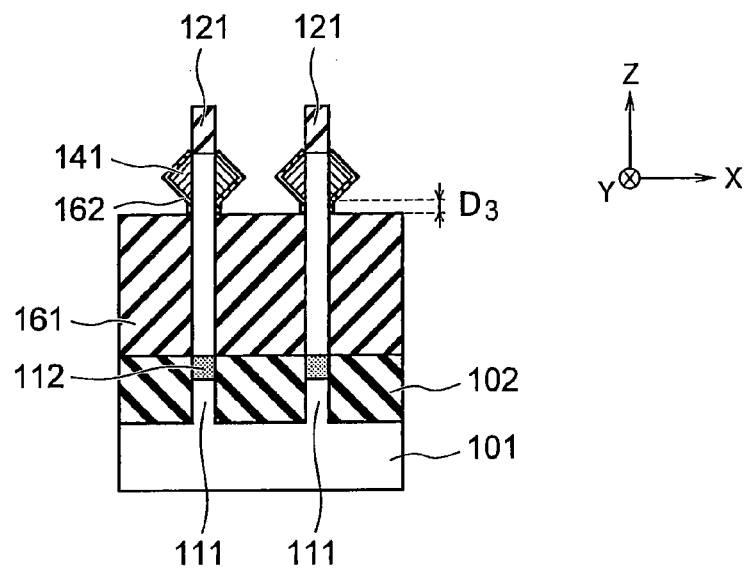

As shown in FIGS. 19A and 19B, the upper surface of the insulator 161 is then recessed by a width "$D_3$" by wet etching or isotropic dry etching. As shown in FIGS. 20A and 20B, protection layers 162 are then formed on the surfaces of the fins 111 and the epitaxial layers 141. The protection layers 162 are formed of material which is more difficult to etch than the insulator 161 when the upper surface of the insulator 161 is recessed. The protection layers 162 are, for example, silicon oxide layers formed by oxidation of silicon, or silicon oxynitride layers formed by oxidation and nitridation of silicon.

Figure 21A:
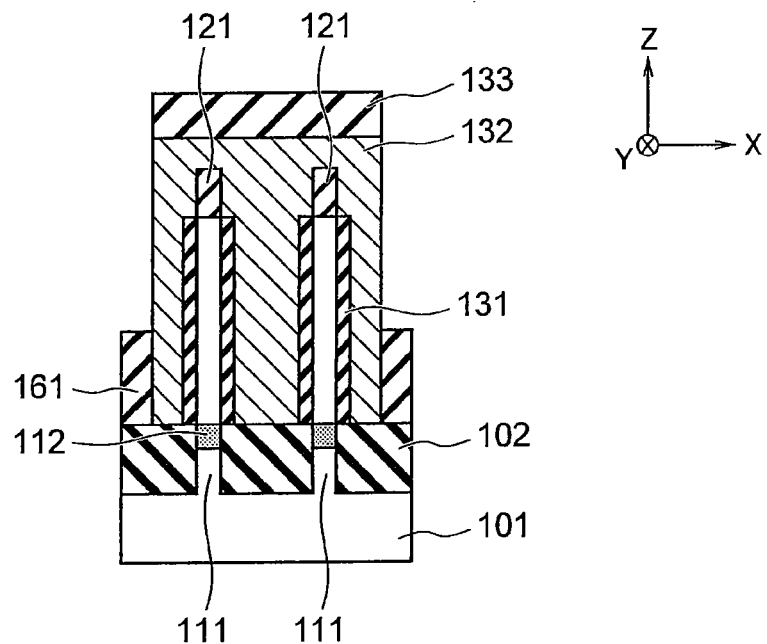
Figure 21B:
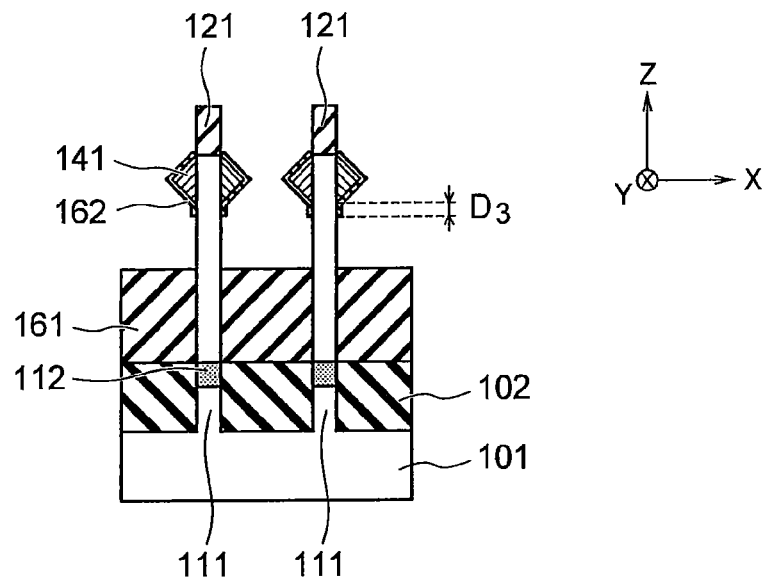
Figure 22A:
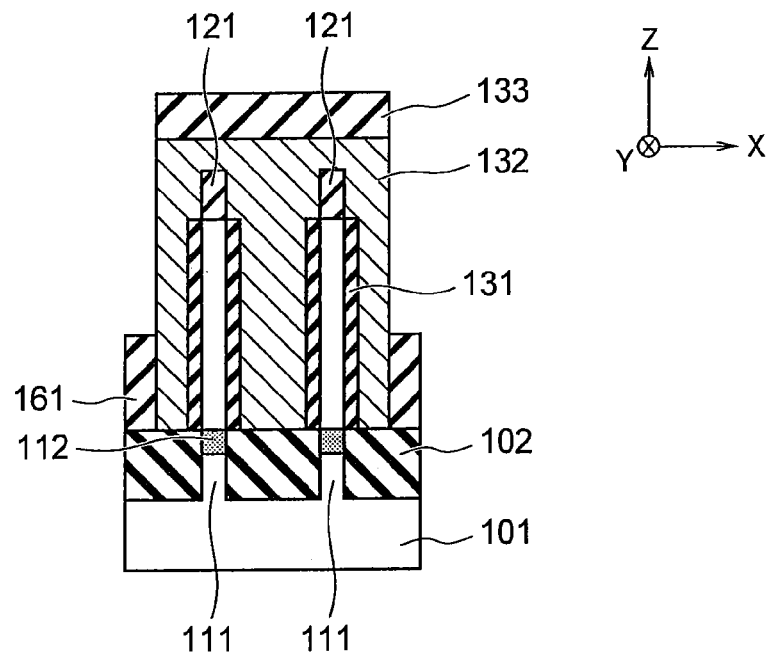
Figure 22B:
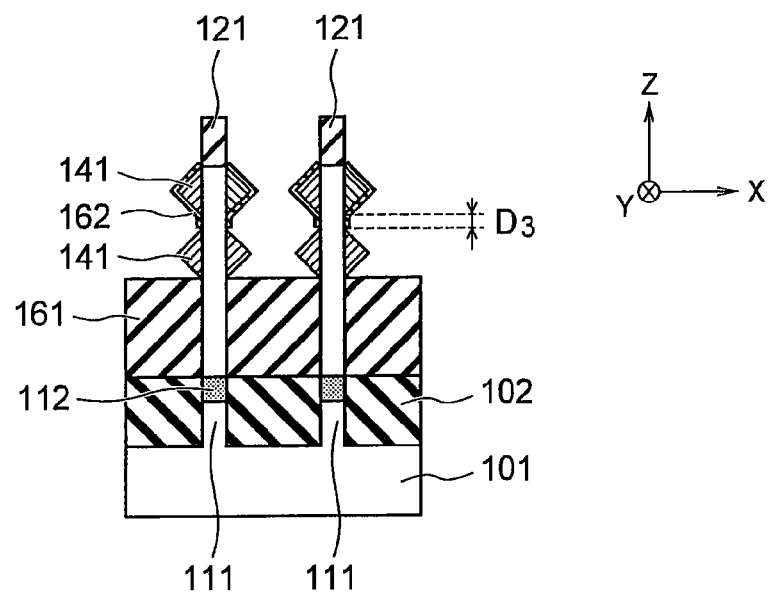
Figure 23A:
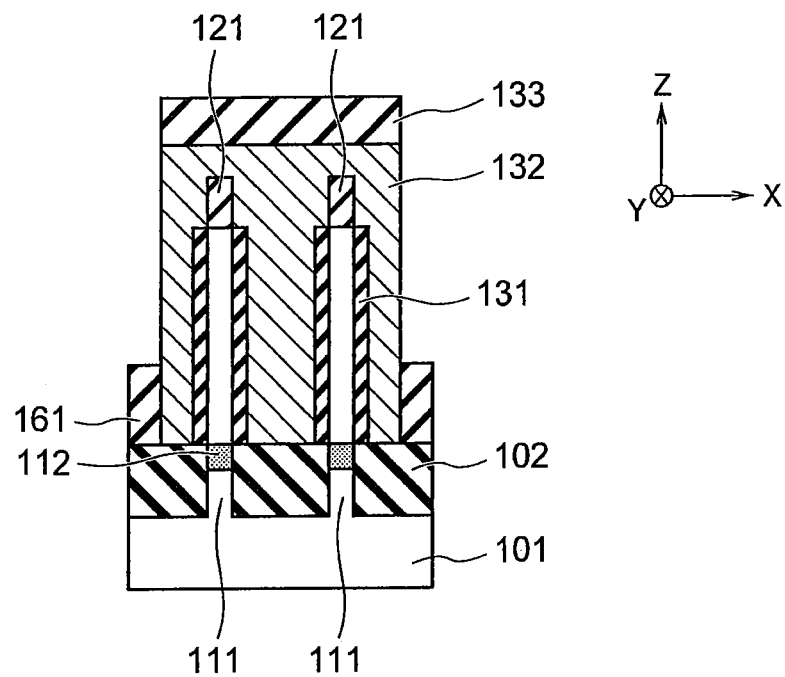
Figure 23B:
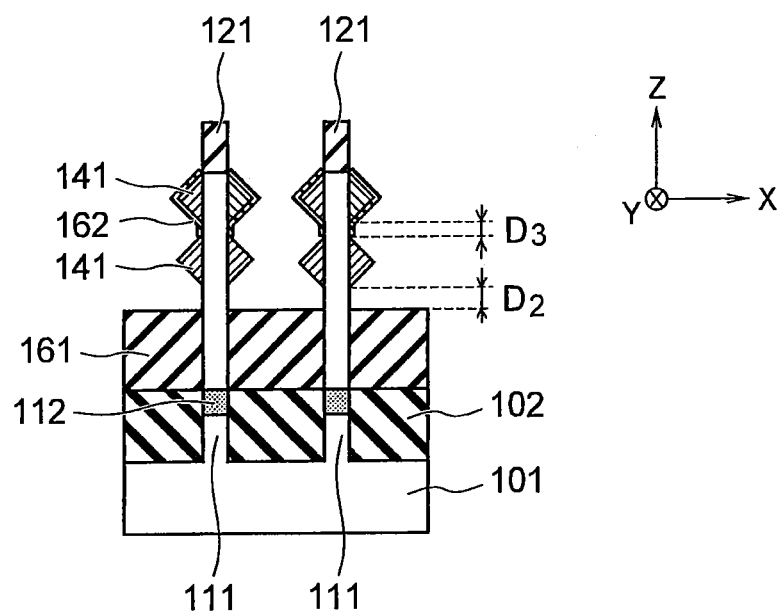
Figure 24A:
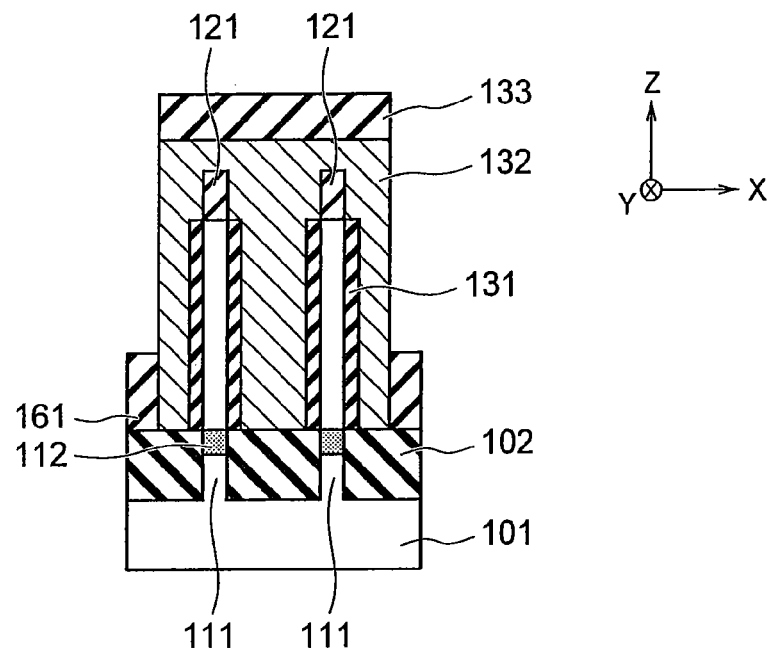
Figure 24B:
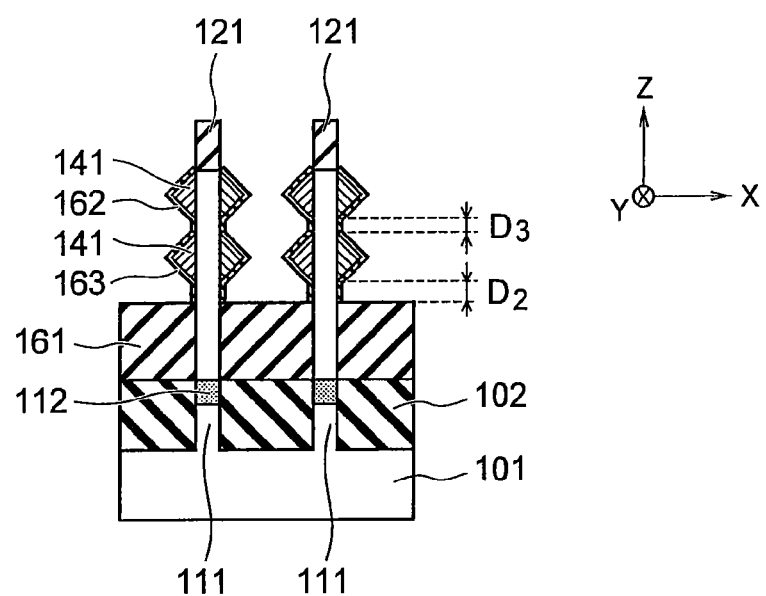

Recess processing (first recess processing) similar to the step of FIGS. 17A and 17B, and epitaxial growth processing similar to the step of FIGS. 18A and 18B are carried out again (FIGS. 21A to 22B). In the step of FIGS. 21A and 21B, the upper surface of the insulator 161 is recessed while the protection layers 162 remain. Therefore, in the step of FIGS. 22A and 22B, the epitaxial layers 141 grow on only the side surfaces $S_1$ of the fins 111 which are not covered with the protection layers 162. As a result, the second epitaxial layer 141 is formed on each side surface $S_1$ of the fins 111.

Recess processing (second recess processing) similar to the step of FIGS. 19A and 19B, and protection processing similar to the step of FIGS. 20A and 20B are carried out again (FIGS. 23A to 24B). As a result, the upper surface of the insulator 161 is recessed by a width $D_2$, and protection layers 163 similar to the protection layers 162 are formed on the surfaces of the fins 111 and the epitaxial layers 141.

Figure 25A:
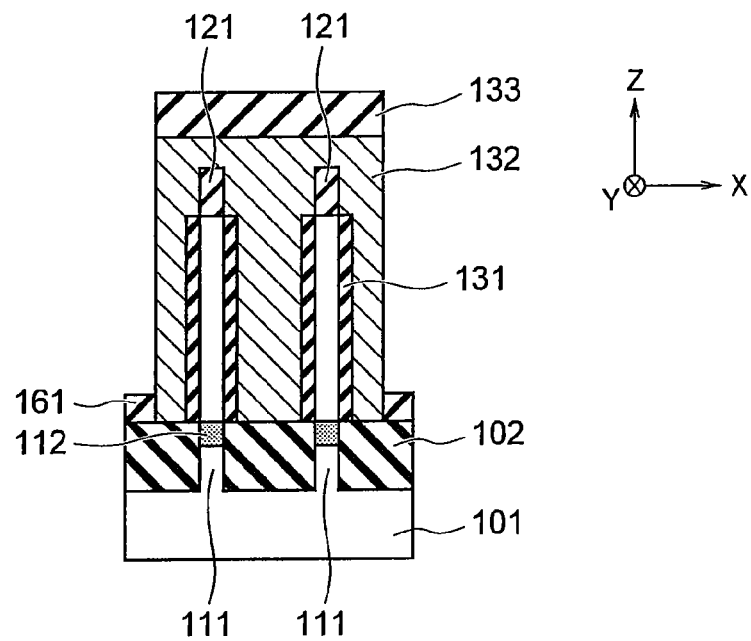
Figure 25B:
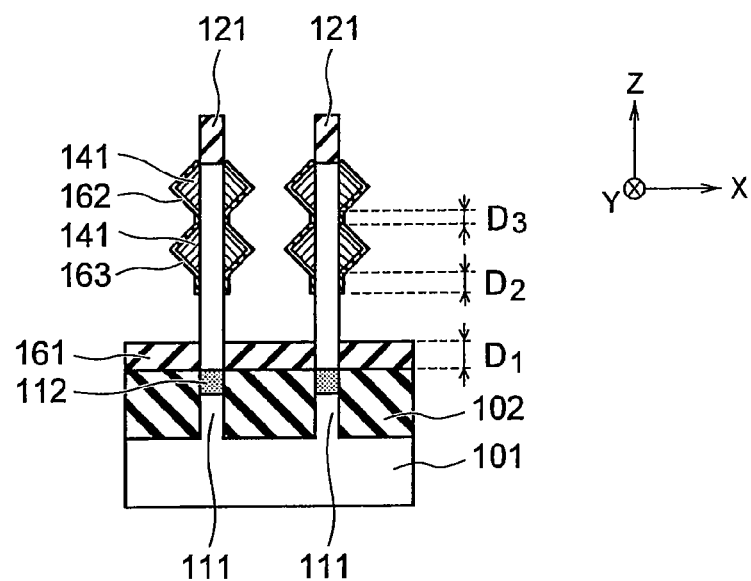
Figure 26A:
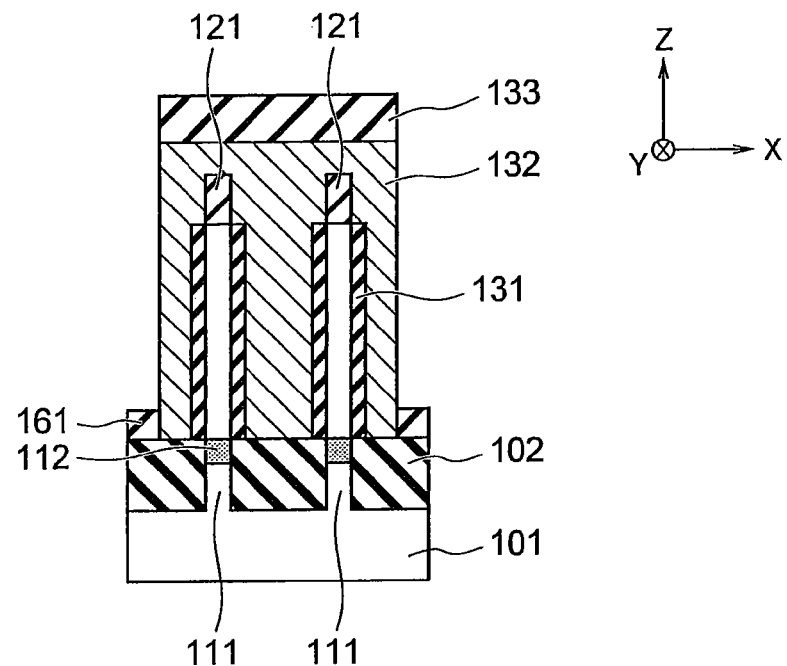
Figure 26B:
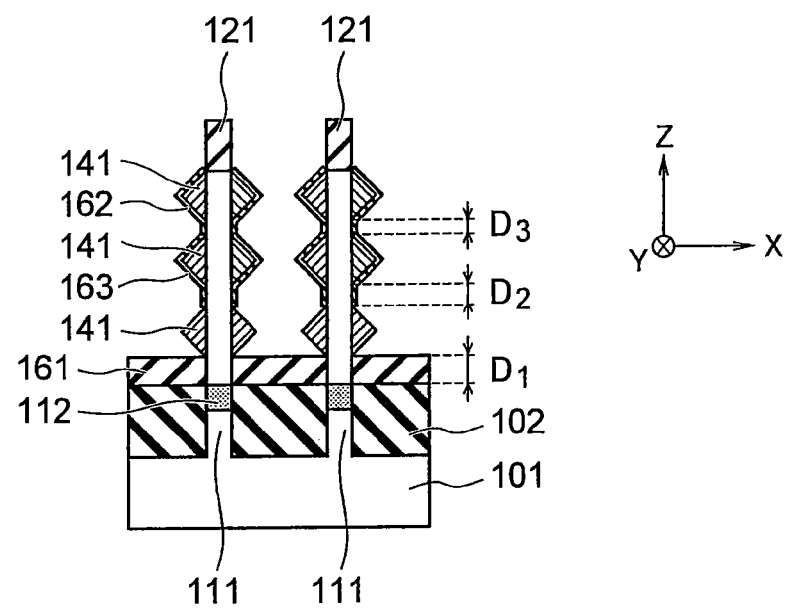
Figure 27A:
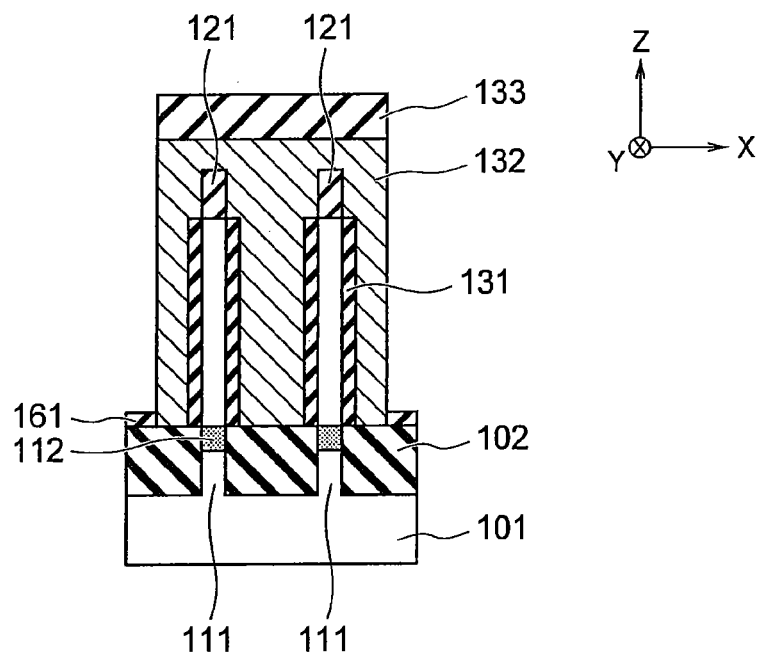
Figure 27B:
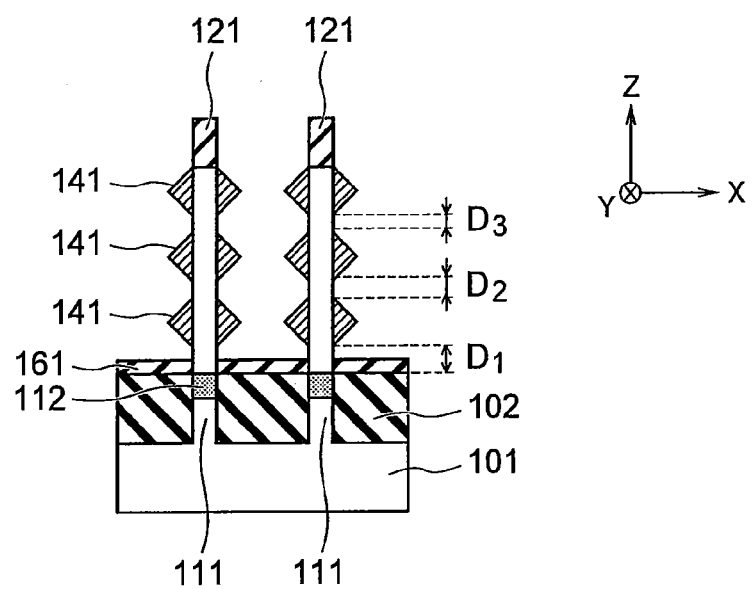

The first recess processing and the epitaxial growth processing are carried out once more (FIGS. 25A to 26B). In the step of FIGS. 25A and 25B, the upper surface of the insulator 161 is recessed until the thickness of the insulator 161 becomes $D_1$ while the protection layers 162 and 163 remain. Therefore, in the step of FIGS. 26A and 26B, the epitaxial layers 141 grow on only the side surfaces $S_1$ of the fins 111 which are not covered with the protection layers 162 and 163. As a result, the third epitaxial layer 141 is formed on each side surface $S_1$ of the fins 111. As shown in FIGS. 27A and 27B, the protection layers 162 and 163 are then removed.

In this manner, the first recess processing of recessing the upper surface of the insulator 161, and the epitaxial growth processing of forming the epitaxial layers 141 are alternately carried out repeatedly in the present embodiment. During the repetitive processing, the second recess processing of recessing the upper surface of the insulator 161, and the protection processing of forming the protection layers 162 and 163 are carried out in the present embodiment. As a result, a plurality of epitaxial layers 141 are formed on each side surface $S_1$ of the fins 111 in order along the Z direction.

Figure 28A:
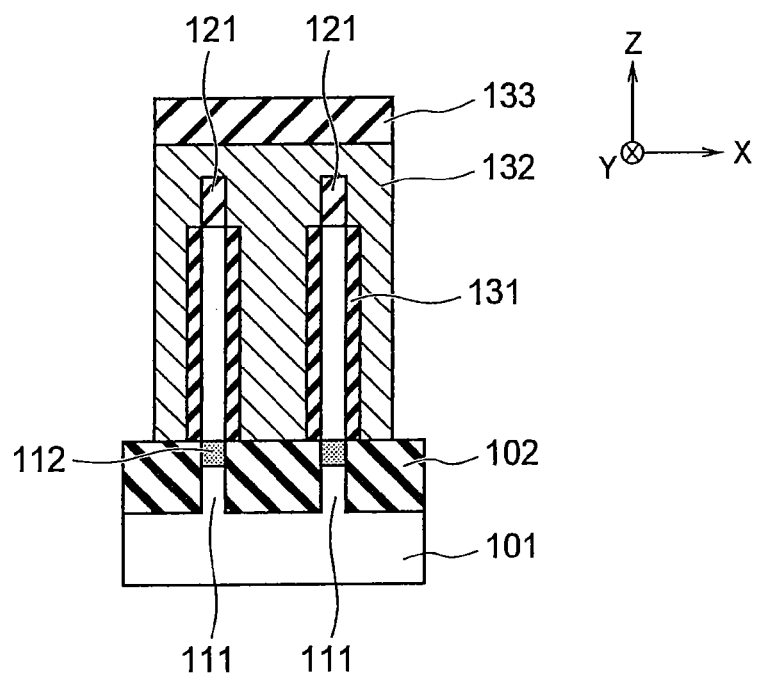
Figure 28B:
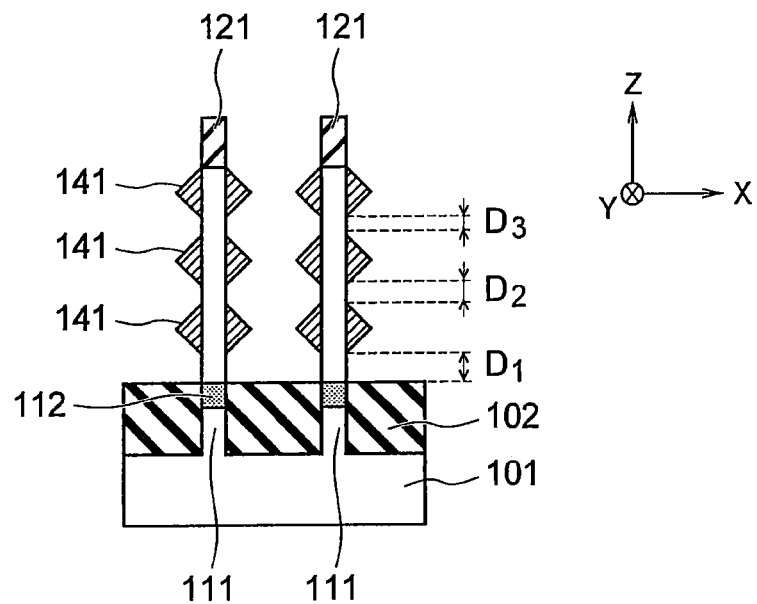

As shown in FIGS. 28A and 28B, the remaining insulator 161 is then removed by wet etching or isotropic dry etching. As a result, the upper surfaces of the isolation insulators 102 are exposed.

Figure 29A:
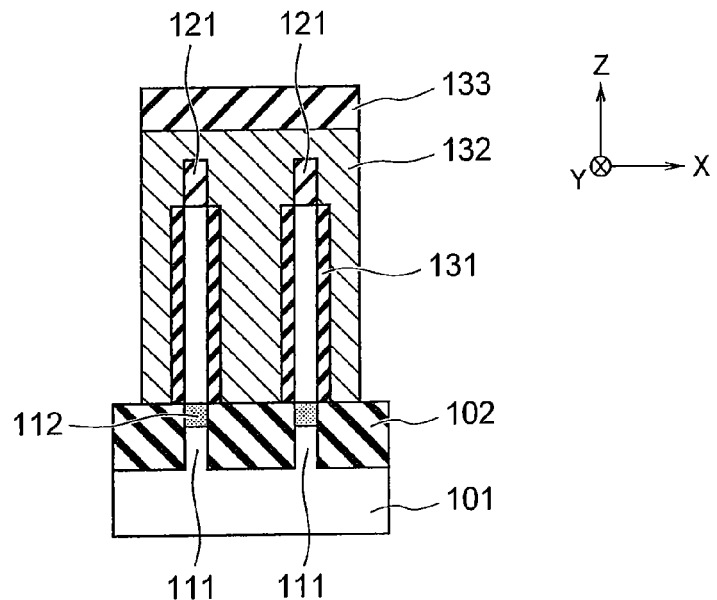
Figure 29B:
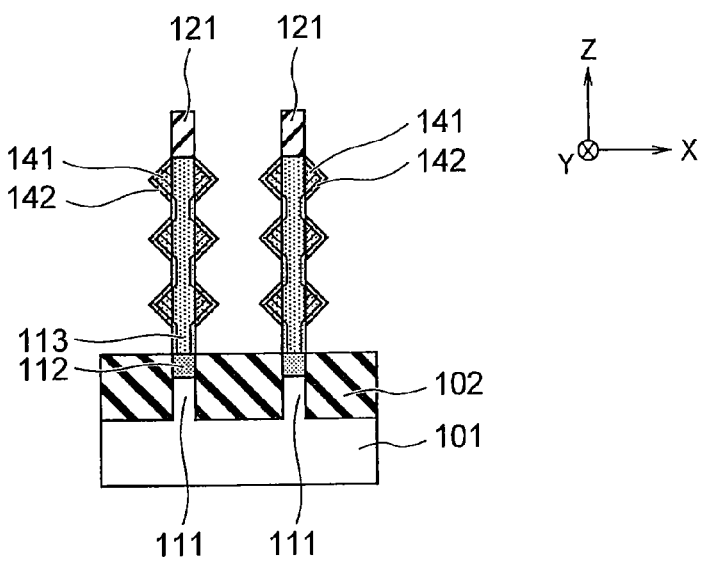

After impurity ions are implanted into the fins 111 and the epitaxial layers 141 in the S/D regions to form the S/D diffusion layers 113, the silicide layers 142 are formed on the surfaces of the S/D diffusion layers 113 (FIGS. 29A and 29B). The ion species to be used in ion implantation for forming the S/D diffusion layers 113 is, for example, P (Phosphorus) or As (Arsenic). In the siliciding step of FIGS. 29A and 29B, each epitaxial layer 141 may be entirely silicided, or may only be partially silicided. Alternatively, the silicide processing of FIGS. 29A and 29B may be omitted.

Figure 30A:
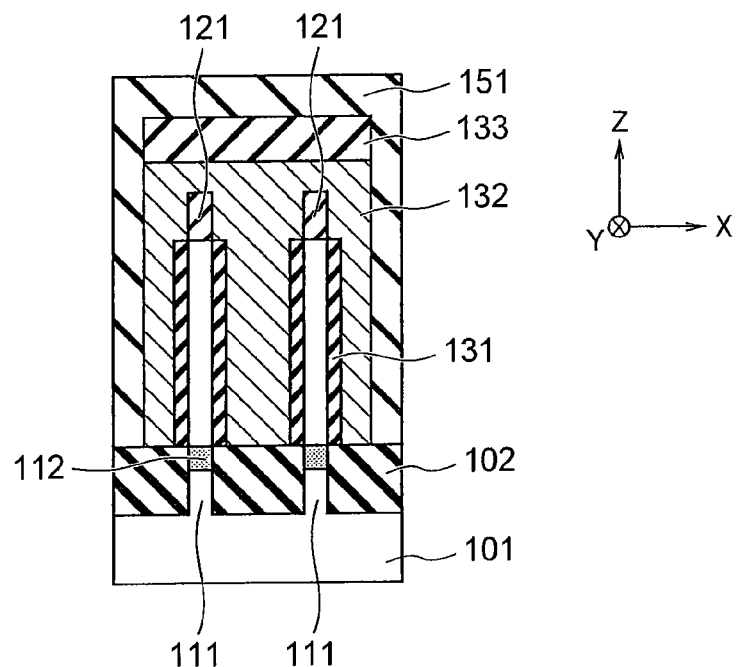
Figure 30B:
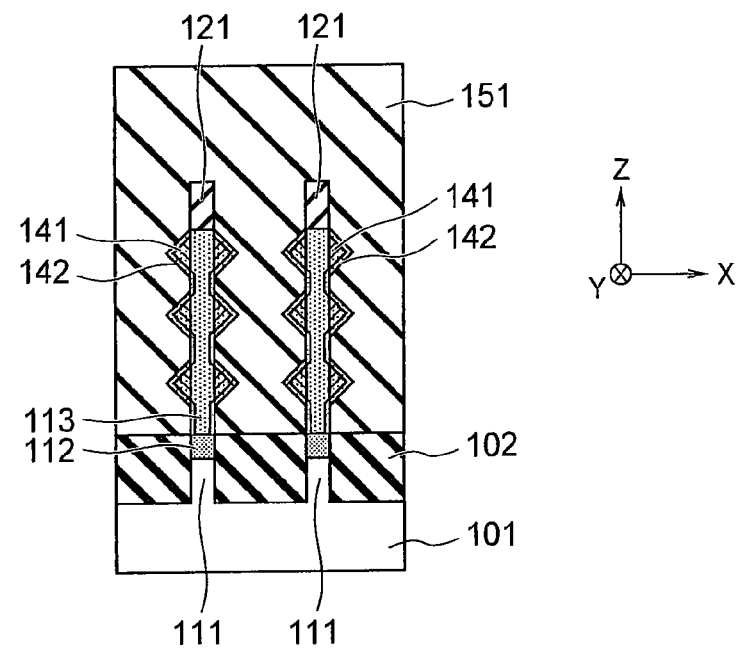

As shown in FIGS. 30A and 30B, the interlayer dielectric 151 is then formed on the entire surface of the semiconductor substrate 101. As a result, the fin FET is covered with the interlayer dielectric 151. The interlayer dielectric 151 of the present embodiment is formed by coating an organic solvent solution containing polysilazane on the semiconductor substrate 101 and burning the organic solvent solution.

Thereafter, processes of forming various contact plugs, via plugs, interconnect layers, interlayer dielectrics and the like are carried out in the present embodiment. In this manner, the semiconductor device of FIGS. 1A to 1C is manufactured.

In the present method, both of an n-type fin FET and a p-type fin FET may be formed on the semiconductor substrate 101. In this case, examples of a method of forming those fin FETs include the following two methods.

In the first example, the n-type fin FET and the p-type fin FET are formed on the semiconductor substrate 101 to include the epitaxial layers 141 so that the spacings "$D_1$" to "$D_3$" of the epitaxial layers 141 satisfy $D_1 > D_2 > D_3$ in the n-type, and satisfy $D_1 < D_2 < D_3$ in the p-type. The interlayer dielectric 151 is then formed on those fin FETs. In this manner, the semiconductor device of FIGS. 1A to 1C is manufactured.

In the second example, the n-type fin FET and the p-type fin FET are simultaneously formed on the semiconductor substrate 101. Since those fin FETs are simultaneously formed, the values of the spacings "$D_1$" to "$D_3$" are the same in both the fin FETs. The fin FETs are then covered with different interlayer dielectrics 151. As a result, the interlayer dielectric 151 which applies a compressive stress can be formed on one of the fin FETs, and the interlayer dielectric 151 which applies a tensile stress can be formed on the other fin FET. In this manner, the semiconductor device of FIGS. 1A to 1C is manufactured.

In the present embodiment, the n-type fin FET and the p-type fin FET may be formed by a method other than the methods of those examples.

(3) Effect of First Embodiment

Finally, an effect of the first embodiment will be described.

As described above, the epitaxial layers 141 in the present embodiment are formed so that the spacings "$D_1$" to "$D_3$" change in accordance with the positions of the gaps in the Z direction. In addition, the fin FET in the present embodiment is covered with the interlayer dielectric 151 which applies a stress to the epitaxial layers 141.

Therefore, according to the present embodiment, a compressive stress or a tensile stress is applied to the fins 111 by the interlayer dielectric 151 which can apply a stress to the epitaxial layers 141, so that the carrier mobility in the channel regions in the fins 111 can be improved.

Therefore, according to the present embodiment, when the interlayer dielectric 151 which has a favorable embedding property is adopted, the interlayer dielectric 151 can be embedded even if the spacings "$D_1$" to "$D_3$" are small. Therefore, the carrier mobility in the channel regions in the fin FET can be improved even if the semiconductor device is highly integrated.

Figure 31A:
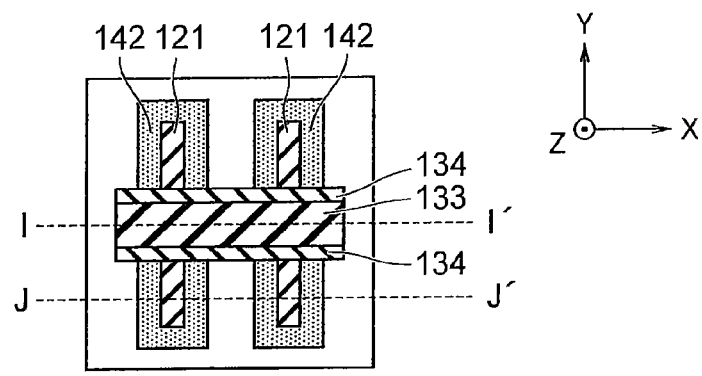
FIGS. 31A to 31C are a plan view and sectional views showing a structure of a semiconductor device of a modification of the first embodiment.
Figure 31B:
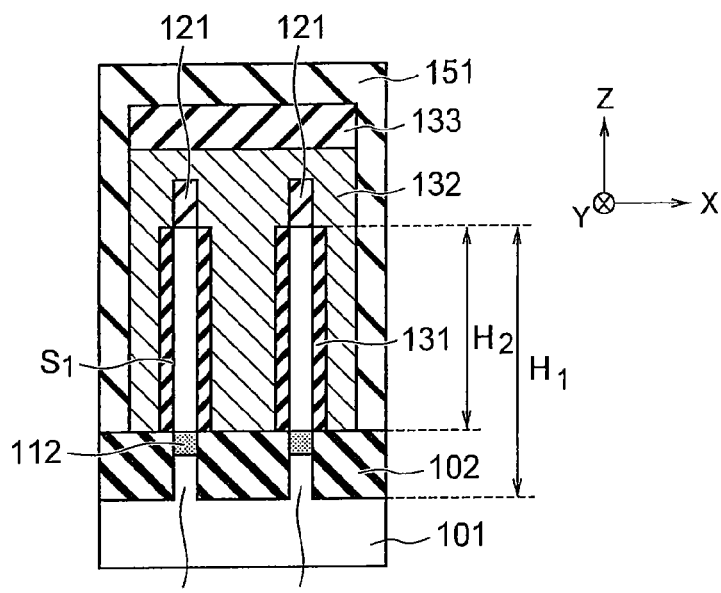
Figure 31C:
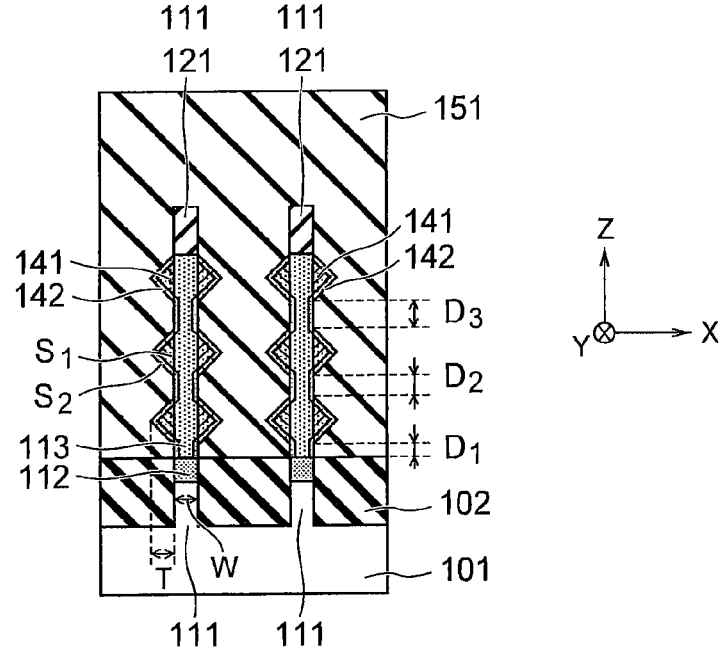
Figure 32A:
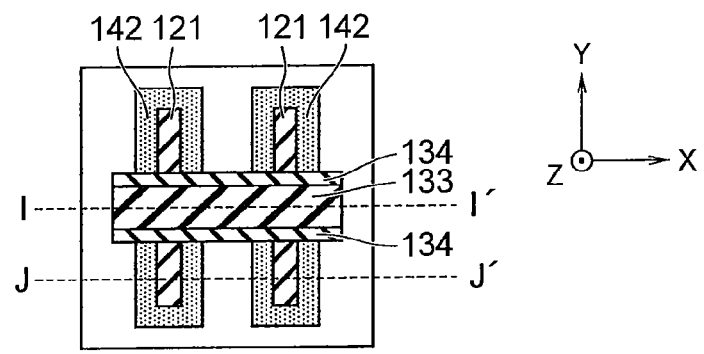
FIGS. 32A to 32C are a plan view and sectional views showing a structure of a semiconductor device of a modification of the first embodiment.
Figure 32B:
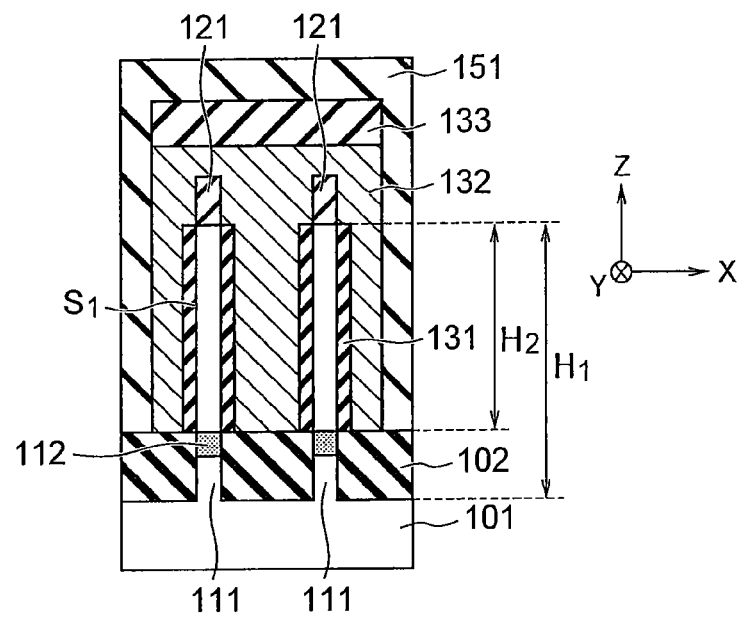
Figure 32C:
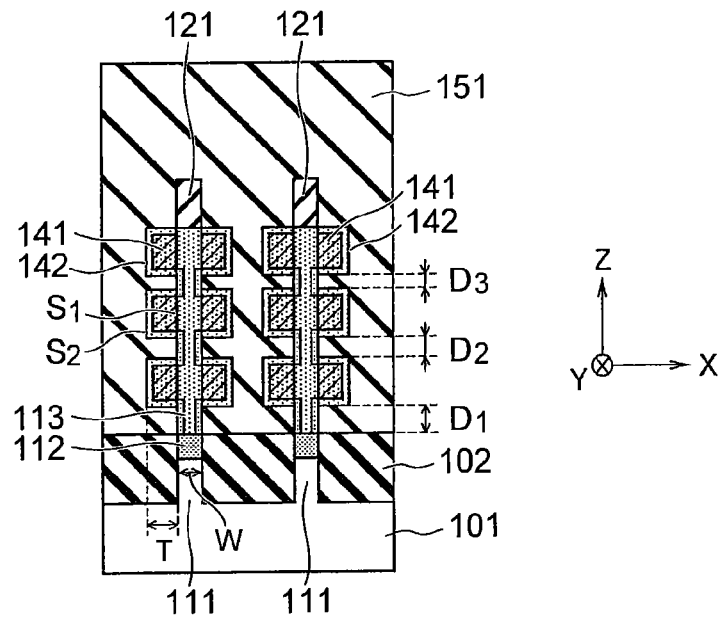

In the present embodiment, a structure of FIGS. 31A to 31C or FIGS. 32A to 32C may be adopted instead of the structure of FIGS. 1A to 1C. FIGS. 31A to 32C are plan views and sectional views showing the structures of the semiconductor device of modifications of the first embodiment. In FIGS. 31A to 31C, the spacings "$D_1$" to "$D_3$" is set to satisfy $D_1<D_2<D_3$. In FIGS. 32A to 32C, the epitaxial layers 141 has rectangular sectional shapes as a result that the plane orientation of the side surfaces $S_1$ is set to be a plane other than a (110) plane.

(Second Embodiment)

Figure 33A:
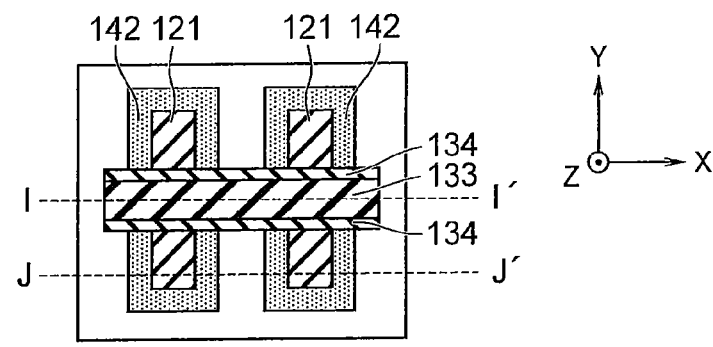
FIGS. 33A to 33C are a plan view and sectional views showing a structure of a semiconductor device of a second embodiment.
Figure 33B:
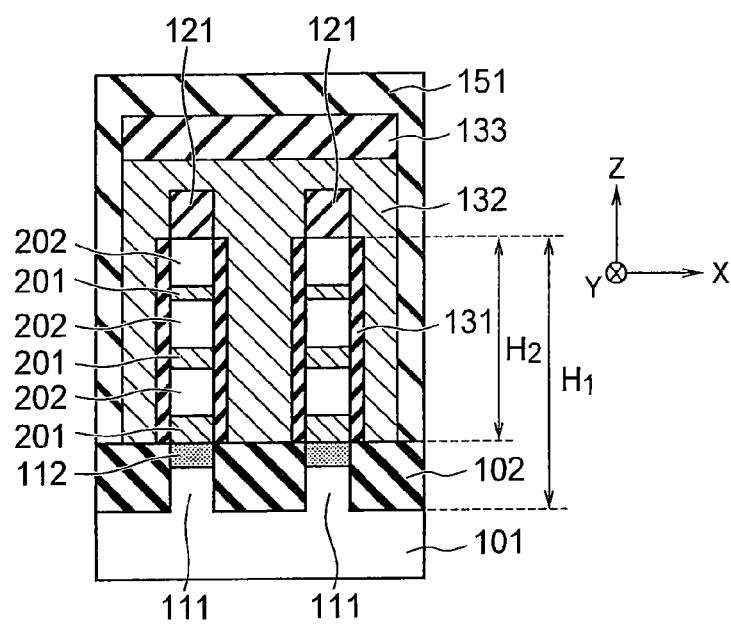
Figure 33C:
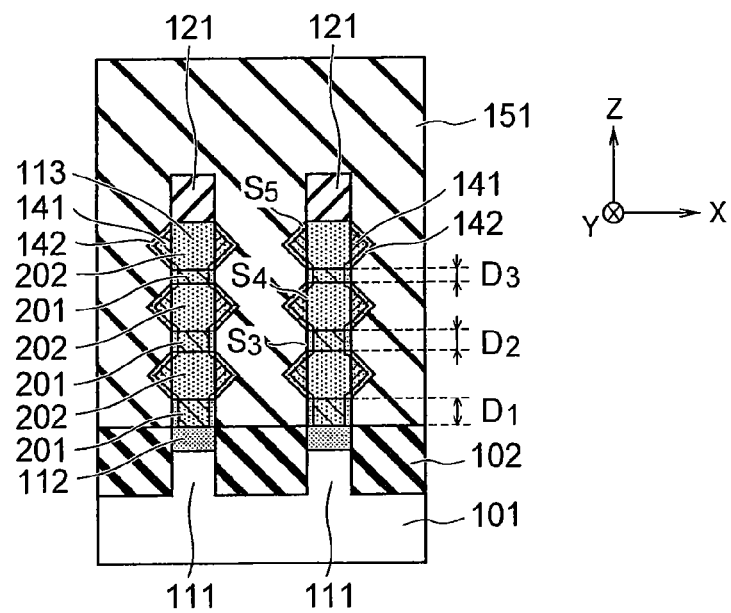

FIGS. 33A to 33C are a plan view and sectional views showing a structure of a semiconductor device of a second embodiment.

Each fin 111 in the present embodiment includes a protruding portion of the semiconductor substrate 101, and one or more SiGe (silicon germanium) layers 201 and one or more Si (silicon) layers 202 alternately stacked on the protruding portion. The SiGe layers 201 are an example of first layers formed of first material (first semiconductor material). The Si layers 202 are an example of second layers formed of second material (second semiconductor material) different from the first material.

Reference characters $S_3$ and $S_4$ denote side surfaces of the SiGe layers 201 and the Si layers 202, respectively. The side surfaces $S_3$ and $S_4$ are (110) planes.

According to such a stack fin structure, a stress in the Y direction (i.e. a stress parallel to the S/D direction) can be applied to the channel regions in the fins 111. For example, in the n-type fin FET with Si channels in which the thickness of the Si layers 202 is sufficiently larger the thickness of the SiGe layer 201, a tensile stress in the Y direction is applied to the Si channels of the (110) side surfaces, so that the electron mobility in the channels can be further improved.

Each side surface of the fins 111 in the present embodiment includes a side surface of the protruding portion, three side surfaces $S_3$ of the SiGe layers 201, and three side surfaces $S_4$ of the Si layers 202. Each side surface $S_4$ is provided with one epitaxial layer 141. Therefore, three epitaxial layers 141 are formed on each side surface of the fins 111 in order along the Z direction in the present embodiment, similarly to the first embodiment. Therefore, according to the present embodiment, surface areas of the epitaxial layers 141 can be secured to be large while a short between the adjacent fins 111 can be avoided.

Reference character $S_5$ denotes facet surfaces of the epitaxial layers 141. The facet surfaces $S_5$ are (111) planes. The silicide layers 142 in the present embodiment are formed in the vicinity of the facet surfaces $S_5$ in the epitaxial layers 141 and on the surfaces of the SiGe layers 201.

The thicknesses of the SiGe layers 201 in the present embodiment are set to be thinner than the thicknesses of the Si layers 202. The thicknesses of the SiGe layers 201 correspond to the above described spacings "$D_1$" to "$D_3$". Therefore, the thicknesses of the SiGe layers 201 decrease as the heights of the SiGe layers 201 increase.

Although each fin 111 in the present embodiment includes three SiGe layers 201 and three Si layers 202, each fin 111 may include two or at least four SiGe layers 201 and two or at least four Si layers 202.

(1) Method of Manufacturing Semiconductor Device of Second Embodiment

A method of manufacturing the semiconductor device of the second embodiment will be described with reference to FIGS. 34A to 37B.

FIGS. 34A to 37B are sectional views showing the method of manufacturing the semiconductor device of the second embodiment.

Figure 34A:
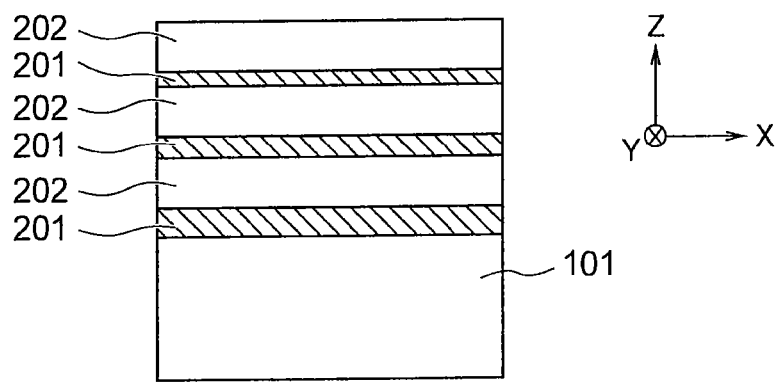
FIGS. 34A to 37B are sectional views showing a method of manufacturing the semiconductor device of the second embodiment.
Figure 34B:
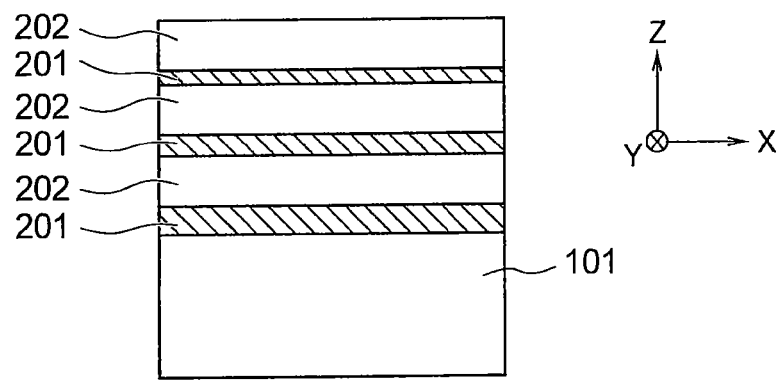

First, as shown in FIGS. 34A and 34B, one or more SiGe layers 201 and one or more Si layers 202 are alternately stacked on the semiconductor substrate 101.

Figure 35A:
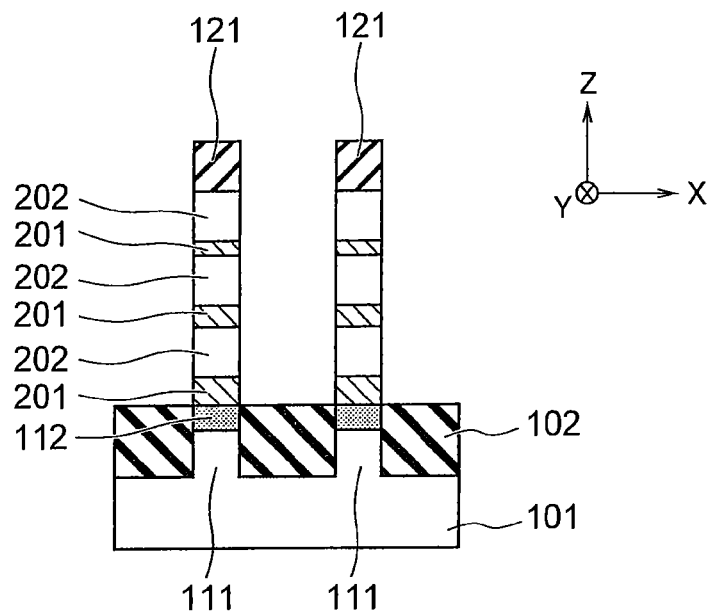
Figure 35B:
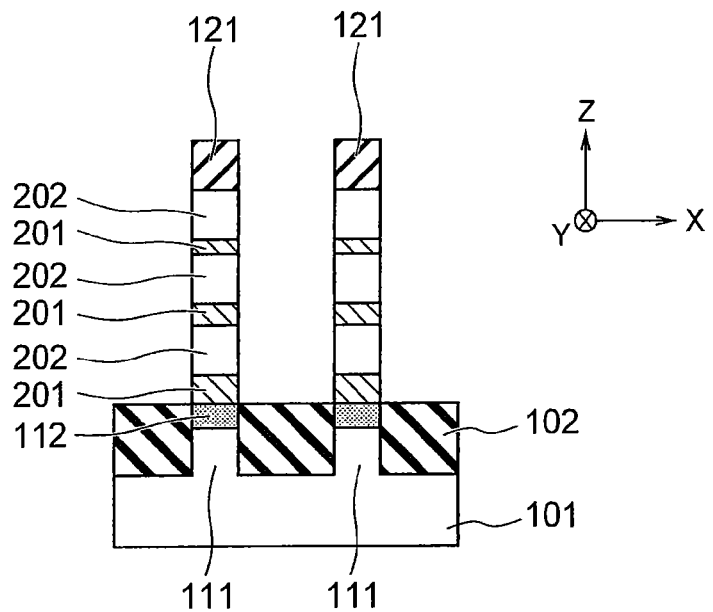

The steps of FIGS. 4A to 8B are then performed to form the fins 111 on the surface of the semiconductor substrate 101, form the isolation insulators 102 between the fins 111, and form the punch through stopper diffusion layers 112 in the bottom regions of the fins 111 between the isolation insulators 102. As a result, a structure shown in FIGS. 35A and 35B is obtained.

Figure 36A:
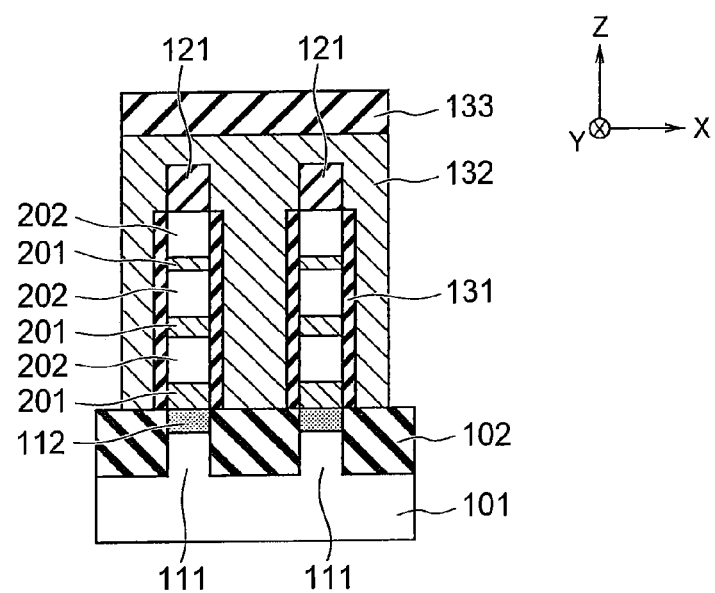
Figure 36B:
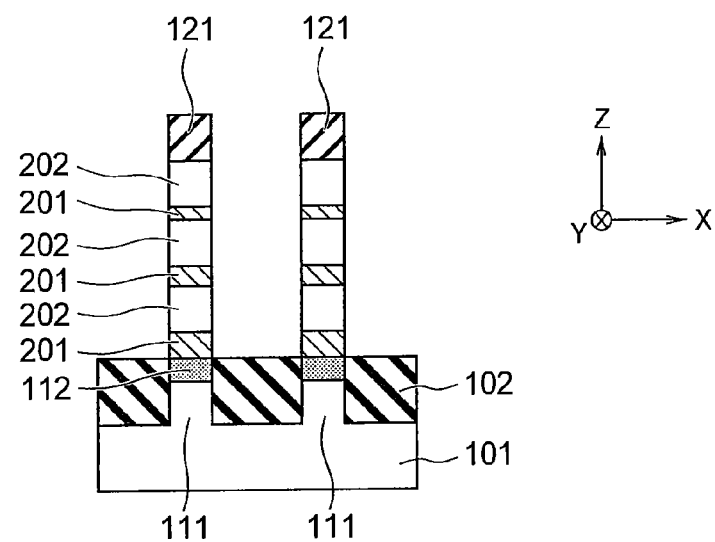

The steps of FIG. 9A to FIG. 12B are then performed to form the gate electrode 132 on the side surfaces and the upper surfaces of the fins 111 via the gate insulators 131 and the hard mask layers 121. As a result, a structure shown in FIGS. 36A to 36B is obtained.

Figure 37A:
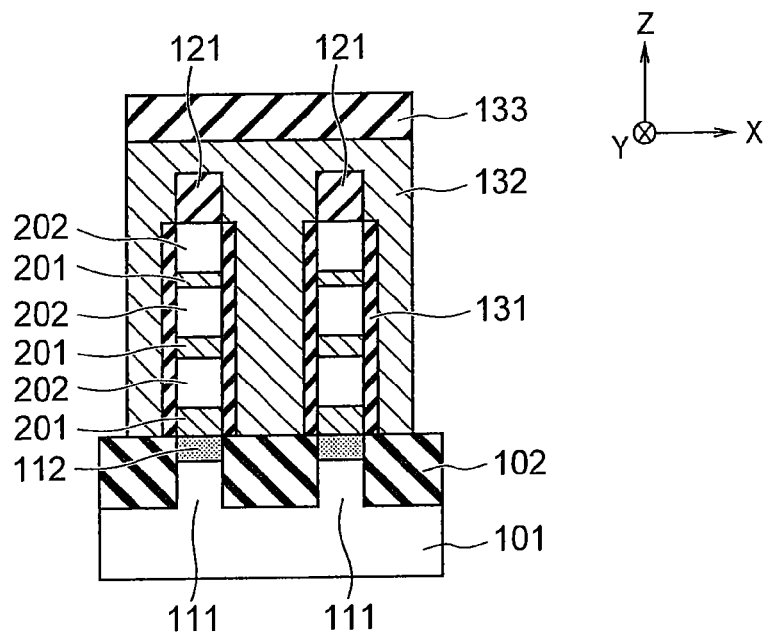
Figure 37B:
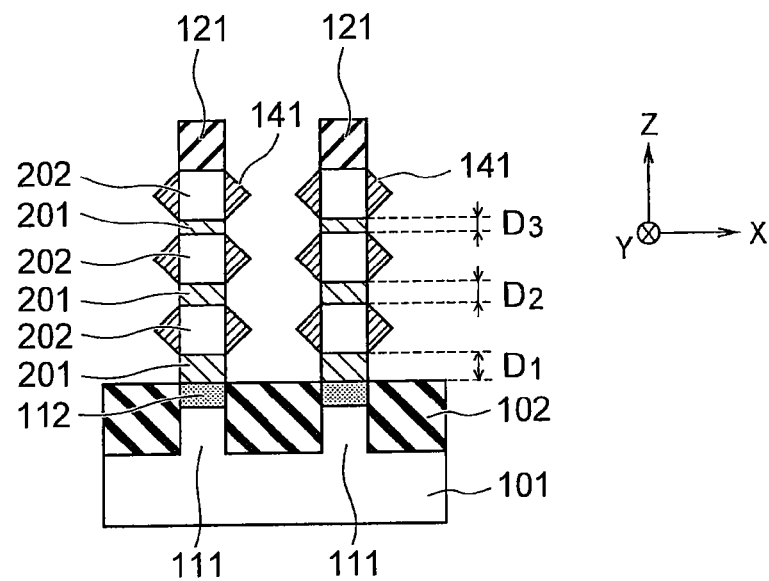

After the steps of FIGS. 13A to 15B are performed, the epitaxial layers 141 are formed on the side surfaces of the fins 111 by SEG (FIGS. 37A and 37B).

The speed at which the epitaxial Si layers grows on the surfaces of the Si layers 202 and the speed at which the epitaxial Si layers grows on the surfaces of the SiGe layers 201 can be made different by using the difference of the lattice constants of Si and SiGe. More specifically, the growth speed on the surfaces of the Si layers 202 can be made higher than the growth speed on the surfaces of the SiGe layers 201. For example, as the Ge concentration in the SiGe layers 201 is higher, the difference between those growth speeds can be made larger.

Therefore, in the step of FIGS. 37A and 37B, the epitaxial layers 141 are selectively formed on the side surfaces $S_4$ of the Si layers 202. As a result, three epitaxial layers 141 are formed on each side surface of the fins 111 in order along the Z direction.

The steps of FIGS. 29A to 30B are then performed to form the S/D diffusion layers 113 and the silicide layers 142, and thereafter the interlayer dielectric 151 is formed on the entire surface of the semiconductor substrate 101. Thereafter, the processes of forming various contact plugs, via plugs, interconnect layers, interlayer dielectrics and the like are carried out in the present embodiment. In this manner, the semiconductor device of FIGS. 33A to 33C is manufactured.

Figure 38A:
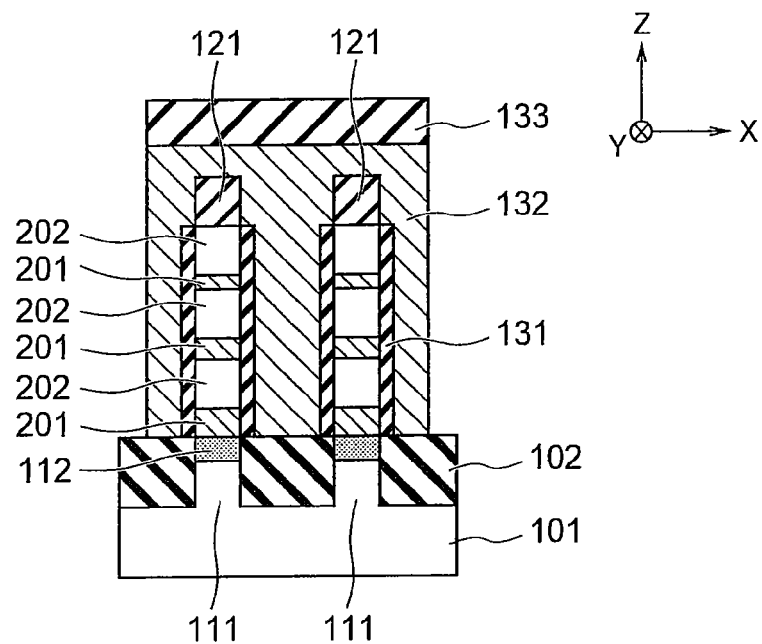
FIGS. 38A and 38B are sectional views showing details of the method of manufacturing the semiconductor device of the second embodiment.
Figure 38B:
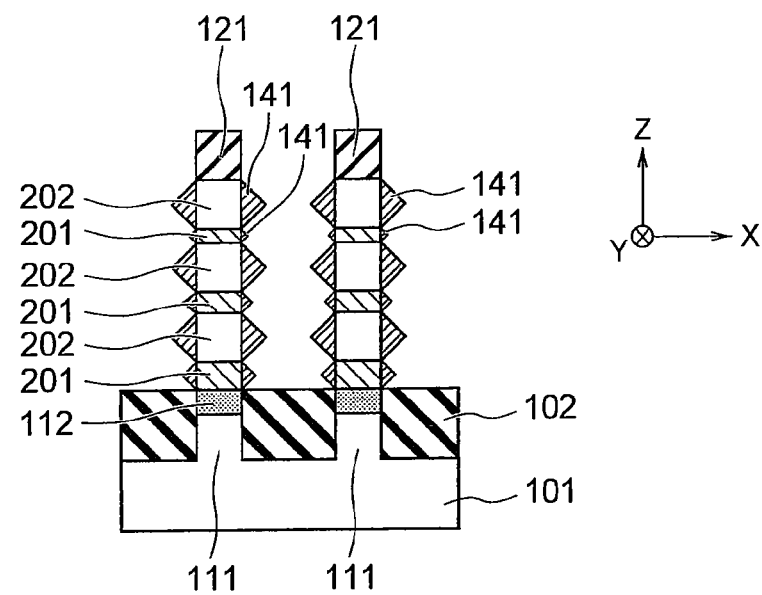

In the step of FIGS. 37A and 37B, the epitaxial Si layers slightly grow even on the surfaces of the SiGe layers 201. Therefore, as shown in FIGS. 38A and 38B, the small epitaxial layers 141 are also formed on the respective side surfaces $S_3$ of the SiGe layers 201. FIGS. 38A and 38B are sectional views showing details of the method of manufacturing the semiconductor device of the second embodiment. It should be noted that the sizes of the epitaxial layers 141 reflect the thicknesses "$D_1$" to "$D_3$" of the SiGe layers 201. The silicide layers 142 are also formed in the small epitaxial layers 141 by the following siliciding step.

(2) Effect of Second Embodiment

Finally, an effect of the second embodiment will be described.

As described above, the epitaxial layers 141 in the present embodiment are formed on the side surfaces $S_4$ of the respective Si layers 202 so that the spacings "$D_1$" to "$D_3$" change in accordance with the positions of the gaps in the Z direction. In addition, the fin FET in the present embodiment is covered with the interlayer dielectric 151 which applies a stress to the epitaxial layers 141.

Therefore, according to the present embodiment, when the interlayer dielectric 151 with a favorable embedding property is adopted, the interlayer dielectric 151 can be embedded even if the spacings "$D_1$" to "$D_3$" are narrow, similarly to the first embodiment. Therefore, according to the present embodiment, the carrier mobility of the fin FET can be improved even if the semiconductor device is highly integrated.

In addition, the carrier mobility in the channel regions in the present embodiment can be improved by adopting the stack fin structure. This is due to partially using SiGe which is high mobility material for the channels, and applying a stress to the Si channels and SiGe channels by the Si/SiGe stack structure. According to the present embodiment, a plurality of epitaxial layers 141 can be formed on each side surface of the fins 111 by epitaxial growth processing at one time by adopting the stacked fin structure.

Conversely, the first embodiment has the advantage that the processing of alternately stacking the SiGe layers 201 and the Si layers 202 is not required.

(Third Embodiment)

Figure 39A:
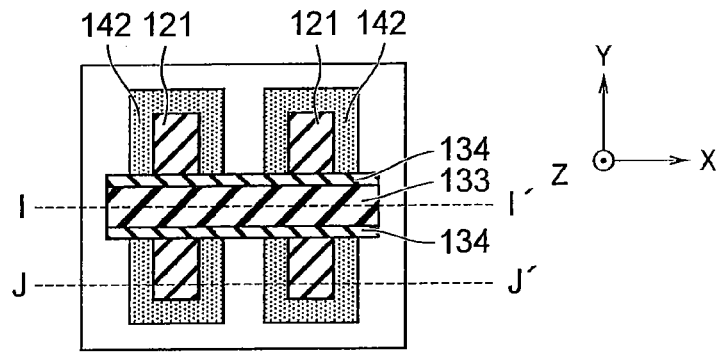
FIGS. 39A to 39C are a plan view and sectional views showing a structure of a semiconductor device of a third embodiment.
Figure 39B:
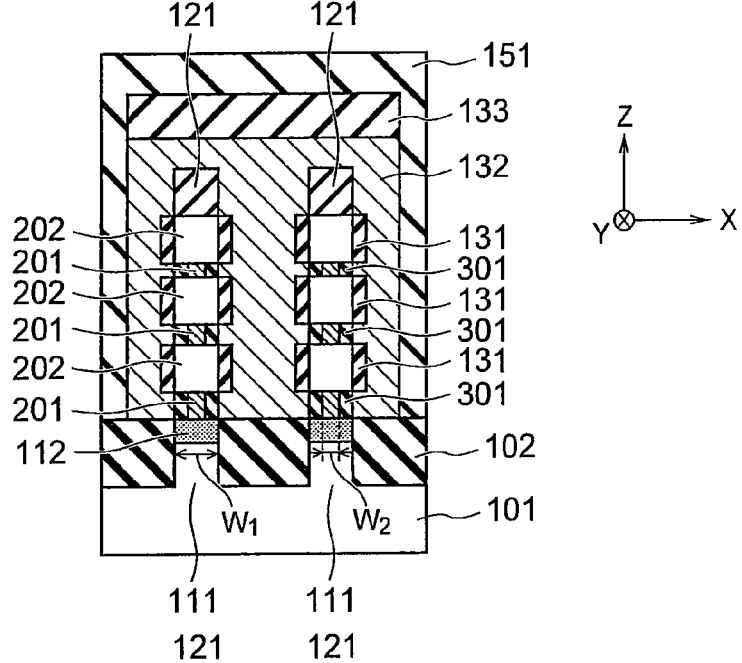
Figure 39C:
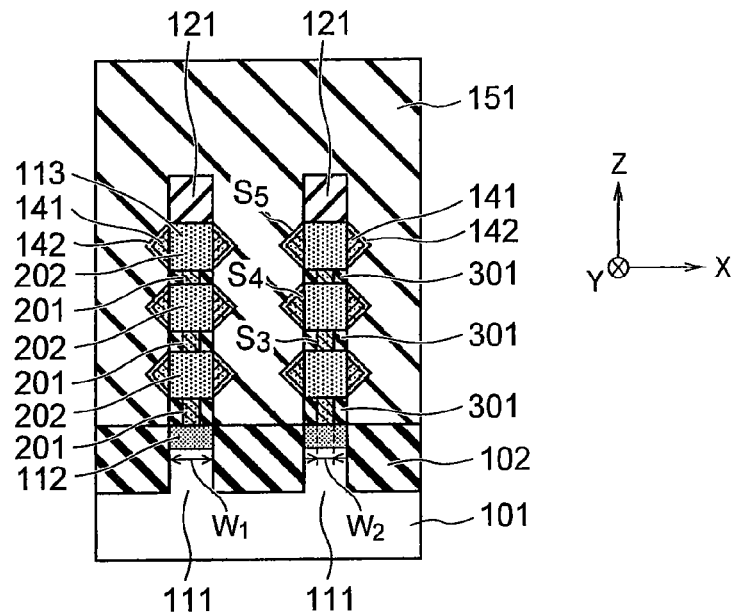

FIGS. 39A to 39C are a plan view and sectional views showing a structure of a semiconductor device of a third embodiment.

Each fin 111 of the present embodiment includes a protruding portion of the semiconductor substrate 101, and one or more SiGe layers 201 and one or more Si layers 202 alternately stacked on the protruding portion, similarly to the second embodiment.

However, the side surfaces $S_3$ of the SiGe layers 201 are recessed with respect to the side surfaces $S_4$ of the Si layers 202 in the fins 111 of the present embodiment. In addition, insulators 301 are embedded in regions where the SiGe layers 201 are recessed in the fins 111 of the present embodiment. The insulators 301 are, for example, silicon nitride layers.

Reference character $W_1$ denotes the X-directional width of the Si layers 202, and reference character "$W_2$" denotes the X-directional width of the SiGe layers 201. The width "$W_2$" is smaller than the width "$W_1$" in the present embodiment ($W_2 < W_1$).

The insulators 301 and the Si and SiGe channels in the present embodiment are in contact with each other. In the present embodiment, a stress can be directly applied to the channel regions by using a film stress of the insulator 301, so that the transistor can be further enhanced in performance.

The gate insulators 131 in the present embodiment are formed on only the side surfaces $S_4$ among the side surfaces $S_3$ and $S_4$. This is due to the fact that the side surfaces $S_3$ are protected by the insulators 301 when the gate insulators 131 are formed by thermal oxidation, so that the side surfaces $S_3$ are not oxidized. Since SiGe is easily oxidized as compared with Si, the protection of the side surfaces $S_3$ by the insulators 301 is effective. Since the side surfaces $S_3$ are protected by the insulators 301, the epitaxial layers 141 are not formed on the side surfaces $S_3$.

(1) Method of Manufacturing Semiconductor Device of Third Embodiment

A method of manufacturing the semiconductor device of the third embodiment will be described with reference to FIGS. 40A to 43B.

FIGS. 40A to 43B are sectional views showing the method of manufacturing the semiconductor device of the third embodiment.

Figure 40A:
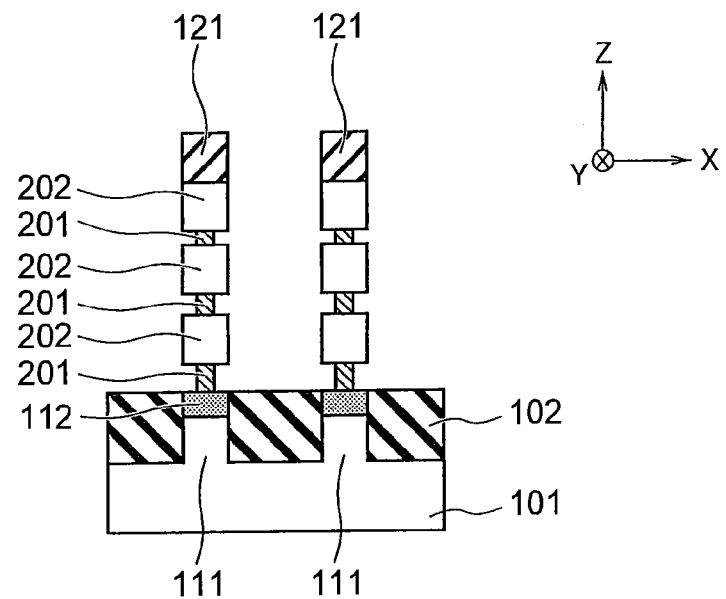
FIGS. 40A to 43B are sectional views showing a method of manufacturing the semiconductor device of the third embodiment.
Figure 40B:
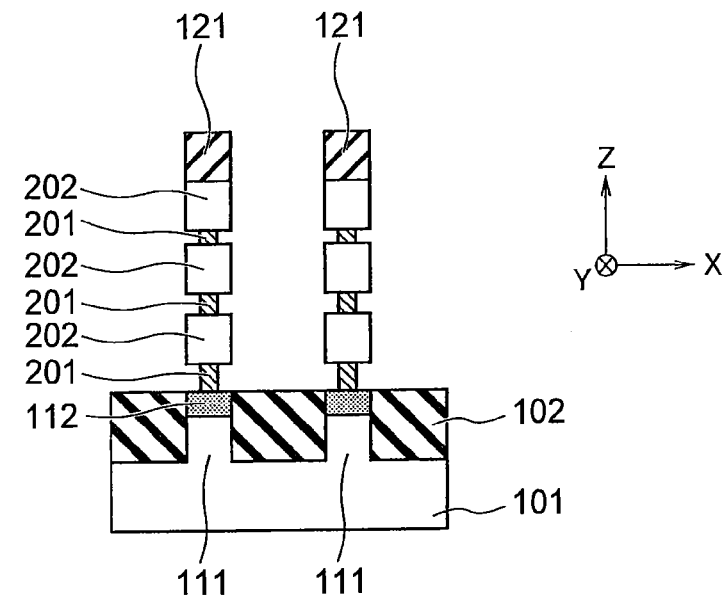

First, after the structure shown in FIGS. 35A and 35B is obtained, the SiGe layers 201 are selectively etched by wet etching (FIGS. 40A and 40B). As a result, the side surfaces $S_3$ of the SiGe layers 201 are recessed with respect to the side surfaces $S_4$ of the Si layers 202.

Figure 41A:
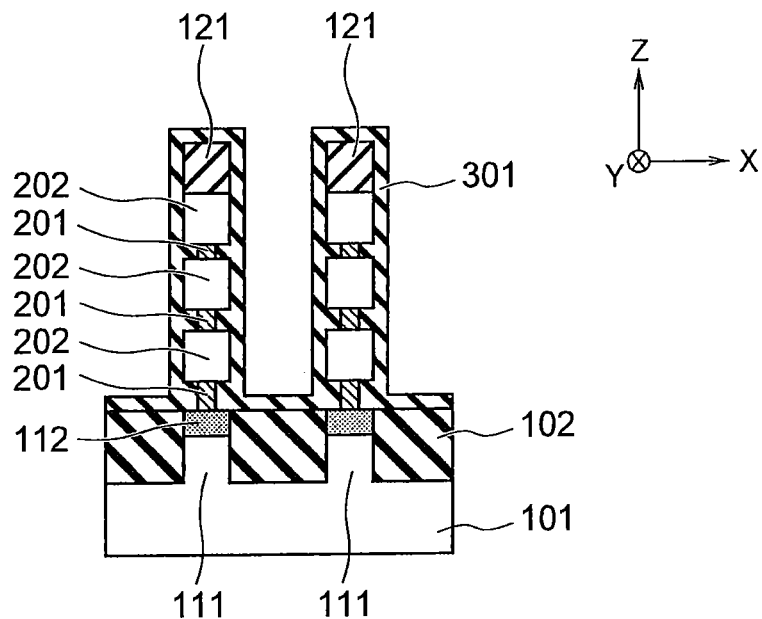
Figure 41B:
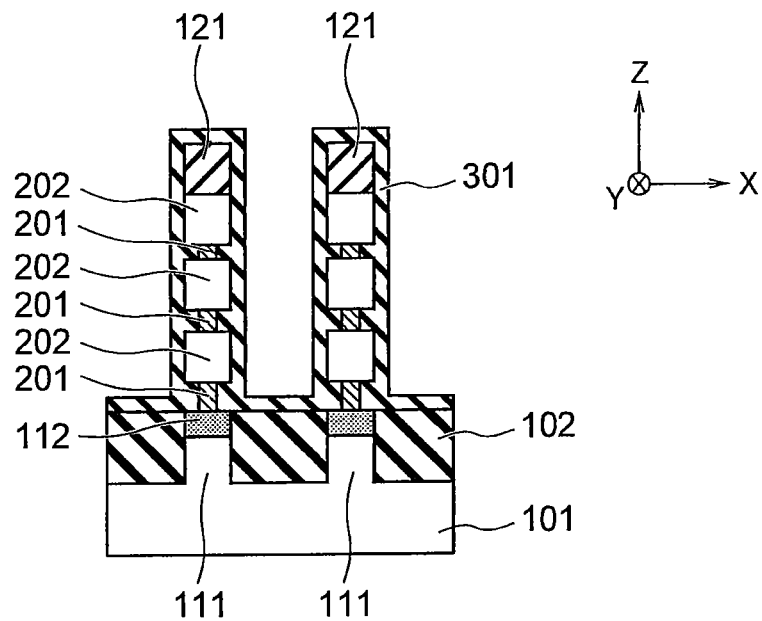

As shown in FIGS. 41A and 41B, an insulator 301 is then deposited on the entire surface of the semiconductor substrate 101. As a result, the surfaces of the isolation insulators 102, the fins 111, and the hard mask layers 121 are covered with the insulator 301.

Figure 42A:
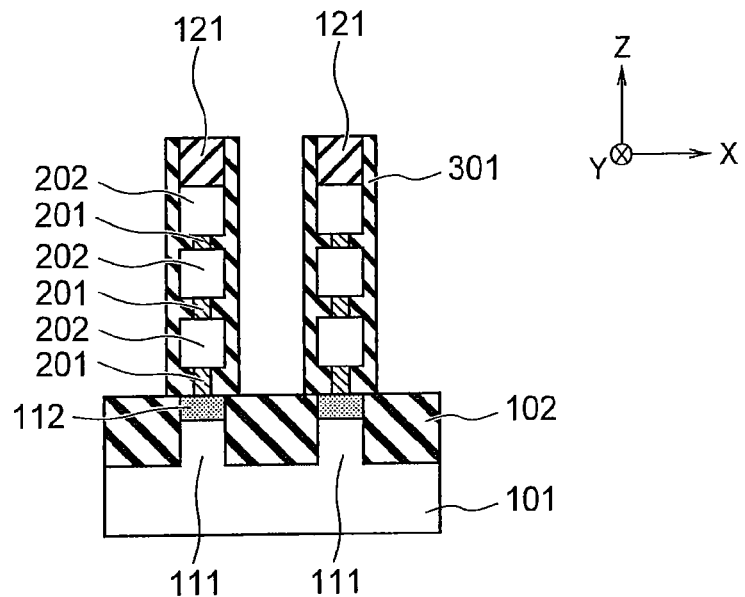
Figure 42B:
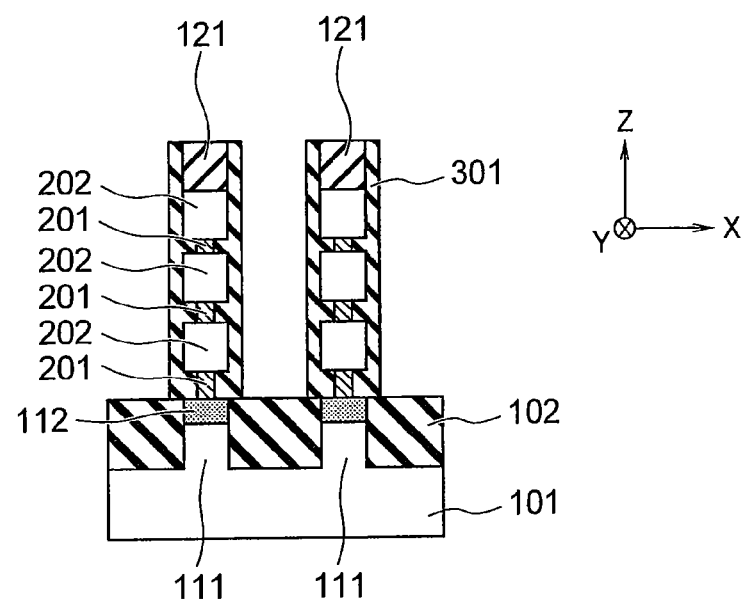

As shown in FIGS. 42A and 42B, the insulator 301 formed on the surfaces other than the side surfaces of the fins 111 and the hard mask layers 121 are then removed by RIE.

Figure 43A:
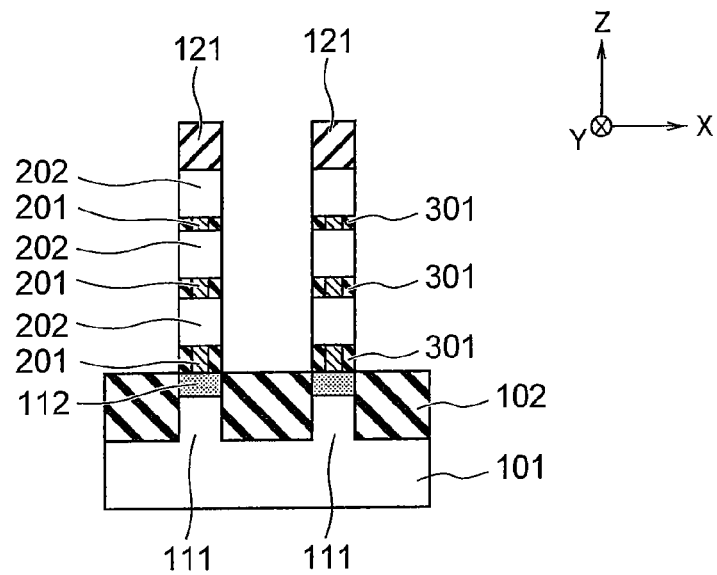
Figure 43B:
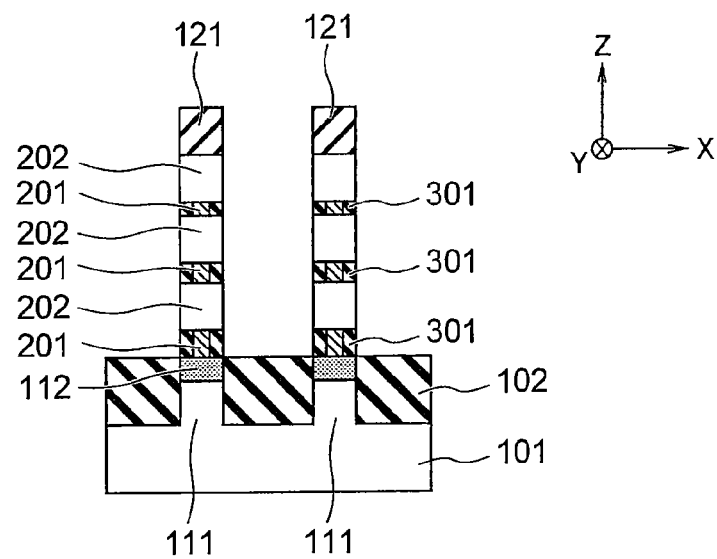

As shown in FIGS. 43A and 43B, the insulators 301 formed in the regions other than the recessed regions of the SiGe layers 201 are then removed. In this manner, the structure in which the insulators 301 are embedded in the above described recessed portions is realized.

Thereafter, the steps after FIGS. 36A and 36B are carried out similarly to the second embodiment. Furthermore, processes of forming various contact plugs, via plugs, interconnect layers, interlayer dielectrics and the like are carried out in the present embodiment. In this manner, the semiconductor device in FIGS. 39A to 39C is manufactured.

Figure 44A:
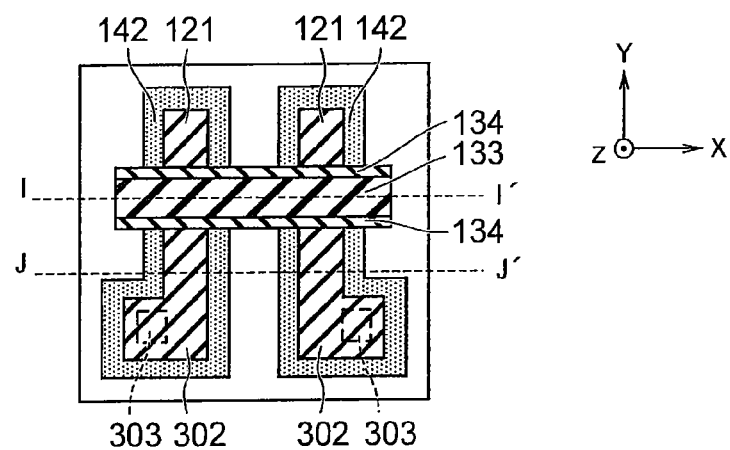
FIGS. 44A to 44C are a plan view and sectional views showing a structure of a semiconductor device of a modification of the third embodiment.
Figure 44B:
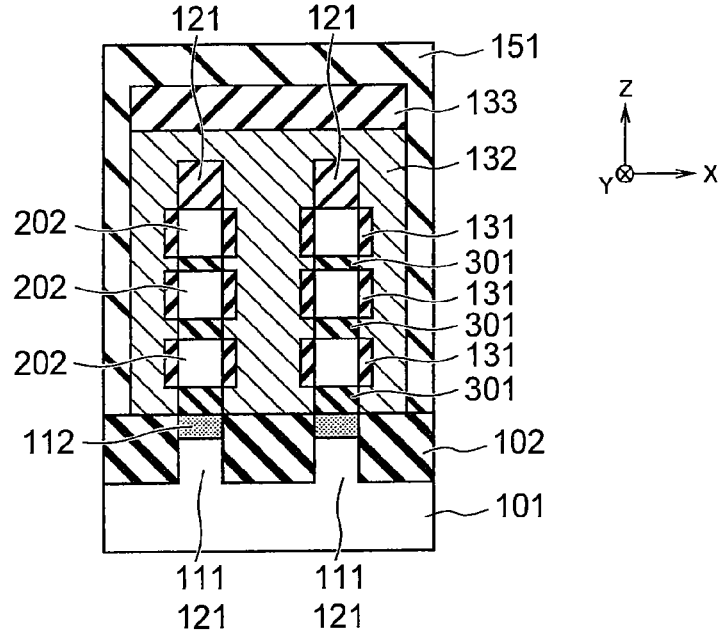
Figure 44C:
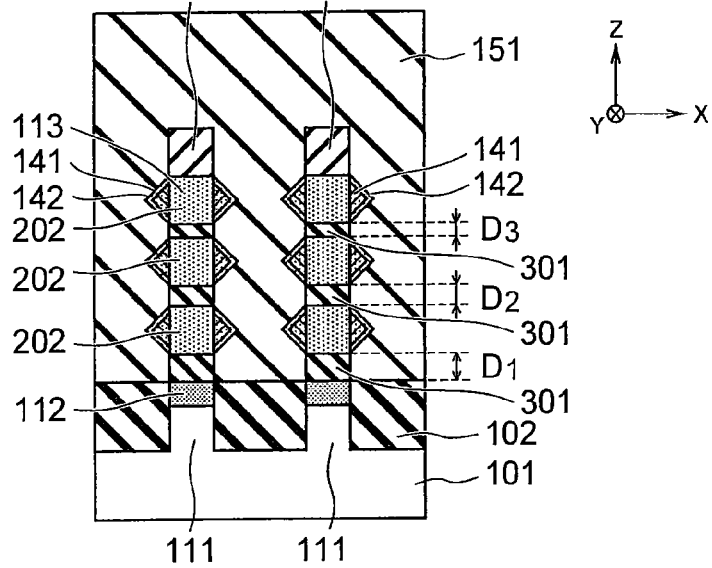

In the step of FIGS. 40A and 40B, the SiGe layers 201 in each fin 111 may be completely removed. In this case, a structure shown in FIGS. 44A to 44C is finally realized. FIGS. 44A to 44C are a plan view and sectional views showing the structure of the semiconductor device of a modification of the third embodiment. Each fin 111 of FIGS. 44A to 44C includes a protruding portion of the semiconductor substrate 101, and one or more insulators 301 and one or more Si layers 202 alternately stacked on the protruding portion. The insulators 301 is an example of the first layers formed of first material (insulating material). The Si layers 202 are an example of the second layers formed of second material (semiconductor material) different from the first material. In this way, according to the present modification, the Si layers 202 in each fin 111 can be processed to be nanowires.

In the present modification, pad portions 302 are formed at tip portions of each fin 111 when the fins 111 are formed. Furthermore, the X-directional width and the Y-directional width of the pad portions 302 are set to be larger than the x-directional width $W_1$ of the fins 111. This makes it possible to perform the step of FIGS. 40A and 40B so that the SiGe layers 201 in the fins 111 are completely removed and the SiGe layers 201 in the pad portions 302 partially remain. Reference character 303 shown in FIG. 44A denotes regions where the SiGe layers 201 remain. In the present modification, the fins 111 are formed to include the pad portions 302 having the SiGe remaining regions 303, so that the Si layers 202 can be supported by the pad portions 302 after the removal of the SiGe layers 201.

Although each fin 111 in the present modification is provided with a pad portion 302 at one tip portion, each fin 111 may be provided with pad portions 302 at both tip portions.

Since the semiconductor substrate 101 and the Si layers 202 are insulated with one another by the insulators 301 in the present modification, the punch through stopper layers 112 do not have to be provided in the fins 111.

The insulators 301 in the present modification may be replaced with the interlayer dielectric 151. In order to obtain this structure, after the epitaxial layers 141 are formed on the fins 111, the insulators 301 are completely removed. Then, the interlayer dielectric 151 is formed on the entire surface of the semiconductor substrate 101, so that the interlayer dielectric 151 is embedded in the regions where the insulators 301 are removed.

(2) Effect of Third Embodiment

An effect of the third embodiment will be described finally.

As described above, the epitaxial layers 141 in the present embodiment are formed on the side surfaces $S_4$ of the respective Si layers 202 so that the spacings $D_1$ to $D_3$ change in accordance with the positions of the gaps in the Z direction. In addition, the fin FET in the present embodiment is covered with the interlayer dielectric 151 which applies a stress to the epitaxial layers 141.

Therefore, according to the present embodiment, when the interlayer dielectric 151 with a favorable embedding property is adopted, the interlayer dielectric 151 can be embedded even if the spacings "$D_1$" to "$D_3$" are narrow, similarly to the first embodiment. Therefore, according to the present embodiment, the carrier mobility of the fin FET can be improved even if the semiconductor device is highly integrated.

Furthermore, the side surfaces $S_3$ of the SiGe layers 201 are recessed with respect to the side surfaces $S_4$ of the Si layers 202 in the present embodiment, and the insulators 301 are embedded in the regions where the side surfaces $S_3$ are recessed. The insulators 301 are in contact with the Si and SiGe channels. In the present embodiment, a stress is applied to the channels by using the film stress of the insulators 301, so that the transistor can be further enhanced in performance. Furthermore, if the insulators 301 are replaced with the interlayer dielectric 151, the volumes of the interlayer dielectric 151 embedded between the stacked fins increase, and the stress which is applied in the vertical direction of the stacked fins from the interlayer dielectric 151 increases. As a result, the film stress from the interlayer dielectric 151 is more effectively applied to the channels, so that the channel mobility can be improved.

Meanwhile, when the SiGe layers 201 are completely removed and therefore the channels are formed of only the Si layers 202, the Si channels have nanowire structures. In the nanowire FET, the carrier electric conduction in the channels is one-dimensional conduction. Therefore, the nanowire FET has an advantage that the ballistic conductivity of the transistor increases and the performance is improved.

(Fourth Embodiment)

Figure 45A:
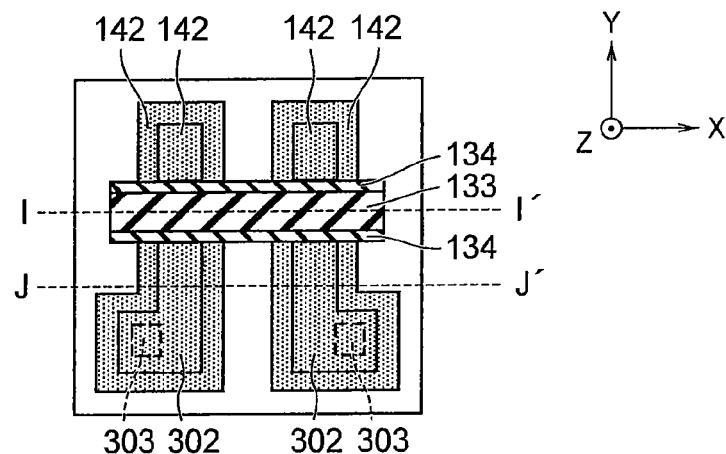
FIGS. 45A to 45C are a plan view and sectional views showing a structure of a semiconductor device of a fourth embodiment.
Figure 45B:
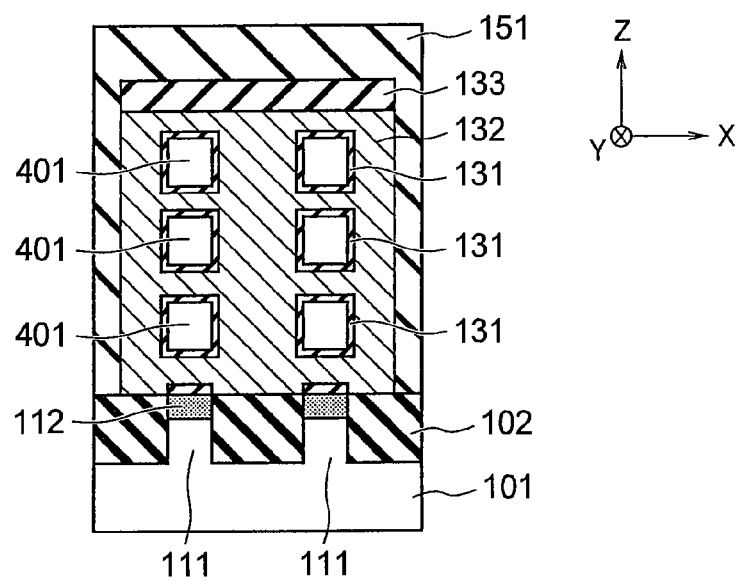
Figure 45C:
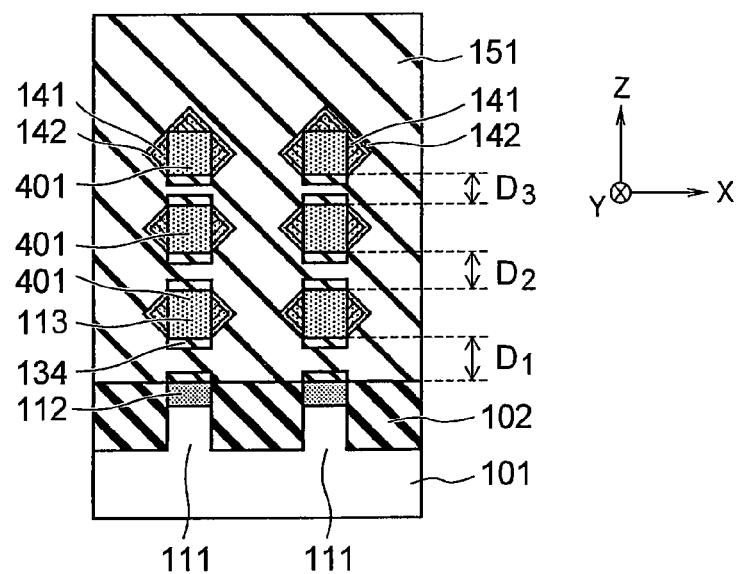

FIGS. 45A to 45C are a plan view and sectional views showing a structure of a semiconductor device of a fourth embodiment.

In the present embodiment, a plurality of nanowires 401 are stacked apart from each other on each fin 111 of the semiconductor substrate 101. Each nanowire 401 has a shape of a wire extending in the Y direction. The nanowires 401 are an example of wire layers of the present disclosure. The nanowires 401 of the present embodiment are, for example, semiconductor layers such as silicon layers.

The semiconductor device of the present embodiment further includes a plurality of gate insulators 131 formed on upper surfaces, lower surfaces and side surfaces of the respective nanowires 401, and the gate electrode 132 formed on the upper surfaces, the lower surfaces and the side surfaces of the nanowires 401 via the gate insulators 131.

In this manner, the nanowire FET of the present embodiment has a gate all around structure in which each nanowire 401 is surrounded by a gate insulator 131 and the gate electrode 132. Therefore, according to the present embodiment, the nanowire FET which has better short channel effect immunity than the third embodiment and the modification thereof can be provided.

The semiconductor device of the present embodiment further includes a plurality of epitaxial layers 141 formed on the side surfaces of the respective nanowires 401, and the interlayer dielectric 151 formed on the semiconductor substrate 101 to cover those nanowires 401. The gaps "$D_1$" to "$D_3$" are set to satisfy $D_1 \geq D_2 \geq D_3$, but may be set to satisfy $D_1 \leq D_2 \leq D_3$.

(1) Method of Manufacturing Semiconductor Device of Fourth Embodiment

A method of manufacturing the semiconductor device of the fourth embodiment will be described with reference to FIGS. 46A to 54B.

FIGS. 46A to 54B are sectional views showing the method of manufacturing the semiconductor device of the fourth embodiment.

Figure 46A:
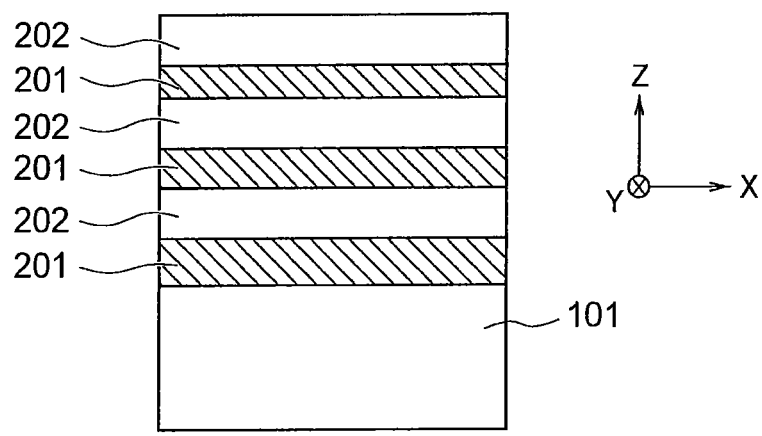
Figure 46B:
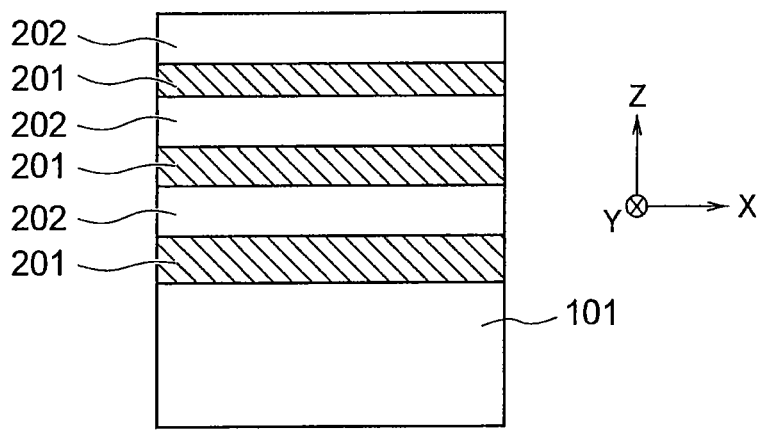

First, as shown in FIGS. 46A and 46B, one or more SiGe layers 201 and one or more Si layers 202 are alternately stacked on the semiconductor device 101. At this time, the thicknesses of those SiGe layers 201 are set to "$D_1$", "$D_2$" and "$D_3$" in a case where the semiconductor device having the structure of FIGS. 45A to 45C is manufactured.

Figure 47A:
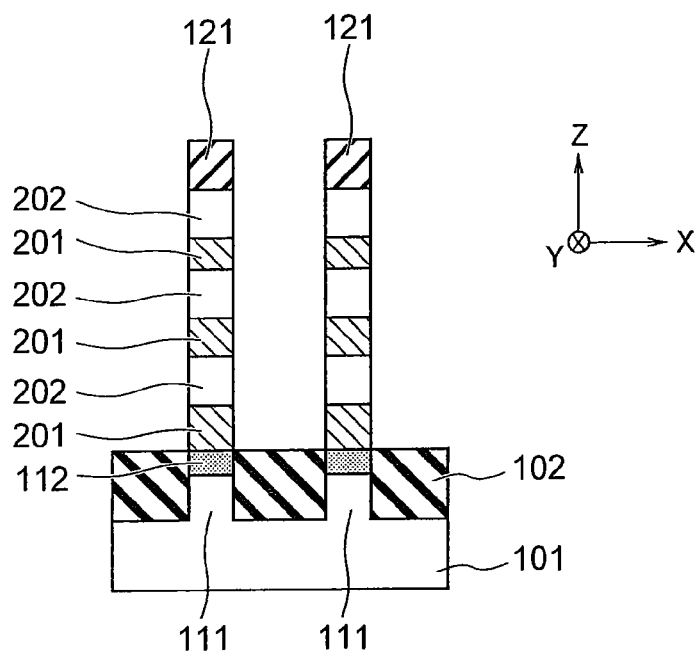
Figure 47B:
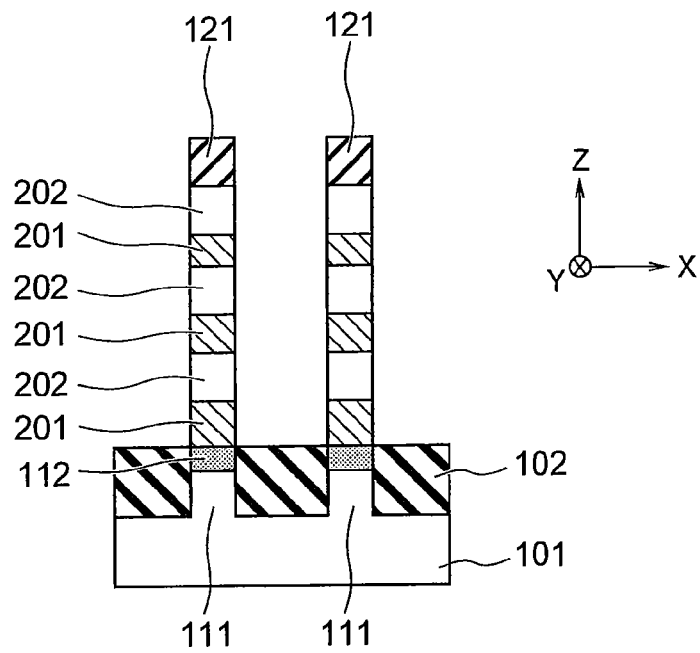

The steps of FIGS. 4A to 8B is then performed to form the fins 111 on the surface of the semiconductor substrate 101, form the isolation insulators 102 between the fins 111, and form the punch through stopper diffusion layers 112 in the bottom regions of the fins 111 between the isolation insulators 102. As a result, a structure shown in FIGS. 47A and 47B is obtained.

Figure 48A:
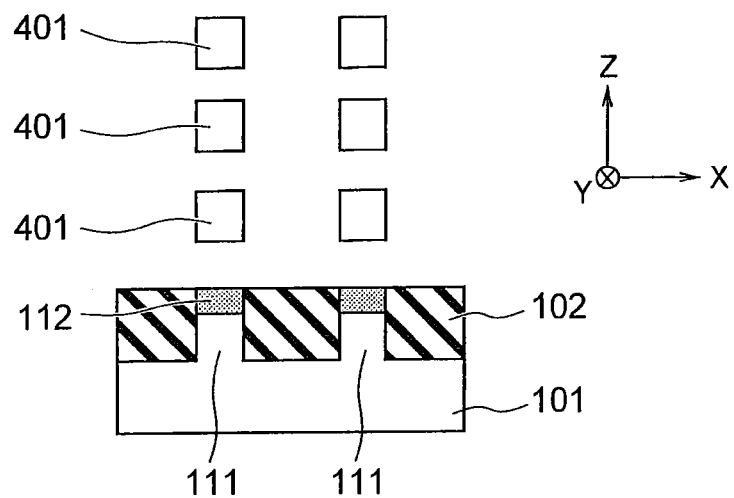
Figure 48B:
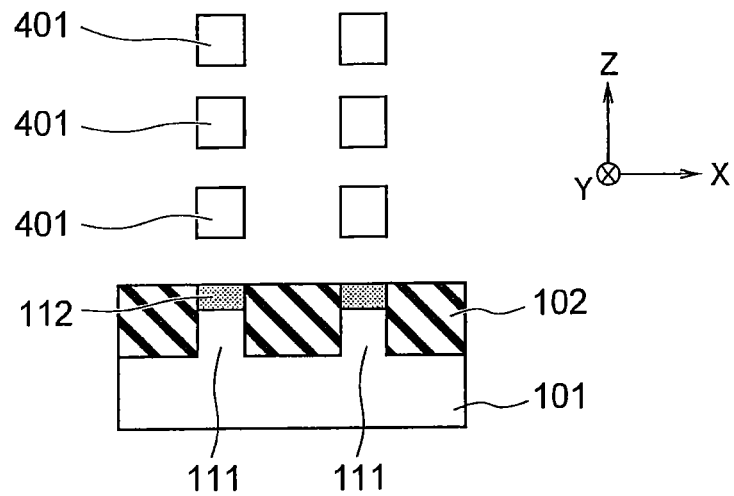

After the hard mask layers 121 are removed, the SiGe layers 201 are removed by selective etching. As a result, the nanowires 401 formed of the Si layers 202 are formed (FIGS. 48A and 48B). In the selective etching, the SiGe layers 201 in the SiGe remaining regions 303 are allowed to remain.

The steps of FIGS. 9A to 10B are then performed to form insulators 131 to be the gate insulators 131 on the surfaces of the semiconductor substrate 101 and the nanowires 401, and thereafter an electrode material 132 to be the gate electrode 132 and the cap layer 133 are sequentially deposited on the entire surface of the semiconductor substrate 101. As a result, a structure shown in FIGS. 49A and 49B is obtained.

Figure 50A:
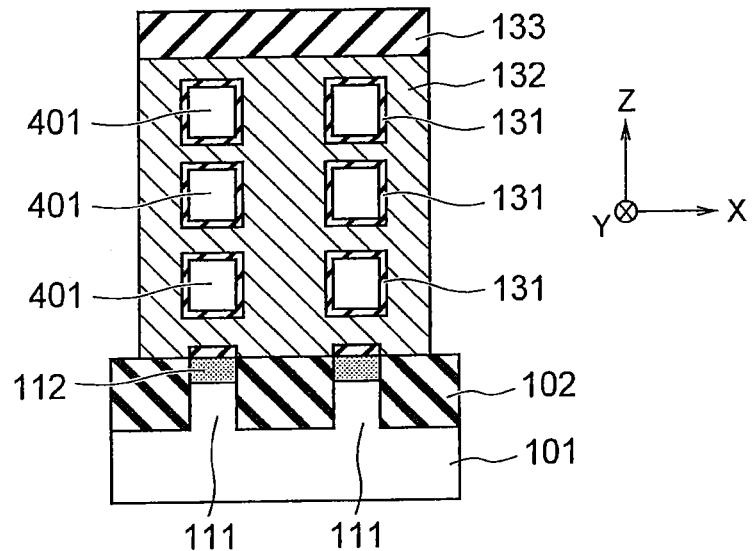
Figure 50B:
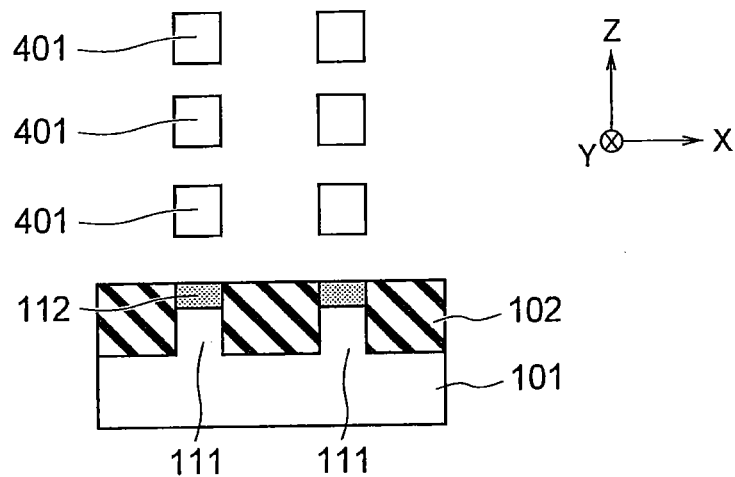

The steps of FIGS. 11A to 12B are then performed to process the electrode material 132 and the insulators 131 into the gate electrode 132 and the gate insulators 131, respectively. As a result, a structure shown in FIGS. 50A and 50B is obtained. It should be noted that the electrode material 132 and the insulators 131 are removed in FIG. 50B.

Figure 51A:
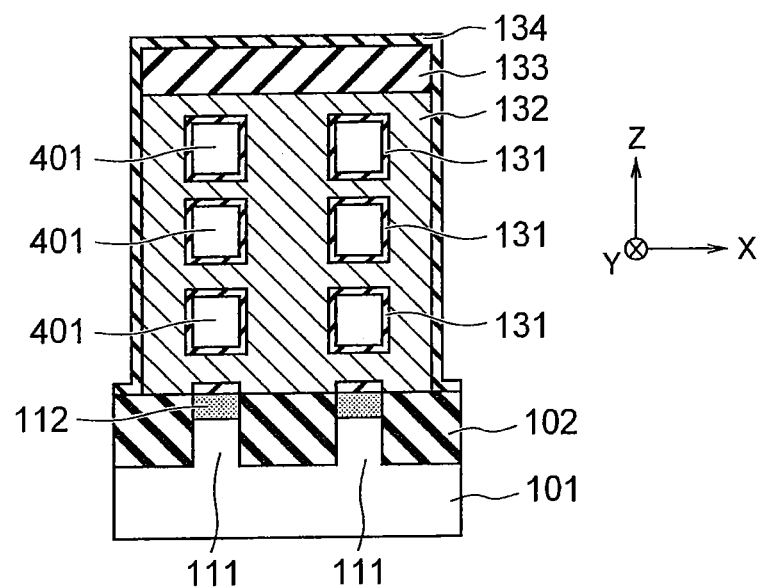
Figure 51B:
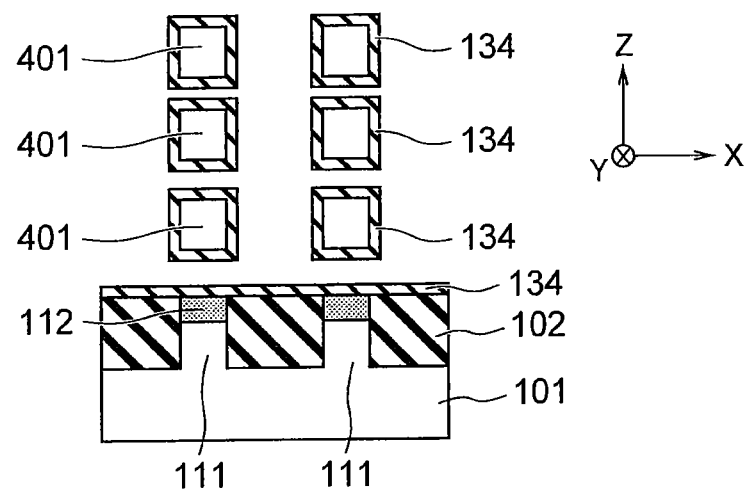

The sidewall insulators 134 are then formed to surround the the nanowires 401 in the S/D regions, and on the X and Y directional side surfaces of the gate electrode 132 and the cap layer 133. As a result, a structure shown in FIGS. 51A and 51B is obtained. The former sidewall insulators 134 are shown in FIG. 51B, and the latter sidewall insulators 134 are shown in FIGS. 51A and 45A.

Figure 52A:
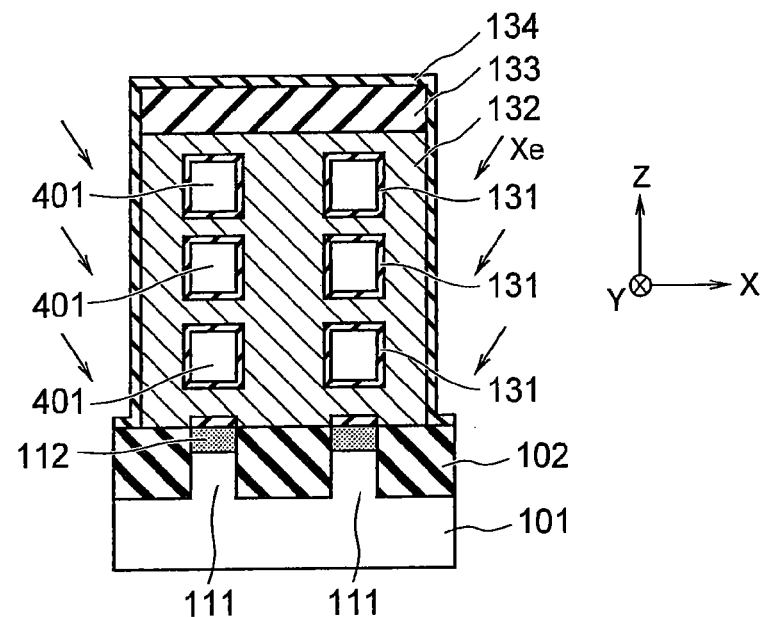
Figure 52B:
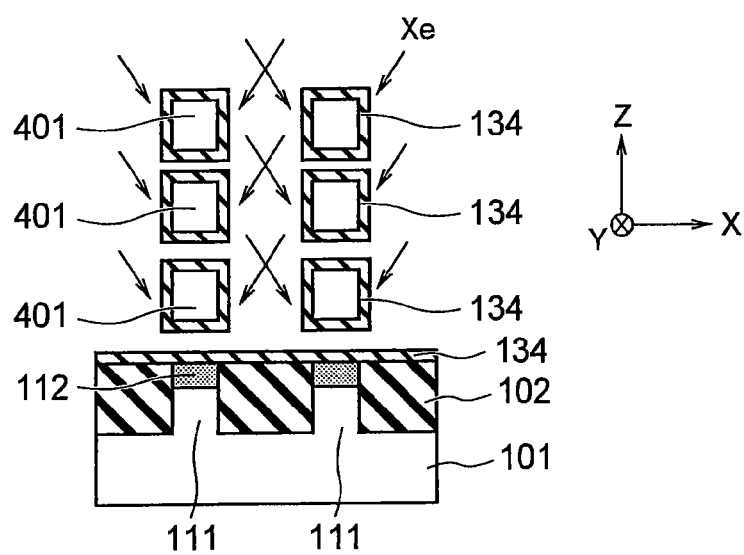
Figure 53A:
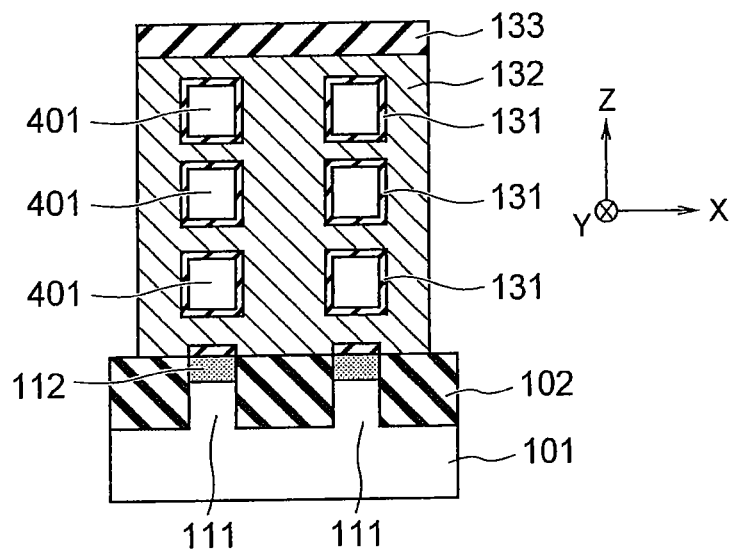
Figure 53B:
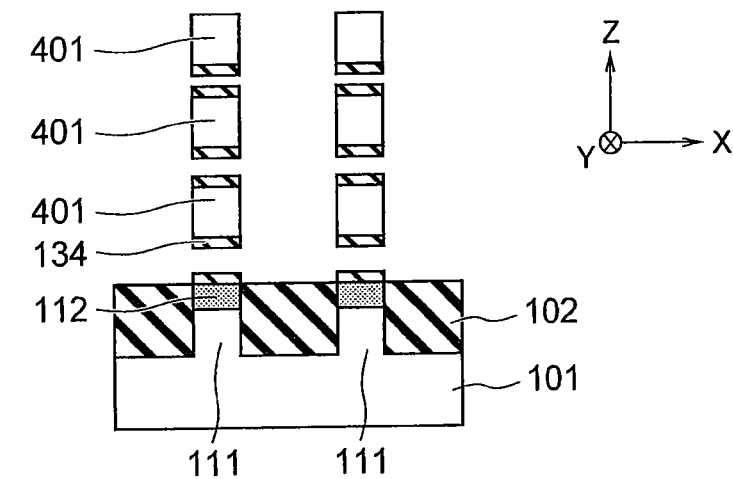

As shown in FIGS. 52A and 52B, ions are then irradiated from oblique directions to the nanowires 401. As a result, the sidewall insulators 134 which are damaged by the ion irradiation can be selectively removed by etching (FIGS. 53A and 53B). Regarding the uppermost nanowire 401 on each fin 111, the sidewall insulators 134 on the upper surface and the X-directional side surfaces of the nanowire 401 are removed (FIGS. 53A and 53B). Regarding the remaining two nanowires 401 on each fin 111, the sidewall insulators 134 on the X-directional side surfaces of the nanowires 401 are removed (FIGS. 53A and 53B). The ion species to be used in the oblique ion irradiation is, for example, Xe (xenon).

Figure 54A:
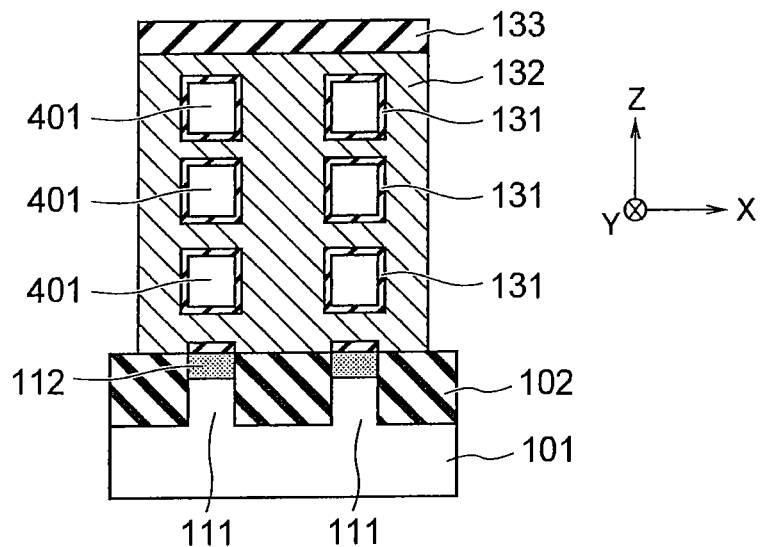
Figure 54B:
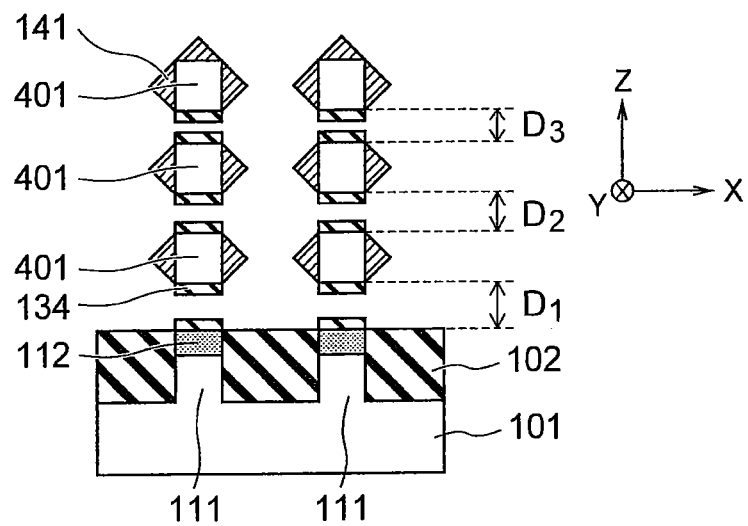

As shown in FIGS. 54A and 54B, the epitaxial layers 141 are then formed on the upper surfaces and the side surfaces of the uppermost nanowires 401, and on the side surfaces of the remaining nanowires 401. According to the above described oblique ion irradiation, the sidewall insulators 134 on the X-directional side surfaces of the gate electrode 132 are also removed. When the gate electrode 132 is a polysilicon layer for example, the epitaxial layers 141 are also formed on the X-directional side surfaces of the gate electrode 132. However, a short between adjacent gate electrodes 132 on the semiconductor substrate 101 can be prevented by sufficiently securing a space between the adjacent gate electrodes 132.

The steps of FIGS. 29A to 30B are then performed to form the S/D diffusion layers 113 and the silicide layers 142, and thereafter form the interlayer dielectric 151 on the entire surface of the semiconductor substrate 101. Thereafter, processes of forming various contact plugs, via plugs, interconnect layers, interlayer dielectrics and the like are carried out in the present embodiment. In this manner, the semiconductor device of FIGS. 45A to 45C is manufactured.

(2) Effect of Fourth Embodiment

Finally, an effect of the fourth embodiment will be described.

As described above, the present embodiment forms the nanowire FET of the gate all around structure in which the gate insulators 131 and the gate electrode 132 surround the nanowires 401. Therefore, according to the present embodiment, the nanowire FET which has better short channel effect immunity than the third embodiment and the modification thereof can be provided.

Furthermore, the interlayer dielectric 151 in the present embodiment is embedded in the gaps between the stacked nanowires 401 as shown in FIG. 45C, so that the stress which is applied in the vertical direction to the nanowires 401 from the interlayer dielectric 151 increases as compared with the case where the interlayer dielectric 151 is not formed in the gaps between the nanowires 401. As a result, the film stress from the interlayer dielectric 151 is more effectively applied to the channels, so that the channel mobility can be improved.

(Fifth Embodiment)

Figure 55A:
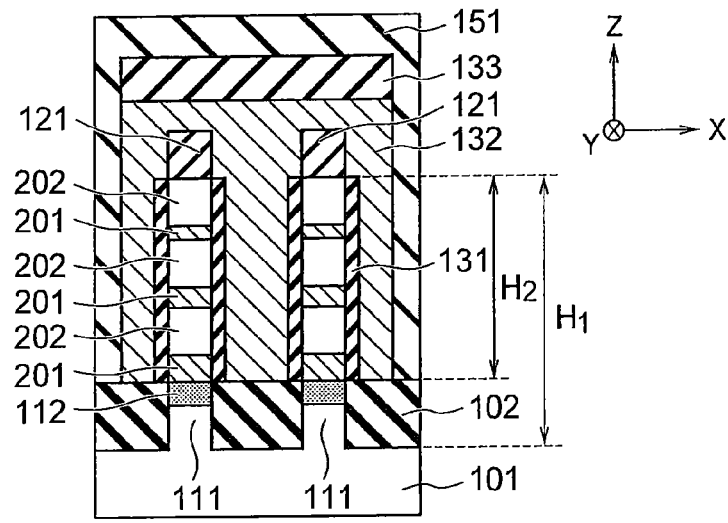
FIGS. 55A to 55C are sectional views showing a structure of a semiconductor device of a fifth embodiment.
Figure 55B:
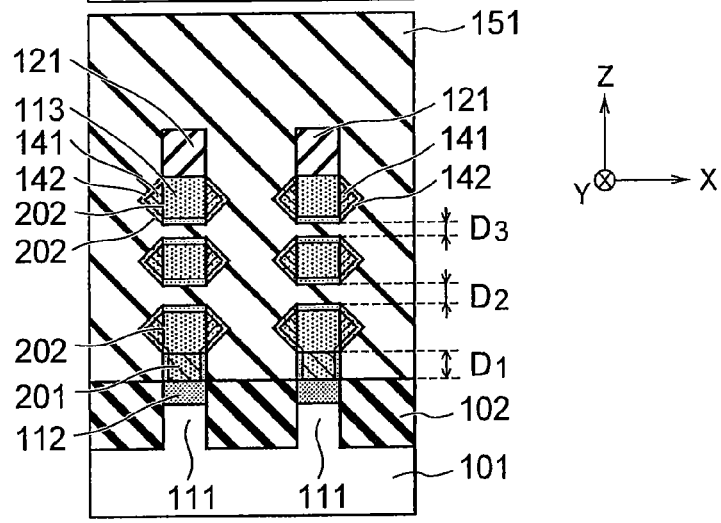
Figure 55C:
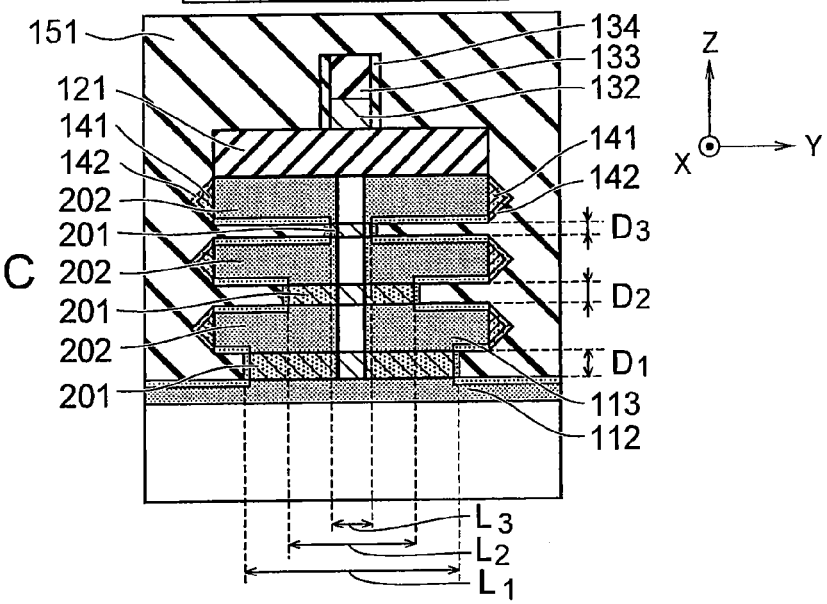

FIGS. 55A to 55C are sectional views showing a structure of a semiconductor device of a fifth embodiment. FIGS. 55A and 55B are sectional views taken along the I-I' line and the J-J' line described above, respectively. FIG. 55C is a sectional view of a fin 111 cut along a section perpendicular to the X direction.

The semiconductor device of the present embodiment has almost the same structure as the semiconductor device of the second embodiment. However, in the present embodiment, the Y-directional side surfaces of the SiGe layers 201 which are perpendicular to the fin extension direction are recessed with respect to the Y-directional side surfaces of the Si layers 202 which are perpendicular to the fin extension direction, in each fin 111 (see FIG. 55C). The interlayer dielectric 151 is embedded in regions where the SiGe layers 201 are recessed in each fin 111.

Reference characters "$L_1$" to "$L_3$" shown in FIG. 55C denote the Y-directional lengths of the SiGe layers 201. In the present embodiment, recessed amounts of the Y-directional side surfaces of the SiGe layers 201 are set to change in accordance with the heights at which the SiGe layers 201 are located. More specifically, the recessed amounts are set to increase as the heights of the SiGe layers 201 increase. As a result, the lengths "$L_1$" to "$L_3$" are set to satisfy $L_1 \geq L_2 \geq L_3$ (however, $L_1=L_2=L_3$ is excluded) in the present embodiment. FIG. 55C shows the SiGe layers 201 formed to satisfy $L_1 > L_2 > L_3$ as an example.

If a silicon oxide layer formed from polysilazne is used as the interlayer dielectric 151 in the case where $D_1=D_2=D_3$ is satisfied, the film shrinkage stress of the interlayer dielectric 151 becomes larger in the areas where the SiGe recessed amounts are larger, so that the effect of applying the compressive stress in the Z direction to the fins 111 is obtained. Therefore, according to the present embodiment, the electron mobility in the (110) side surface channel regions of an n-type fin FET can be further improved by setting the spacings $D_1$ to $D_3$ between the Si layers 202 to satisfy $D_1 \geq D_2 \geq D_3$, and setting the SiGe remaining amounts $L_1$ to $L_3$ to satisfy $L_1 \leq L_2 \leq L_3$. In this case, the recessed amounts of the uppermost SiGe layers 201 may be set as 0 (i.e., $L_3$=fin length).

Likewise, if the silicon oxide layer formed from polysilazane is used as the interlayer dielectric 151 and the fin FET is a pFET, the spacings $D_1$ to $D_3$ between the Si layers 202 is set to satisfy $D_1 \leq D_2 \leq D_3$ and the SiGe remaining amounts $L_1$ to $L_3$ are set to satisfy $L_1 \geq L_2 \geq L_3$, so that the hole mobility of the (110) side surfaces channel regions of the p-type fin FET can be further improved. In this case, the recessed amounts of the lowermost SiGe layers 201 may be set at zero (i.e., $L_1$=fin length).

In the present embodiment, all the spacings between the Si layers 202 may be the same ($D_1=D_2=D_3$). In this case, if $L_1 \leq L_2 \leq L_3$ or $L_1 \geq L_2 \geq L_3$ is satisfied, the stress in the Z direction can be applied to the fins 111.

(1) Method of Manufacturing Semiconductor Device of Fifth Embodiment

A method of manufacturing the semiconductor device of the fifth embodiment will be described with reference to FIGS. 56A to 58C.

FIGS. 56A to 58C are sectional views showing the method of manufacturing the semiconductor device of the fifth embodiment. FIGS. 56A to 58C are the sectional views in which a fin 111 is cut along a section perpendicular to the X direction.

Figure 56A:
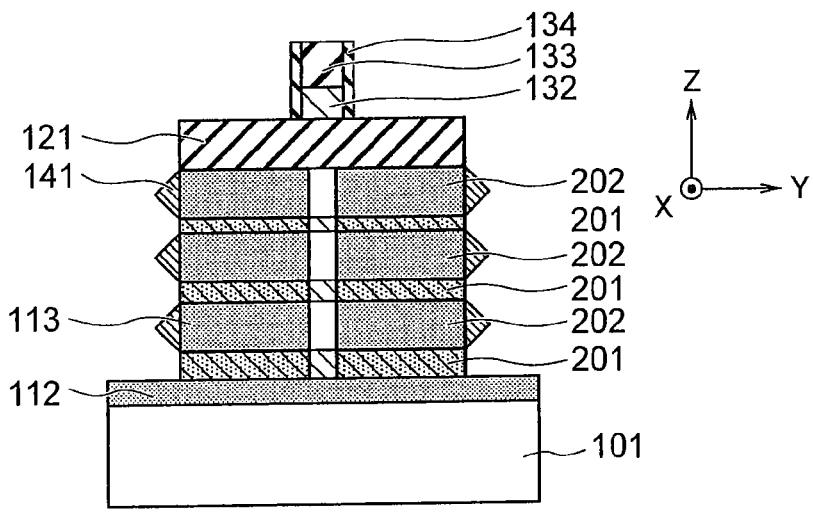
FIGS. 56A to 58C are sectional views showing a method of manufacturing the semiconductor device of the fifth embodiment.
Figure 56B:
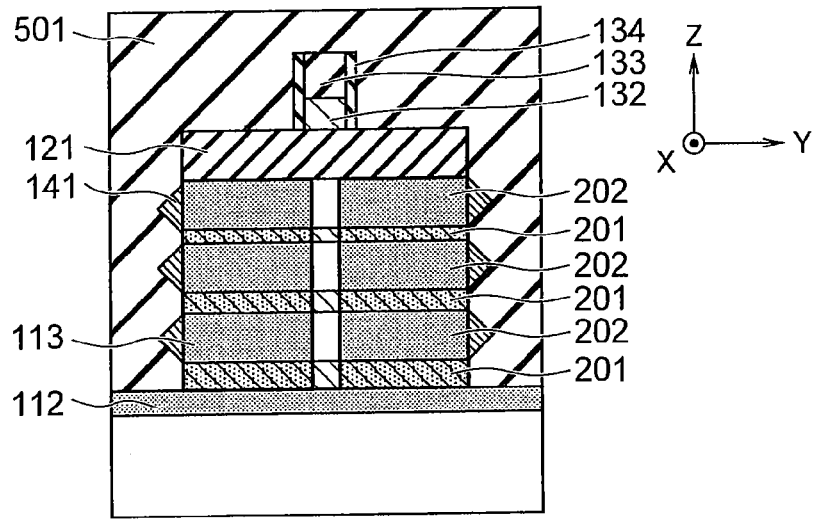

First, the steps of FIGS. 34A to 37B and the step of forming the S/D diffusion layers 113 are performed to form the same structure as the second embodiment on the semiconductor substrate 101 (FIG. 56A). As shown in FIG. 56B, an insulator 501 to be used for recess processing of the side surfaces of the SiGe layers 201 is then deposited on the entire surface of the semiconductor substrate 101. As a result, the fins 111 are covered with the insulator 501. The insulator 501 is, for example, a TEOS layer or a PSZ layer.

Figure 56C:
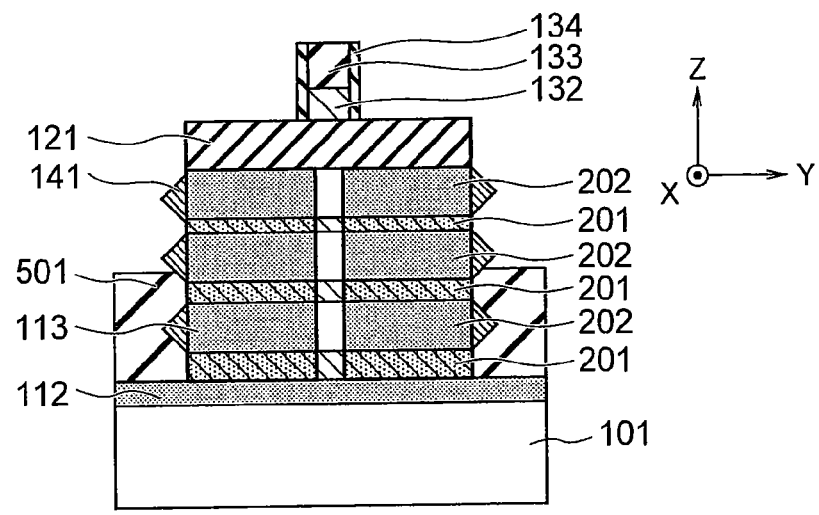
Figure 57A:
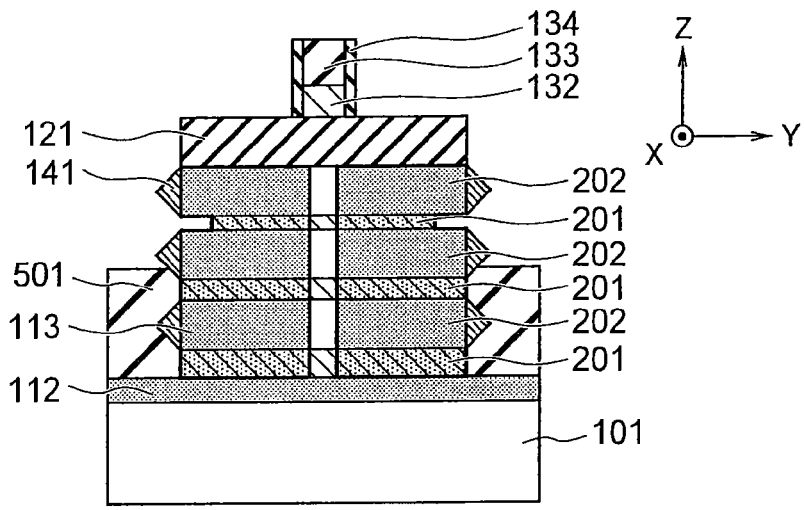

As shown in FIG. 56C, an upper surface of the insulator 501 is then recessed by wet etching or isotropic dry etching so that a height of the upper surface of the insulator 501 becomes low. As a result, the first SiGe layer 201 of each fin 111 is exposed. As shown in FIG. 57A, side surfaces of the first SiGe layer 201 are then recessed by selective etching.

Figure 57B:
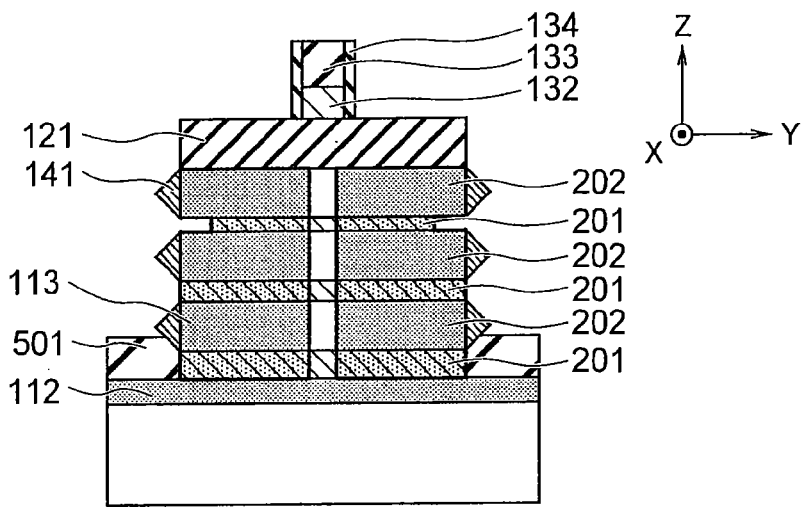
Figure 57C:
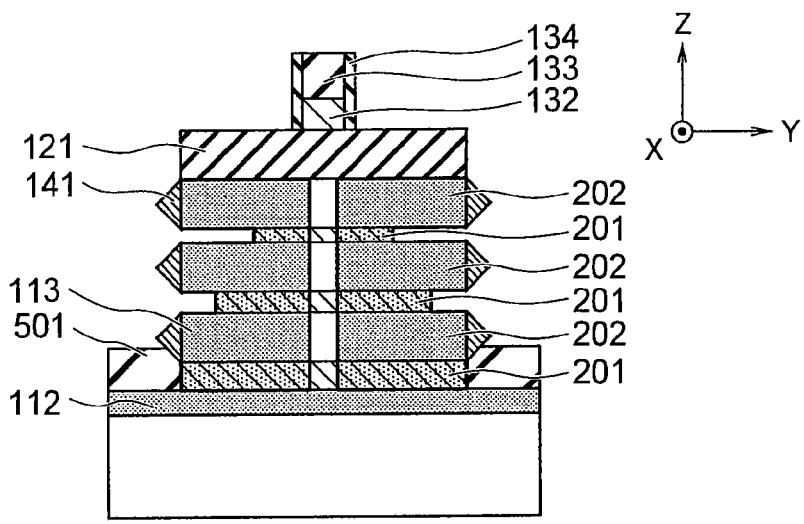

As shown in FIG. 57B, the upper surface of the insulator 501 is then recessed so that the height of the upper surface of the insulator 501 becomes low by wet etching or isotropic dry etching. As a result, the second SiGe layer 201 of each fin 111 is exposed in addition to the first SiGe layer 201. As shown in FIG. 57C, the side surfaces of the first and second SiGe layers 201 are then recessed by selective etching.

Figure 58A:
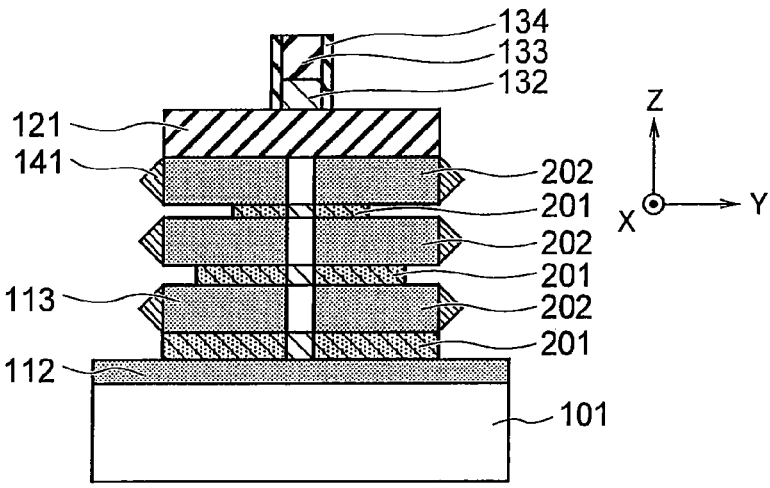
Figure 58B:
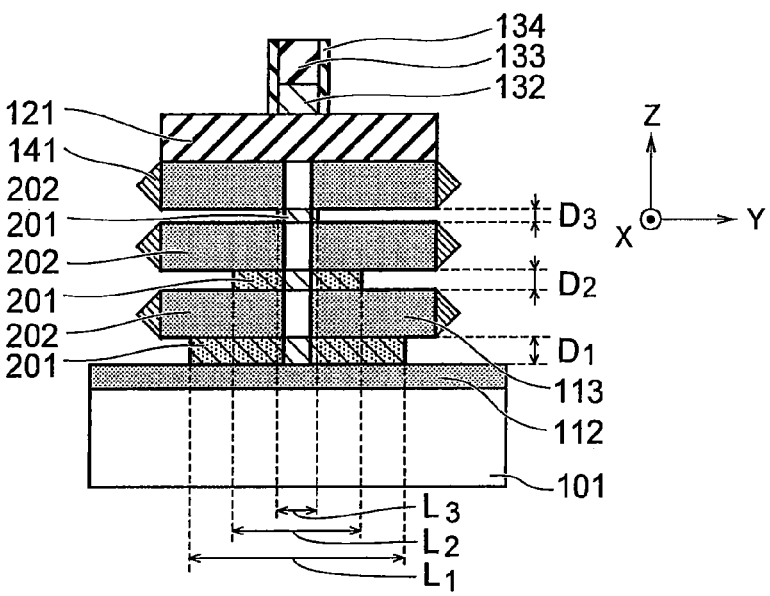

As shown in FIG. 58A, the insulator 501 is then removed by wet etching or isotropic dry etching. As a result, the third SiGe layer 201 of each fin 111 is exposed in addition to the first and the second SiGe layers 201. As shown in FIG. 58B, the side surfaces of the first to third SiGe layers 201 are then recessed by selective etching. As a result, the SiGe layers 201 having the lengths "$L_1$" to "$L_3$" are formed.

In this way, the processing of recessing the upper surface of the insulator 501 and the processing of recessing the side surfaces of one or more SiGe layers 201 are alternately carried out repeatedly in the present embodiment. As a result, a plurality of SiGe layers 201 with the recessed amounts of the side surfaces changing in accordance with the heights at which the SiGe layers 201 are located are formed.

Figure 58C:
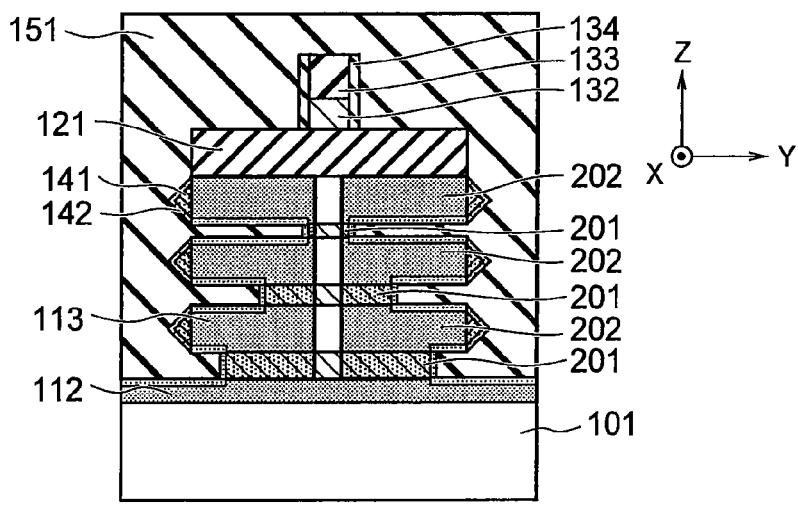

As shown in FIG. 58C, the silicide layers 142 are then formed on the surfaces of the S/D diffusion layers 113, and thereafter the interlayer dielectric 151 is formed on the entire surface of the semiconductor substrate 101. Thereafter, processes of forming various contact plugs, via plugs, interconnect layers, interlayer dielectrics and the like are performed in the present embodiment. In this manner, the semiconductor device of FIGS. 55A to 55C is manufactured.

The SiGe layers 201 in the present embodiment may be processed to satisfy $L1 \leq L2 \leq L3$. Such processing can be realized by, for example, setting the Ge concentrations in the SiGe layers 201 to satisfy "the Ge concentration on the uppermost layer"<"the Ge concentration on the intermediate layer"<"the Ge concentration on the lowermost layer."

The relation $L_1 \leq L_2 \leq L_3$ or $L_1 \geq L_2 \geq L_3$ can also be set by simultaneously performing the recess processing of the three SiGe layers 201 immediately after forming the structure of FIG. 56A. This uses the fact that the etching speed of SiGe in the recess processing of the SiGe layers 201 depends on the Ge concentrations in the SiGe layers 201 and the thicknesses of the SiGe layers 201. More specifically, when the Ge concentration is uniform in all the SiGe layers 201, the etching speed of SiGe becomes lower as the thicknesses of the SiGe layers 201 are thinner, so that a structure of $L_1 \leq L_2 \leq L_3$ is obtained in the case of $D_1 \geq D_2 \geq D_3$. Furthermore, when the Ge concentrations in the SiGe layers 201 satisfy "the Ge concentration on the uppermost layer"<"the Ge concentration on the intermediate layer"<"the Ge concentration on the lowermost layer", a structure of $L_1 \leq L_2 \leq L_3$ is also obtained in the case of $D_1 \geq D_2 \geq D_3$. Structures of $L_1 \geq L_2 \geq L_3$ can be obtained similarly. According to those methods, the step of forming structure having such relation of $L_1$ to $L_3$ can be significantly shortened.

(2) Effect of Fifth Embodiment

Finally, an effect of the fifth embodiment will be described.

As described above, the recessed amounts of the Y-directional side surfaces of the SiGe layers 201 are controlled so as to change in accordance with the heights at which the SiGe layers 201 are located in the present embodiment, so that the carrier mobility of the channel regions in the fin FET can be improved similarly to the case of controlling the spacings "$D_1$" to "$D_3$".

The interlayer dielectric 151 in the present embodiment is embedded in the gaps between the stacked Si layers 202, so that the stress applied in the vertical direction to the Si layers 202 from the interlayer dielectric 151 is increased as compared with the case in which the interlayer dielectric 151 is not embedded in the gaps of the Si layers 202. Therefore, the film stress from the interlayer dielectric 151 is more effectively applied to the channels, so that the channel mobility can be improved.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
a plurality of wire layers stacked to be apart from each other on the semiconductor substrate;
a plurality of gate insulators disposed on upper surfaces, lower surfaces and side surfaces of respective wire layers;
a gate electrode disposed on the upper surfaces, the lower surfaces and the side surfaces of the wire layers via the gate insulators;
a plurality of epitaxial layers disposed on the side surfaces of the respective wire layers; and
an interlayer dielectric disposed on the semiconductor substrate to cover the wire layers, and applying a stress to the wire layers and the epitaxial layers,
wherein a spacing of a gap between the epitaxial layers adjacent in a height direction, and a spacing of a gap between the lower most epitaxial layer and a bottom surface of the interlayer dielectric change in accordance with heights at which the gaps are located.

2. The device of claim 1, wherein the spacing of the gap between the epitaxial layers adjacent in the height direction, and the spacing of the gap between the lowermost epitaxial layer and the bottom surface of the interlayer dielectric increase or decrease as the heights of the gaps increase.

3. The device of claim 1, further comprising an epitaxial layer disposed on the upper surface of the uppermost wire layer.

4. A semiconductor device comprising:
a semiconductor substrate;
a fin disposed on a surface of the semiconductor substrate, and alternately including one or more first layers formed of first material and one or more second layers formed of second material different from the first material;
a gate insulator disposed on a side surface of the fin;
a gate electrode disposed on the side surface and an upper surface of the fin via the gate insulator;
a plurality of epitaxial layers disposed on side surfaces of respective second layers; and
an interlayer dielectric disposed on the semiconductor substrate to cover the fin, and applying a stress to the fin and the epitaxial layers,
wherein
the first and second layers have side surfaces perpendicular to a fin extension direction of the fin, the side surfaces of the first layers being recessed with respect to the side surfaces of the second layers,
the interlayer dielectric is buried in regions where the side surfaces of the first layers are recessed in the fin, and
recessed amounts of the side surfaces of the first layers change in accordance with heights at which the first layers are located.

5. The device of claim 1, wherein the interlayer dielectric is embedded in gaps between the wire layers.

* * * * *